United States Patent [19]

Hyatt

[11] 4,120,583

[45] Oct. 17, 1978

[54] HIGH REGISTRATION PHOTOMASK METHOD AND APPARATUS

[76] Inventor: Gilbert P. Hyatt, P.O. Box 4584, Anaheim, Calif. 92803

[21] Appl. No.: 752,751

[22] Filed: Dec. 20, 1976

Related U.S. Application Data

[63] Continuation-in-part of Ser. No. 101,881, Dec. 28, 1970, and Ser. No. 134,948, Apr. 19, 1971, and Ser. No. 135,040, Apr. 19, 1971, and Ser. No. 230,872, Mar. 1, 1972, and Ser. No. 232,459, Mar. 7, 1972, and Ser. No. 229,213, Apr. 13, 1972, Pat. No. 3,820,894, and Ser. No. 246,867, Apr. 24, 1972, and Ser. No. 288,247, Sep. 11, 1972, and Ser. No. 291,394, Sep. 22, 1972, and Ser. No. 302,771, Nov. 1, 1972, and Ser. No. 325,933, Jan. 22, 1973, Pat. No. 4,016,540, and Ser. No. 476,743, Jun. 5, 1974.

[51] Int. Cl.² ............................................. G03B 27/04
[52] U.S. Cl. ...................................... 355/86; 355/95; 355/132
[58] Field of Search ................... 355/86, 95, 132, 133; 340/173 LM, 221

[56] References Cited

U.S. PATENT DOCUMENTS

| | | | |
|---|---|---|---|
| 3,052,174 | 9/1962 | Berger | 355/95 |
| 3,544,213 | 12/1970 | Jaeger et al. | 355/95 X |
| 3,632,205 | 1/1972 | Marcy | 355/95 |
| 3,639,059 | 2/1972 | Strumor et al. | 355/86 |

*Primary Examiner*—Richard A. Wintercorn
*Attorney, Agent, or Firm*—Gilbert P. Hyatt

[57] ABSTRACT

A machine and a control system are provided for generating high registration photomasks with a contact printing arrangement. Further, a unique control arrangement is provided for controlling a machine such as a high registration contact print machine or other type of machine. In a preferred embodiment, a control system generates signals to a step and repeat contact printing machine that exposes many prints of master die images on a photographic film, where these prints have a high registration characteristic. In a further embodiment a unique control arrangement is provided for machine control operations.

36 Claims, 29 Drawing Figures

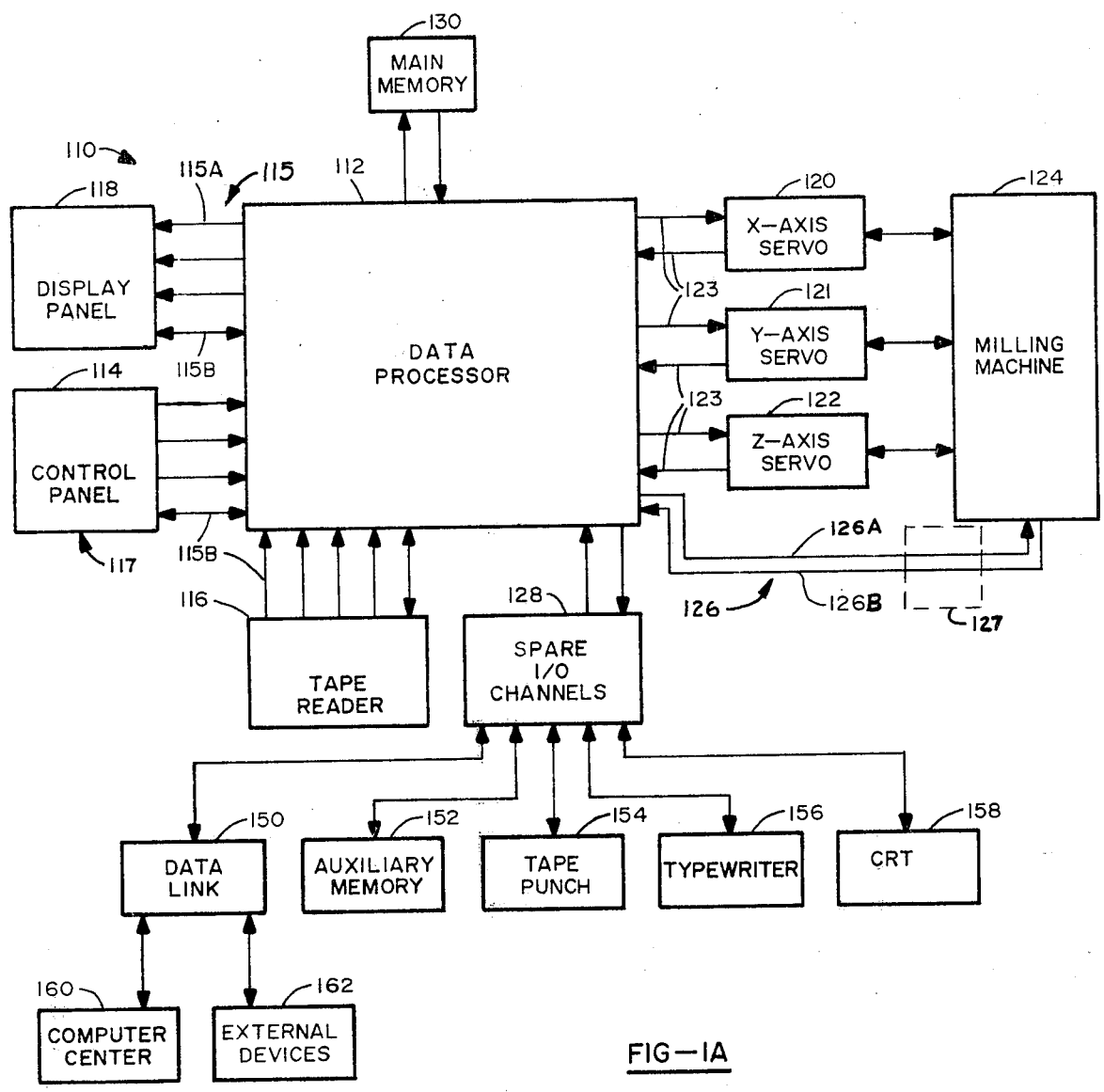
FIG—1A
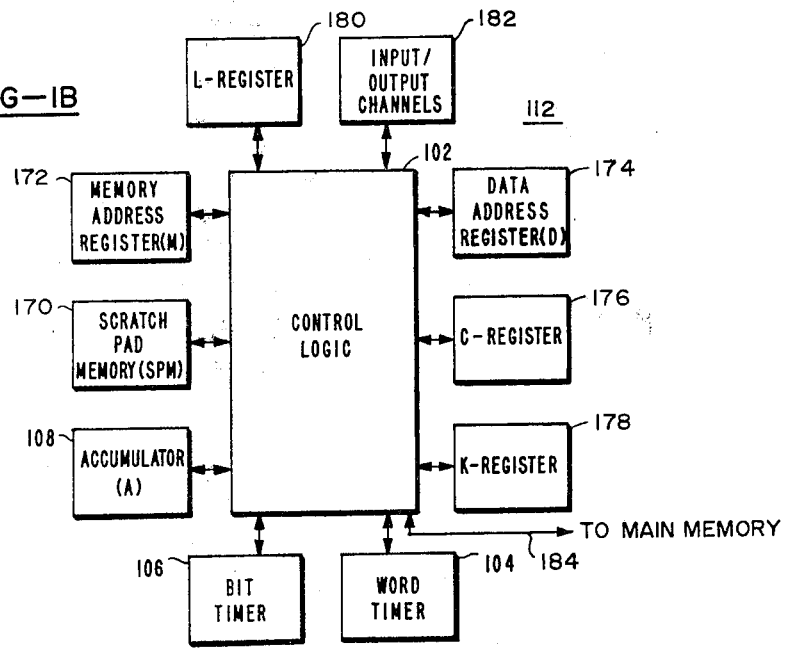
FIG—1B

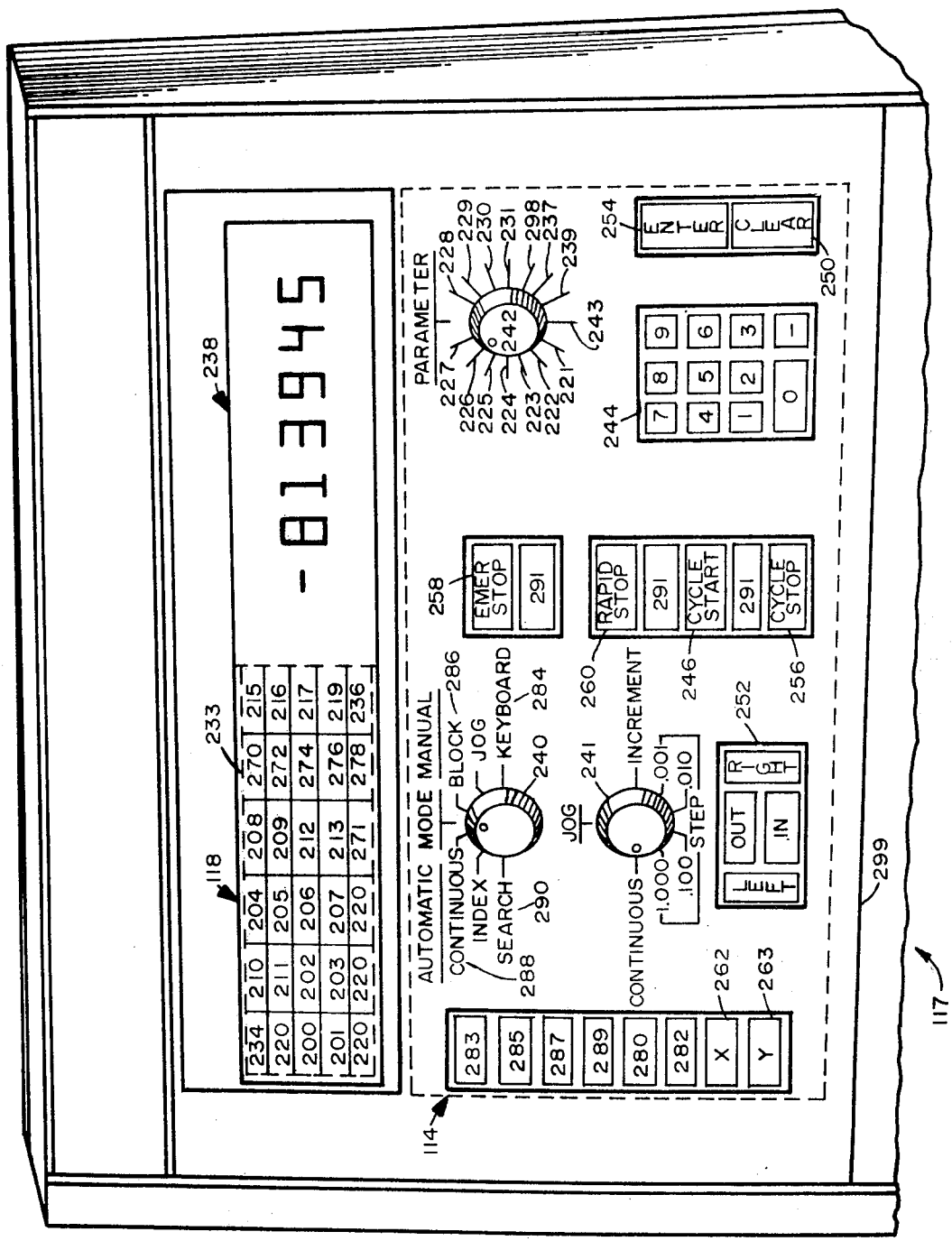
FIG—2A

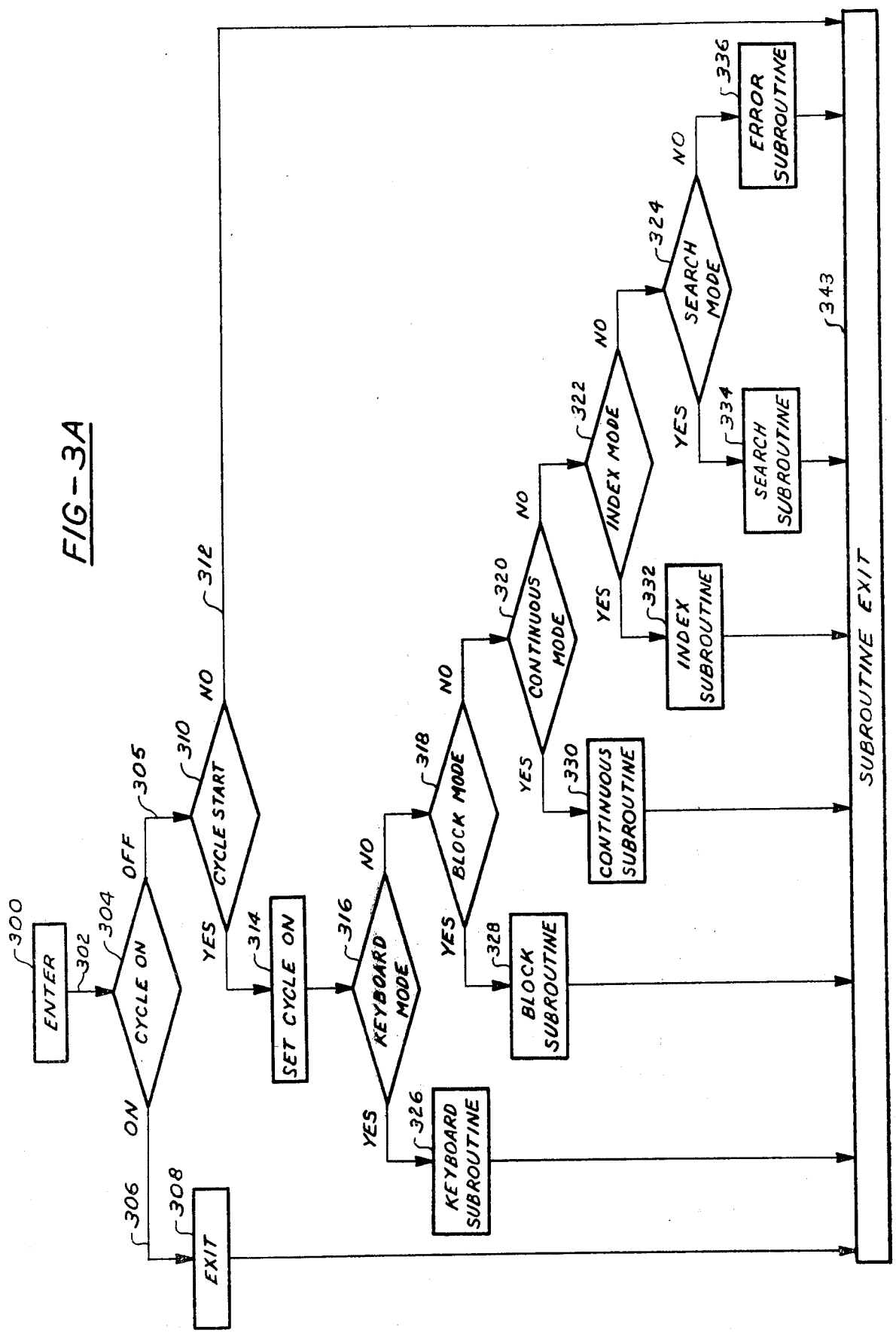

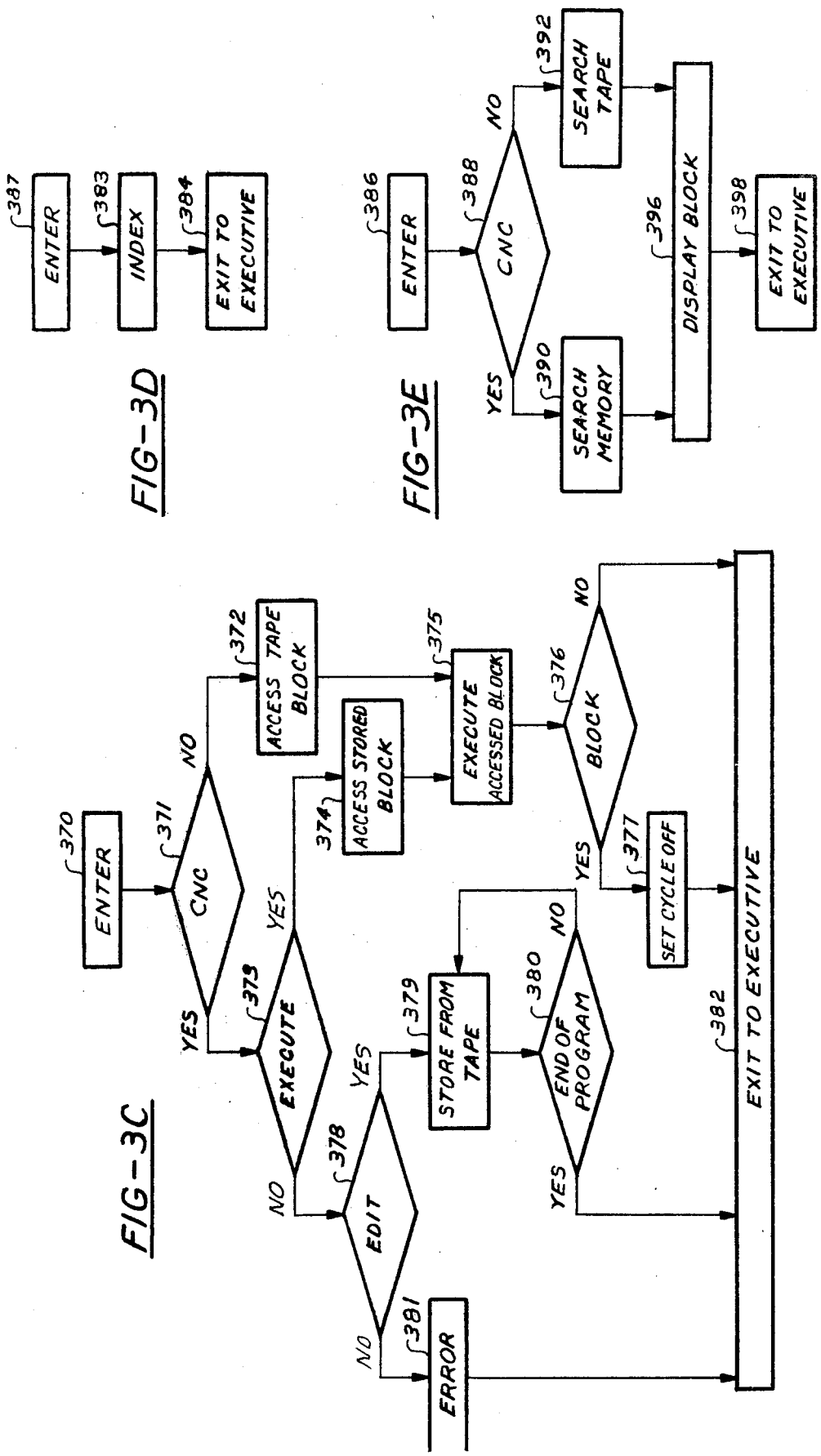

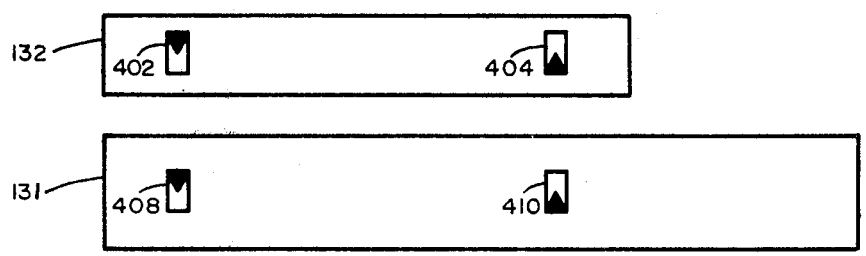
FIG-4A
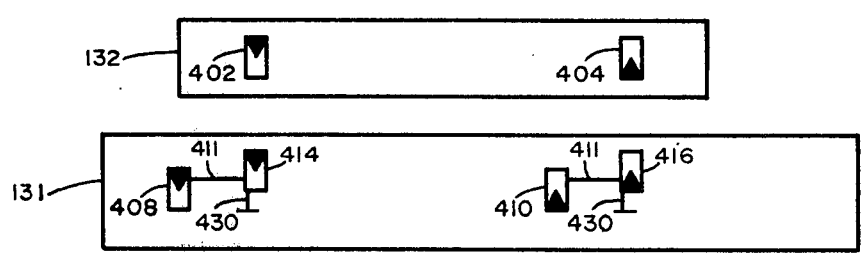
FIG-4B
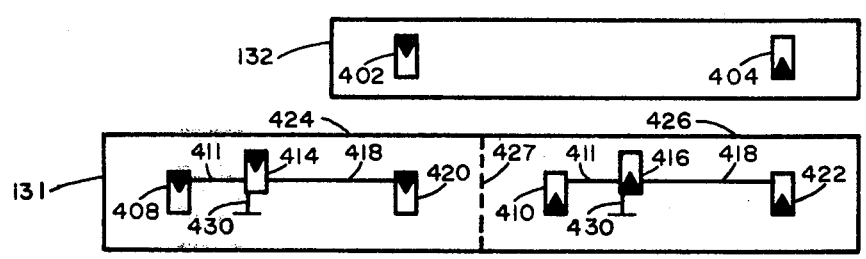
FIG-4C
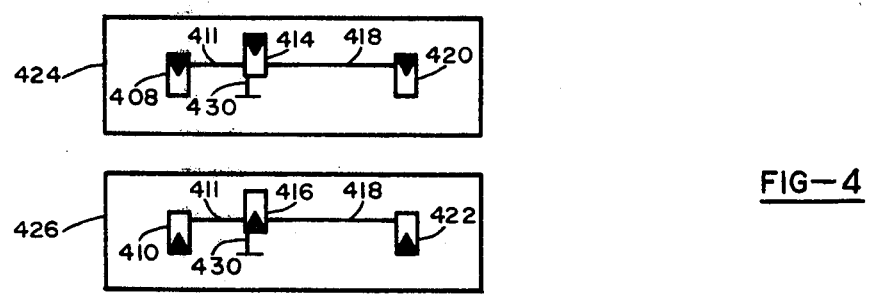
FIG-4D
FIG-4
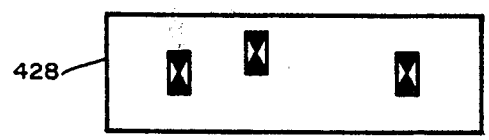
FIG-4E

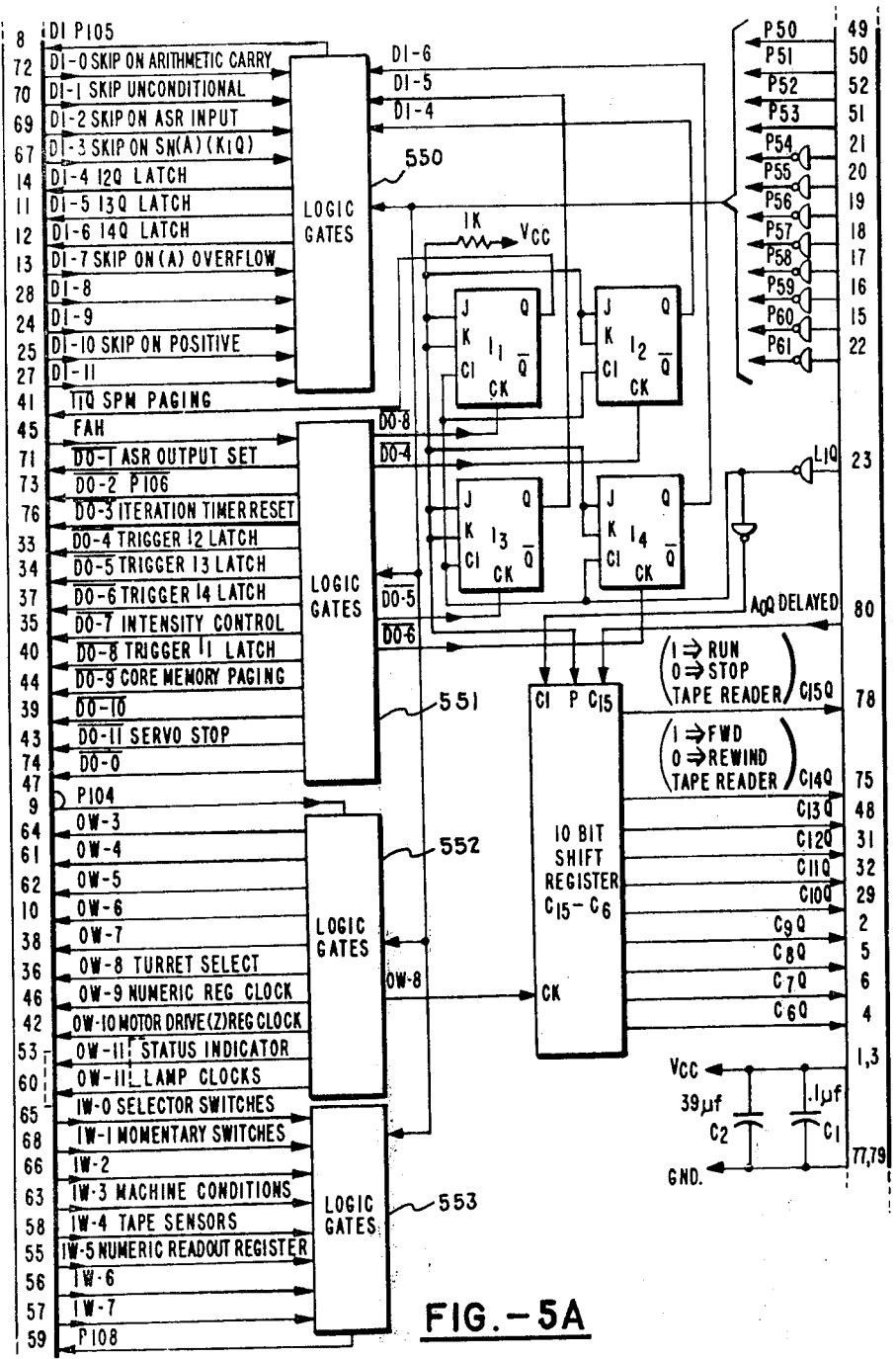
FIG.—5A

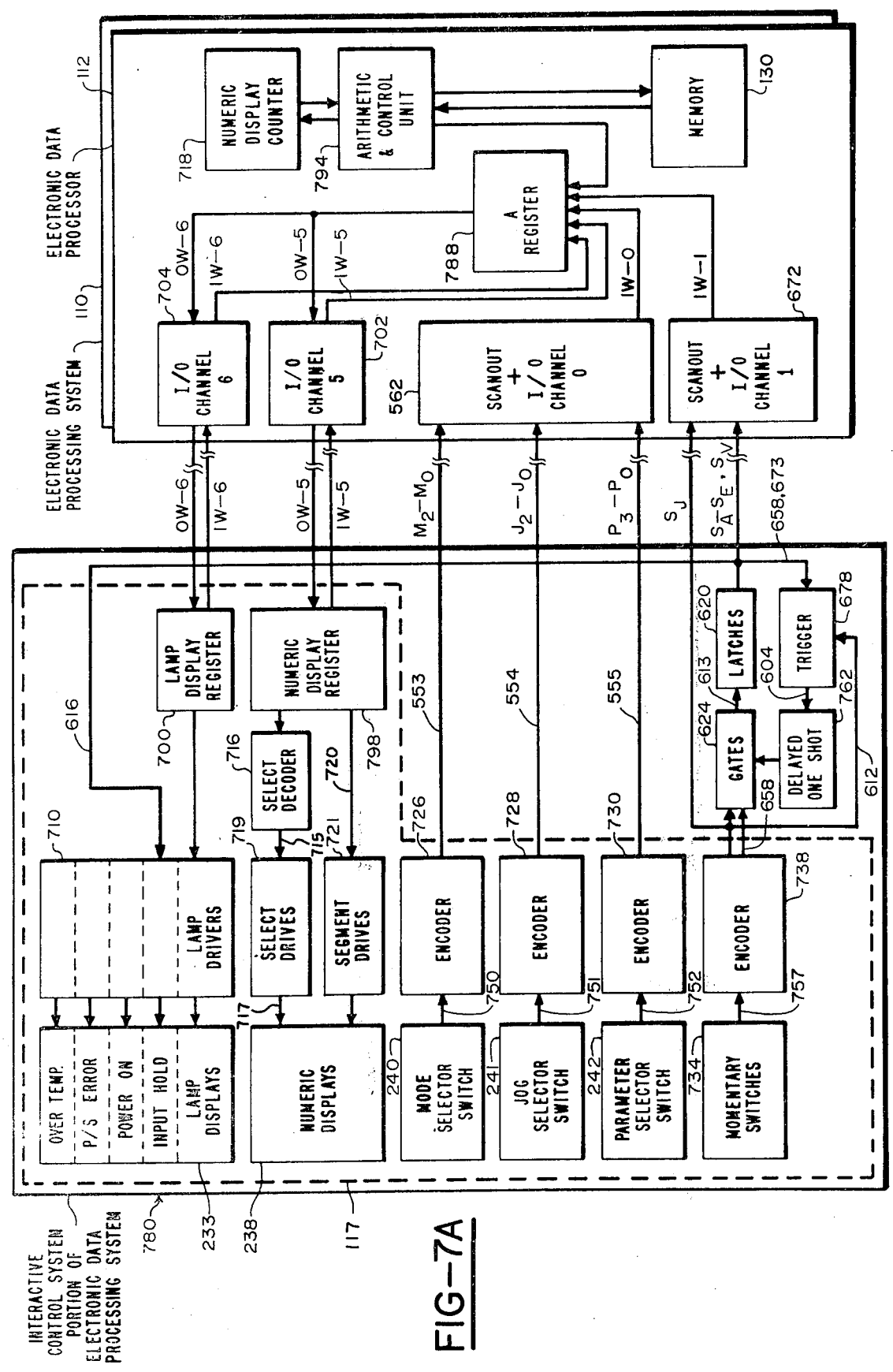

4,120,583

HIGH REGISTRATION PHOTOMASK METHOD AND APPARATUS

CROSS REFERENCE TO RELATED APPLICATIONS

This application is a continuation-in-part of the chain of copending patent applications:

1. Factored data processing system for dedicated applications Ser. No. 101,881 filed on Dec. 28, 1970;
2. Control system and method Ser. No. 134,948 filed on Apr. 19, 1971;
3. Control apparatus Ser. No. 135,040 filed on Apr. 19, 1971;
4. Computerized numerical control system for parts program checkout, editing, and execution Ser. No. 230,872 filed on Mar. 1, 1972;
5. Data processing system having a stored program computer dedicated to the numerical control of a machine Ser. No. 232,459 filed on Mar. 7, 1972;
6. Apparatus and method for producing high registration photo-masks Ser. No. 229,213 filed on Apr. 13, 1972 now U.S. Pat. No. 3,820,894 issued on June 28, 1974;
7. Apparatus and method for real time machine control with a stored program data processor Ser. No. 246,867 filed on Apr. 24, 1972;
8. Computerized system for operator interaction Ser. No. 288,247 filed on Sept. 11, 1972;
9. Stored program data processing system for direct control of a machine in real time with discrete signals Ser. No. 291,394 filed on Sept. 22, 1972;
10. Dedicated computer system for real time path control Ser. No. 302,771 filed on Nov. 1, 1972;
11. Apparatus and method for providing interactive audio communication Ser. No. 325,933 filed on Jan. 22, 1973 now U.S. Pat. No. 4,016,540 issued on Apr. 5, 1977; and
12. Computerized numerical control system Ser. No. 476,743 filed on June 5, 1974;

all by Gilbert P. Hyatt;
wherein the benefit of the filing dates of these related patent applications is herein claimed under 35 USC 120, 35 USC 121, and other authority provided therefore: and
wherein these related patent applications are herein incorporated by reference as if fully set forth at length herein.

The relationship of the above-referenced applications will become apparent to those skilled in the art from the disclosures therein, the disclosures herein, the wealth of prior art knowledge, and the commonality between the disclosures therein and the disclosures herein.

The file of said application Ser. No. 101,881 has been opened to the public for the limited purpose of obtaining a copy of the disclosure as-filed (but not for obtaining copies of other papers therein) to facilitate the incorporation-by-reference of matter therefrom into the instant application with a paper entitled, REQUEST TO OPEN THE FILE TO THE PUBLIC, filed on Nov. 25, 1977 in said application Ser. No. 101,881. The file of said application Ser. No. 101,881 is herein opened to the public for the limited purpose of obtaining a copy of the disclosure as-amended (but not for obtaining copies of prosecution papers other than amendment pages in said prosecution papers).

BACKGROUND OF THE INVENTION

1. Field of the Invention

The field of the invention is a machine control system and in particular a high registration system for generation of photographic masks for photo-chemical processes.

2. Prior Art

It is recognized in the prior art that good registration is required for various photo-chemical processes such as in the manufacture of integrated circuits. The prior art does not distinguish between positional accuracy and registration, where good registration is achieved indirectly in prior art equipment by providing good positional accuracy. When registration in the magnitude of ten millionths inches is required, systems with positional accuracy in the magnitude of ten millionths inches are provided to achieve this range of registration. These systems are typified by the Photorepeater System, Series 1795, manufactured by the David W. Mann Company; the Automated Microflash Camera, Model 610, manufactured by Opto-Mechanisms Inc.; and the Step and Repeat machine, Model 4M-10AXYL, manufactured by the Jade Corporation. These prior art systems provide ultra-high accuracy positioning with a projection exposure technique. They are very expensive, very complex, and are limited in the registration precision that can be provided.

Prior art machine control systems utilize hardwired logic to process data and to control the machine. The prior art has been discussed in detail in the copending applications that are herein incorporated-by-reference.

SUMMARY OF THE INVENTION

Precision photographic masks are required for various photographic processes such as photo-chemical processes which are used in the manufacture of integrated circuits, printed circuits, thin film hybrid circuits, thick film hybrid circuits, chemical milling, and other such applications. In these processes, mask registration is of primary importance; where mask positioning accuracy is only a secondary consideration. This invention provides a simple, inexpensive apparatus and method to produce high registration masks. This invention will be described for a photo-chemical process used in the manufacture of integrated circuits. It should be understood that any reference to an integrated circuit mask making system is intended to include any system wherein high registration capability is to be provided. The particular system discussed herein is one class of such devices.

The integrated circuit manufacturing process is a photo-chemical process, wherein a large array of integrated circuit dice are batch fabricated on a single semiconductor wafer. The integrated circuits are built up with layers of selective diffusions, depositions, and etching process steps. The areas to be affected are selected with a photoresist process, exposed through photographic masks. This process is described in detail in the book Integrated Circuits, Edited by Raymond M. Warner Jr. and James N. Fordemwalt, published by the McGraw-Hill Book Company; incorporated herein by reference.

The multitude of dice on a wafer are eventually separated from one another with a scribing operation. Because each die is independent of all other dice when separated, the positional accuracy of one die on a wafer relative to another die on that wafer is only of secondary importance.

The multitude of process steps required to complete an integrated circuit wafer may exceed twenty steps.

Many of these process steps are photo-chemical steps, requiring the selective exposure of photoresist through an optical mask, then the removal of the masked portion of photoresist to permit selective diffusions or other process operations. It is necessary that these selective operations precisely overlay other preceeding or following operations to provide controlled die characteristics. The measure of this overlay characteristic is known as registration.

In the manufacture of integrated circuits, registration is critical. Each successive mask must register with all other masks. Corresponding areas of each die must register when the masks are aligned, one on top of the other.

In this invention, it has been recognized that good position accuracy is not necessary for good registration, where this invention provides a system with relatively poor positional accuracy but relatively good registration. The sacrifice of unnecessary position accuracy permits a very low cost system to be provided that can generate the highest levels of registration.

This invention eliminates the need for expensive, complex prior art devices used to achieve high accuracy prints in prior art systems such as air bearing supports, interferometer sensors, and complex optics; yet provides a low cost, simple system with high registration. In addition, error mechanisms associated with the prior art projection systems such as focusing and distortions are eliminated with the contact print system of this invention.

Registration between the printed masks generated with the system of this invention is primarily a function of the dimensional stability of the master and the film. The master and film typically have glass substrates which provides good dimensional stability. The photo-process operations are typically performed in a clean room that has a precise environmental control system to insure stability of the master and film. Also, the contact print process for emulsion to emulsion prints provides masks without measurable loss in precision. This assures levels of registration that is not possible with prior art projection type systems.

A system is described which includes a control subsystem and a machine subsystem for generating high registration photographs. In this embodiment, the film is translated in an X direction and a Y direction directly under the master. A Z axis contact print device containing a master is held above the film mounted on the translating table. At appropriate times, this Z axis device is actuated to bring the master into contact with the film. The illumination source is then permitted to selectively expose the film through the master for a contact print. The Z axis device then retracts to provide clearance to translate the film to a new print position.

A parts program memory is provided in a numerical control system for storing a parts program. A parts program stored therein may be edited due to the electrically alterable characteristic of the parts program memory and due to the computational capability of the stored program data processor. A parts programmer is therefore permitted to load a parts program, store the parts program in the memory, execute the stored parts program to isolate errors, edit the stored parts program to correct the errors, then record the corrected parts program on both a tape and a printed listing, and finally provide the numerical control system to production having a stored parts program that is fully check-out for generating parts. This capability enhances the parts program checkout and correction operations, reducing non-productive operations, and reducing the need for a remote large scale computer for parts programming operations.

The data processor dedicated to the numerical control system of this invention executes parts program and operator commands to control a machine in real time to generate a part. The data processor communicates substantially directly with peripheral subsystems such as a tape reader, operator panel, servos, and a machine to reduce hardware interfaces and to improve flexibility under program control. Prior art numerical control systems are special purpose arrangements with "hard-wired" logic and limited capability and flexibility. The stored program data processor arrangement of this invention significantly improves capability and flexibility through such operation under program control.

The data processor arrangement of this invention operates in real time as related to the operational requirements of the electro-mechanical devices in the system such as the machine, where prior art data processor arrangements do not operate in real time but have special purpose equipment such as a "hardwired" numerical control system to convert parts program information to real time machine commands.

A numerical control system using a stored program data processor operating under program control to perform numerical control operations according to the teachings of this invention reduces special purpose hardware yielding reduced costs, where this computerized numerical control system is low in cost yet provides the computational capability and flexibility of a stored program data processor to enhance substantially all phases of numerical control operation.

An object of this invention is to provide a system for producing high registration masks.

A further object of this invention is to provide a practical contact printing system.

A further object of this invention is to provide a high registration mask making system that eliminates the expense and inaccuracies of photographic projection devices.

A further object of this invention is to provide a high registration mask making system that eliminates the expense of a high accuracy positioning system.

Another objective of this invention is to provide a contact print machine capable of providing precise contact prints.

Still another object of this invention is to provide good registration with a low accuracy machine wherein positional errors are common to all masks and thereby reducing the effect on registration.

Yet another object of this invention is to provide an improved control system.

Still another objective of this invention is to provide a method for generating high registration contact prints.

The forgoing and other objects, features, and advantages of this invention will be apparent from the following detailed description of preferred embodiments of this invention, as illustrated in the accompanying drawings.

BRIEF DESCRIPTION OF THE DRAWINGS

A better understanding of the invention may be had from a consideration of the detailed description hereinafter taken in conjunction with the drawings, as briefly described below.

FIG. 1 is a schematic and block diagram representation of the system of the present invention comprising FIGS. 1A, 1B and 1C wherein FIG. 1A is a schematic and block diagram representation of a machine control system, FIG. 1B is a block diagram representation of a data processor.

FIG. 2 is a schematic and block diagram representation of an operator panel comprising FIGS. 2A and 2B wherein FIG. 2A shows a front view of the operator panel and FIG. 2B shows a front view of the operator panel that is partially broken away and panel circuit components.

FIG. 4 is a schematic representation of high registration contact print operations comprising FIGS. 4A-4E showing sequential operations.

Figure 1C:
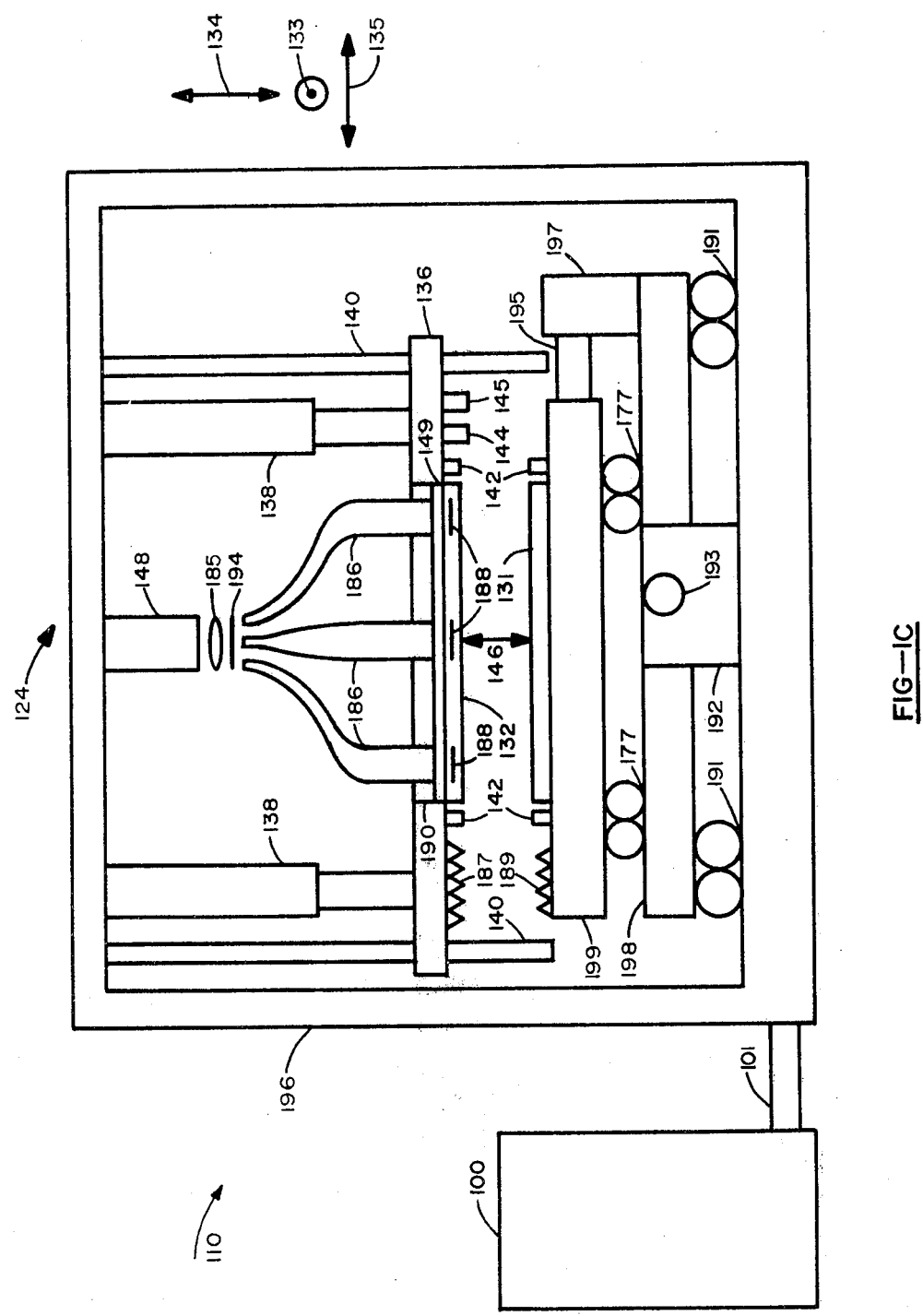
FIG. 1C is a schematic and block diagram representation of a contact print machine.

By way of introduction of the illustrated embodiments, the components shown in FIGS. 1 through 9 of the drawings have been assigned general reference numerals and a brief description of each such component is given in the following description. The components in each figure have in general been assigned three digit reference numerals wherein the hundreds digit of the reference numeral is related to the figure number where for example the components in FIG. 1 have reference numerals between 100 and 199 and the components in FIG. 2 have reference numerals between 200 and 299 except that the same component appearing in successive drawing figures has maintained the first reference numeral.

DETAILED DESCRIPTION OF THE INVENTION

A contact print system can take any one of a number of possible forms. A preferred embodiment of the present invention is shown in FIGS. 1A-1C and will be described in detail hereafter. The principles of the high registration contact print operations will be demonstrated in an example following the description of the preferred embodiment.

Contact Exposure Arrangement

With reference to FIG. 1C, the control subsystem 100 controls the machine 124 in the contact print operations. The preferred embodiment of this control subsystem 100 is described in copending application Factored Data Processing System For Dedicated Applications By Gilbert P. Hyatt and this disclosure is incorporated herein by reference. This control subsystem 100 is connected to the machine subsystem 124 with interconnection cabling 101. The machine comprises a main structural base 196, an X translational device 198, a Y translational device 199, and a Z translational device 136. The X translational device 198 translates in the X direction 133 (perpendicular to the plane of the drawing) on X bearing surfaces 191 driven by the X drive 192 through the X lead screw 193. The Y translational device 199 translates in the Y direction 135 on Y bearing surfaces 177 driven by the Y drive 197 through Y lead screw 195. The Z printing device 136 is mounted on the overhead structure 196 to provide Z axis motion 134 for contact printing of the master 132 on the film 131. The control subsystem 100 generates X drive signals to control the X drive 192 and Y drive signals to control the Y drive 197 to position the X translational device 198 and the Y translational device 199 to the commanded positions. The control subsystem 100 also generates Z actuation signals and lamp exposure signals to perform the contact printing operations. The terms "contact" and "retract" are herein intended to be related to the direction separating the master image and illumination sensitive medium, or to the direction substantially perpendicular to the planes of the master image and illumination sensitive medium, which is the z direction. The term "contact" may be related to reducing the separating distance and the term "retract" may be related to increasing the separating distance. Contact or retract motion and devices are intended to be related to the contact direction. The term "positioning" is herein intended to be related to the direction perpendicular to the contact direction, which may be the X direction, or the Y direction, or both the X and Y directions. Positioning motion and devices are intended to be related to the positioning direction.

The Y translational device 199 provides for mounting of the film 131 and for translation of the film 131 in the Y direction 135. The term film herein refers to the illumination sensitive medium which is exposed to illumination through the master image. In a preferred embodiment, the film is a photosensitized glass plate which is selectively exposed to light through the master. The X translational device 198 is used to translate the Y translation device 199 in the X direction 133 relative to the base 196. An upper base structure 196 mounts the Z printing device 136 which is used for bringing the master 132 into contact with the film 131. The Z printing device 136 is driven with Z actuator 138 and moves in the Z direction 134 on guides 140. Precision alignment surfaces 142 can be used to control the contact pressure between the film 131 and the master 132. A proximity sensor 144 such as a switch detects when the mask is near contact with the film. A contact sensor 145 such as a switch detects when the mask is in contact with the film. Other proximity and contact sensors and arrangements will now become obvious to those skilled in the art. The contact sensor 145 may provide an interlock to inhibit motion in the X direction 133 and the Y direction 135 during the contact print operation. The proximity sensor 144 may be used to control system operation when the film 131 and the master 132 are not in contact but close to contact.

In this preferred embodiment, the main structure 196 carries the weight of the Z translation device 136, the guides 140, the Z actuator 138, the illumination source 148, and various other devices associated with the Z printing device 136. The X translational device 198 and Y translational device 199 are shown carrying the film, where the devices that must be translated are minimized with this embodiment. The major weight is carried by the main structure 196 and not by the X and Y translational devices. The Z motion 134 of the Z printing device 136 has associated Z acceleration reaction forces, which are also supported by the main structure 196.

Many alternate embodiments will now become obvious to those skilled in the art. One alternate embodiment mounts the Z printing device 136 on the Y translational device 199. Still another embodiment mounts the Y bearing surfaces 177 on the structural base 196, where the base 196 directly carries the weight of the Y translational device 199. In that embodiment, the film 131 may be mounted on the X translational device 198 and the master 132 with the associated contact printing devices may be mounted on the Y translational device 199 for relative two dimensional motion therebetween.

Alignment surfaces 142 and sensors 144 and 145 may be adjustable to provide for film and master thickness. This adjustment can also provide for control of the contact pressure between the film 131 and the master 132. Alignment of the film 131 and the master 132 in the X-Y plane during contact can be accomplished by the relative adjustment of the alignment surfaces 142.

Compliance in the Z direction 134 will insure good contact between the film 131 and the master 132. This compliance can be provided in the film mounting Y translational member 199, the master mounting base 149, the alignment surfaces 142, or other devices for providing compliance. Where the film 131 and master 132 contact surfaces are flat to precision requirements such as with ground glass plates, a rigid contact without significant compliance can be provided; but adjustment of the alignment surfaces will be more critical to provide proper contact pressure.

The mounting of the film 131 to the Y translational device 199 and the master 132 to the Z translational device 136 can be performed with spring clips, vacuum devices or other devices that will now be obvious to those skilled in the art.

In a preferred embodiment, the relative angular orientation of the master and film should be repeatable for each contact print. As will be disclosed in detail hereafter, position errors will not adversely affect the registration because all of the printed images that must overlay are printed simultaneously and therefore contain the same positional relationships. Similarly, rotational errors will not adversely affect the registration because all printed images that must overlay are printed simultaneously and therefore contain the same rotational relationships. It should be noted that rotational errors will also produce translational errors, where the displacement of a printed image due to the relative rotation of the master and the film is proportional to the distance from the center of rotation. Because of the distribution of images over the area of the master and the film, and tangential displacements due to rotation may displace images by different amounts which may result in poor registration. Therefore, the relative rotation of the film and master should be kept as small as possible and special apparatus may be provided to achieve good orientation repeatability in the presence of poor positional precision.

A device will now be described to reduce relative rotation of the film and master. The Z printing device 136 translates in the Z direction 134 under control of the Z actuator 138. Precision taper guides 140 are provided to direct the Z printing device 136 as it translates toward the Y translational device 199, where the taper will increase to control the orientation of the Z printing device 136 as it approaches the Y translational device. In addition, the X translational device 198 and the Y translational device 199 may have tightly fitting and precision bearings and slides to minimize rotation about the Z axis 134.

Another device for reducing relative rotation between the film 131 and the master 132 will now be described with reference to FIG. 1C. The Z translational device 136 contains a Z groove device 187 which is oriented closely with a Y groove device 189 contained on the Y translational device 199. When contact is made between the film 131 and the master 132, the Z groove device 187 interlocks with the Y groove device 189 to provide for rotational orientation between the film 131 and the master 132. Other devices for reducing rotation between the film 131 and the master 132 will now become obvious to those skilled in the art.

An illumination source 148 is provided for exposing the film 131 through the master 132. The illumination is conducted from the illumination source 148 to a diffuser 149 which distributes the illumination across the master 132 to provide suitable illumination. Various illumination conductor and diffuser devices can be used such as lucite panels, frosted glass, or other devices which will now become obvious to those skilled in the art.

Precision collimated illumination can be used most efficiently when it is directed only to the master die image areas that need be illuminated, which may comprise only a fraction of one percent of the illumination required to illuminate the total master area. One embodiment is shown in FIG. 1C wherein the illumination source 148 generates illumination which is processed by lens system 185 to provide processed illumination to fiber optic bundles 186. These bundles 186 are each positioned to illuminate a master die image 188 on the master 132. A positioning device 190 is used to position the bundles 186 and can provide an adjustable arrangement for positioning the bundles 186 over the die images 188. A mount such as diffuser 149 can be provided for mounting and illuminating the master 132. An alternate embodiment would provide a separate illumination source 148 and illumination processing device 185 for each master die image 188. An adjustable positioning device 190 is desirable to permit masks of various configurations to be generated. Other embodiments of this selective illumination means will now become obvious to those skilled in the art.

Excitation of the illumination source can be initiated after contact has been made between the film 131 and the master 132. If the illumination source 148 has a long time constant such as with an incandescent lamp, an anticipatory illumination control can be provided to excite the illumination source 148 prior to contact for reducing the time delay to achieve the required illumination after contact. The light source control signal can be generated from the control subsystem 100, the proximity sensor 144, the contact sensor 145, or other means. A combined illumination source control can be implemented where the control subsystem 100 can enable the illumination source excitation and the contact sensor 145 can excite the illumination source 148 when a contact print is performed, but only if enabled. An alternate embodiment would provide a shutter 194 associated with the illumination source 148 to precisely control the exposure time. The shutter 194 could be controlled by a signal such as from the control subsystem 100 or from the contact sensor 145.

The illumination source 148 may be (1) an incandescent lamp such as tungsten, quartz iodite, or tungsten halogen; (2) a solid state lamp such as a light emitting diode or an electro-luminescent panel; (3) a gas lamp such as a Xenon flash tube; (4) or other illumination source.

It is to be noted that registration is a primary consideration, where static accuracy is only a secondary consideration and dynamic accuracy is only a tertiary consideration. Therefore, effects such as inaccuracies in following a path and overshot of the final position may be of little concern. Maximum translational velocity from one position to the next position can be provided without undue emphasis on machine dynamics. Rapid acceleration and deceleration may be provided because the final registration may be relatively independent of machine dynamics such as resonance and overshoot. Even if resonance, overshoot, or other such dynamic effects are not damped out before the contact print operation is performed, these dynamic effects contribute only to position errors, but not to registration errors.

Rapid actuation of the Z actuator 138 increases throughput without significantly degrading positioning accuracy or registration. Repositioning can be initiated prior to full retraction of the Z printing device 136, where X-Y motion can be enabled immediately after the film 131 and master 132 surfaces are apart, as sensed by a proximity sensor 144 or a contact sensor 145. In addition, actuation of the contact print operation with the Z printing device 136 can be enabled immediately prior to obtaining the final position of the X translation device 198 and the Y translation device 199, where the time constant associated with the Z actuator 138 and the time to translate to a contact condition will permit the X translational device 198 and the Y translational device 199 to reach their commanded positions. Anticipatory time delays can be used to maximize the speed of operation by performing compatible operations simultaneously instead of sequentially. For example, the Z axis contact print translation can be initiated shortly before the X-Y final position is reached because of the time to translate the Z translation device from a retracted to a contact position will permit the X-Y final position to be reached. Similarly, the X-Y axis translation can be initiated shortly after the Z translational device has started to retract but before the fully retracted Z position has been achieved. These anticipatory commands can be provided from the control subsystem 100.

An alternate control embodiment for the contact print operation will provide rapid Z motion when the film 131 and master 132 are far apart, but slow Z motion when the film 131 and master 132 are close together. This Z motion control can be provided by a proximity sensor 144, where Z motion is rapid when the proximity sensor 144 is not activated but Z motion is slow when the sensor 144 is activated. For this embodiment, the Z translational device 136 will translate rapidly until the sensor 144 is activated, then translate slowly until contact is made. For retraction, the Z translation device 136 will translate slowly until the sensor 144 is deactivated, then translate rapidly to the retracted position.

The Z distance 146 between the film 131 and the master 132 must provide sufficient clearance for loading new film 131 and new masters 132 during the setup operation. This Z distance 146 should be minimized for contact print operations to minimize the actuation and retraction time for the Z printing device 136. The clearance for loading may be a thousand times greater than the clearance for printing operations. For loading, a Z clearance 146 of several inches may be required. For printing, a small Z clearance 146, possibly less than a thousandth inch may be sufficient. Therefore, use of a first large clearance for loading operations and a second small clearance for printing operations may both be used with the system of this invention. As an alternate embodiment, the Z translation device may be removable for loading to provide access to the film 131 and master 132.

The control subsystem 100 accepts digital data inputs such as through a tape reader, switches, or other known devices. These inputs define the exposure conditions, machine operations, and exposure positions. The control subsystem 100 processes this input data and controls the machine 124 to perform the required operations.

Contact Exposure Operations

The details of the high registration contact printing process will next be described by way of example with reference to FIG. 4, which represents successive operations in the contact printing process of this invention. The master 132 is shown with only two die images 402 and 404 for clarity. In the integrated circuit process, ten die images for ten different process masks is not unusual. It should be noted that a cluster or array of prints of each die image 424 and 426 are separated into individual clusters or arrays, where each cluster of prints of the same master die image forms a mask for one step of the photo-chemical process. Similarly, for clarity only three contact printing operations are shown in FIG. 4A, 4B, and 4C. In the integrated circuit process, four hundred printing operations may be used to generate four hundred integrated circuit dice on the wafer and, in the transistor process, one thousand printing operations may be used to generate one thousand transistor dice; where each printing operation forms one die print on each mask that corresponds to a particular die on an integrated circuit wafer. Similarly, for clarity only a single X dimensional array of die images are discussed. In the integrated circuit process, this X dimensional row is duplicated many times in the Y dimension for a two dimensional row and column array of die prints.

Three successive die printing operations are shown in FIG. 4A, 4B, and 4C. The division of the two printed masks is shown in FIG. 4D and the overlay of the two masks is shown in FIG. 4E. The triangular shapes of the two master die images were selected to make obvious the registration of the two clusters 428 in FIG. 4E.

Now referring to FIG. 4A, the master 132 with the first master die image 402 and the second master die image 404 is used to make a first contact print on the film 131; where the first die image 402 makes the first print of the first die image 408 and the second die image 404 makes the first print of the second die image 410. The relative positions of the first die prints 408 and 410 are identical to the relative positions of the master die images 402 and 404.

In FIG. 4B, the machine 102 has moved the film 131 a first step distance 411 from the first contact print position. Now the master 132 with the first die image 402 and the second die image 404 is used to make a second contact print on the film 131, where the first die image 402 makes the second print of the first die image 414 and the second die image 404 makes the second print of the second die image 416. The relative positions of the second die prints 414 and 416 are identical to the relative positions of the master die images 402 and 404. The relative distances between the first print of the first die image 408 and the second print of the first die image 414 is the distance 411, which may contain positional errors in the X direction and the Y direction but is identical to the relative positions between the first print of the second die image 410 and the second print of the second die image 416, which is also distance 411.

This distance 411 is shown in exaggerated form to demonstrate the concept of good registration in conjunction with poor positional accuracy. The amount of displacement and the direction of displacement is only of secondary concern because the relation between the first and second die prints for each die image is the same, X distance 411 and Y distance 430. These positional relationships between corresponding prints of a die image are the same for each cluster of die prints. Therefore, the registration between these clusters will not be affected by the positional relationships within each cluster.

In FIG. 4C, the machine has moved the film 131 a second step distance 418 from the second contact print position. Now the master 132 with the first die image 402 and the second die image 404 is used to make a third contact print on the film 131, where the first die image 402 makes the third print of the first die image 420 and the second die image 404 makes the third print of the second die image 422. The relative positions of the third prints 420 and 422 are identical to the relative positions of the master die images 402 and 404. The relative distances between the second print of the first die image 414 and the third print of the first die image 420 is distance 418, which may contain position errors in the X direction and the Y direction but is identical to the relative positions between the second print of the second die image 416 and the third print of the second die image 422; which is also distance 418. This distance 418 is shown in exaggerated form to demonstrate the concept of good registration in conjunction with poor positional accuracy.

Only the X displacements of the die images have been considered. Now the Y displacements of the die images will be discussed. In FIG. 4C, the Y position of the first and third die prints of the first die image 408 and 420 are shown with the same Y displacement. The Y position of the second die print of the first die image 414 is shown displaced in the Y direction by the Y distance 430. This Y distance 430 is a positional error shown in exaggerated form to demonstrate the concept of good registration in conjunction with poor positional accuracy. This positional error has been introduced because the film 131 has been displaced in the Y direction relative to the master 132. Therefore, the second print of the second die image 416 was also displaced by the Y distance 430 relative to the Y position of the first and third die prints of the second die image 410 and 422. Because this Y positional error 430 is common to both clusters 424 and 426, the registration between these two clusters will be unaffected by this Y positional error as will be shown in the following description of FIG. 4D and FIG. 4E.

As shown in FIG. 4C, the first cluster of prints of the first die image 424 and the second cluster of prints of the second die image 426 are divided at positional 427 to provide independent clusters shown in FIG. 4D. The distances between the various prints of the first die image in the first cluster 424 are not equal, where the first distance 411 is not equal to the second distance 418. The various prints of the second die image 410, 416, and 422 in the second cluster 426 have the same positional inaccuracies as the various prints of the first die image 408, 414, and 420 in the first cluster 424. Therefore, when the first cluster 424 and the second cluster 426 are placed over one another and one die print of the first cluster 424 (for example die print 408) is placed over the corresponding die print of the second cluster 426 (for that example, it is die print 410); then all first die prints precisely overlay with all second die prints as shown in FIG. 4E, where the combination of overlayed clusters 428 have good registration. The precision of this registration is relatively independent of the positional errors associated with each print operation and is primarily a function of the stability of the die image representations 402 and 404 on the master 132.

If a large number of print steps are performed in a two dimensional X-Y array, then a large array of die prints of each die image will be provided for each cluster; where each cluster will represent a wafer mask for one step in the photo-chemical process for producing a semiconductor wafer. Four hundred die images are typical for a single integrated circuit wafer.

If a large number of master die images are provided in a two dimensional X-Y array on the master (sixteen for example), then a large number of clusters or masks will be generated (sixteen for this example) for the various photo-chemical process steps, where each mask may be used in a different operation in the manufacture of a semiconductor wafer.

It should not be obvious to one skilled in the art that the registration between a large number of masks can be very good although the positioning accuracy of large numbers of die prints on each mask is very poor.

The contact print operations are usually performed in a dark room, but the machine may be provided with a cover to permit operations in a lighted room with a covered machine. After the film is exposed, it must be processed as with well known photographic development processes. After processing, the film will be divided into individual masks such as masks 424 and 426 which will usually be mounted in mask frames for alignment, handling, and mounting.

The operation of the contact print operations will be better understood by considering a description of the master. In the preferred embodiment, the master is made by placing a plurality of die images 402 and 404 on a master 132 where each master die image will generate a mask. The distance between each die image may correspond to the distance between centers of the masks to be generated. For example, the master die images might be three inches apart for a two inch diameter wafer with 1 inch clearance between wafer masks. A two dimensional array of master die images will provide a two dimensional array of masks after the contact printing operations. The X and Y positions of these die images on the master may not be precisely controlled because these dimensions only define the center to center distances for the array of wafer masks, which will be separated after the printing process. The angular orientation of these die images is critical as in prior art systems because the rotational orientation will affect rotational registration between masks. Therefore, each die image should be rotationally oriented precisely corresponding with all other die images. The master may contain the die images as negatives to insure that the large areas between die images are opaque to preclude exposing the film except where a die image is to be printed.

Although this invention has been described with respect to a preferred embodiment for making high registration masks with film, it will be recognized that other high registration operations can be provided without first generating a mask such as by directly exposing photoresist on a water or substrate.

The preferred embodiment of this invention is characterized by relatively large mounting devices for the film 131 and master 132 with relatively small displacements of the X translational device 198 and the Y translational device 199. The film and master dimensions may be twelve inches square to provide sixteen masks in a four by four array with three inch spacing between centers. The X and Y displacements may be only 2 inches based upon the diameter of a typical wafer mask or may be up to 4 inches for large masks.

Contact Exposure Applications

The system of the present invention has been described above for generating high registration masks using a plurality of step and repeat contact print operations. This invention may also be used to provide other capabilities which can be exemplified with a description of mask duplication capabilities described below.

In one embodiment, the system of the present invention may provide the further advantages of (1) replacing prior art mask duplication equipment and (2) providing increased productivity for mask duplication operations. Prior art integrated circuit masks are used to expose photoresist on integrated circuit wafers with a contact exposure operation. Contact between the mask and the wafer causes the mask to wear out. Therefore, circuit masks are limited by this wear consideration to a limited number of contact exposure operations. Because of integrated circuit mask wearout, a plurality of production masks are provided which are expendable because they are expected to wear out. A master mask is maintained for generating these expendable production masks and special mask duplication equipment is used to generate production masks from the master mask. Prior art high registration systems cannot be used to duplicate masks because the high registration projection systems can only handle a small master die image having dimensions of approximately 1/10 inch and cannot properly handle a wafer mask having dimensions of several inches. Further, contact exposure systems are used for mask duplication due to the improved characteristics obtained by a contact exposure compared to a projection exposure. Therefore, the prior art is characterized as having special purpose machines for each of a plurality of mask exposure operations, wherein separate machines are provided for high registration step and repeat exposures and for mask duplication exposures. Further, prior art mask duplicating systems only provide capability to duplicate a single wafer mask at a time.

The system of the present invention provides many advantages and distinctions over prior art systems, wherein the system of the present invention may provide multimachine capabilities including both, high registration step and repeat capability and mask duplication capability in the same system. A further advantage is achieved, wherein the system of the present invention provides for the simultaneous duplication of a plurality of masks thereby enhancing productivity.

The system shown in FIG. 1 has been discussed above for step and repeat operations by providing a plurality of contact exposure operations between a master mask 132 and an illumination sensitive medium 131. Therefore, the system of the present invention will certainly provide a single contact exposure operation. This single contact exposure operation permits a duplicate of master mask 132 to be made with a single exposure of medium 131. Therefore, the system of the present invention may be used (1) as a high registration step and repeat system and (2) as a mask duplication system.

Further advantage may be obtained if the master mask 132 to be duplicated is a multiple mask master. Multiple mask masters may be provided with the system of the present invention as discussed above relative to FIG. 4, where medium 131 has exposed thereon a plurality of masks 424 and 426, shown in FIG. 4C. Individual masks 424 and 426 need not be separated as discussed above for separation at location 427, where the plurality of masks 424 and 426 on a single medium 131 (FIG. 4C) comprises a multimask medium. The multimask medium 131 (FIG. 4C) may be processed with well known techniques such as developing, fixing, and printing to convert an exposed multimask medium 131 into a multimask master 132.

A multimask master may be duplicated by placing it in machine 124 (FIG. 1) as master mask 132. Multimask master 132 may then be contact printed to expose medium 131, thereby providing a duplicate of multimask master 132. This printing operation exposes the plurality of individual masks 188 contained on master 132 simultaneously on medium 131.

The contact exposure of a multimask master provides several advantages over prior art arrangements. These advantages include obtaining improved quality due to the simultaneous printing operation thereby minimizing changes in the exposure such as due to changes in temperature, humidity, and other considerations that may occur inbetween exposure of individual masks. Further, improved productivity may be obtained because the contact exposure time is relatively independent of the quantity of masks exposed because they are exposed simultaneously, wherein the exposure of a multimask master having 16 individual masks may be performed in the same time required to expose a single mask master using prior art arrangements; thereby significantly increasing the number of individual masks duplicated or reducing the average time per mask duplicated with the system because of the simultaneous printing of a plurality of individual masks.

The system of the present invention provides additional improvements in performance by reducing sensitivity to outside influences such as temperature and humidity. Prior art systems exhibit a high sensitivity to changes in operating conditions because corresponding images that must have high registration therebetween are exposed sequentially at different times and therefore exhibit differences based upon changes in operating conditions. For example, the characteristics of film is a function of operating conditions, where a change in temperature may result in a change in film dimensions and other effects. If two masks which must have high registration therebetween are exposed at different times and if the operating conditions such as temperature have changed during the time between exposing each mask, the exposure conditions for each mask are different and the registration between the two masks, which is a function of exposure conditions, will be degraded.

The system of the present invention provides substantially simultaneous exposure for all corresponding images that have high registration therebetween. Therefore, a change in operating conditions may affect the accuracy of the masks but will not significantly affect the registration of the masks. The advantage of this feature is analogous to the advantage exemplified above for providing high registration in the presence of low accuracy.

Additional advantage is obtained with the simultaneous exposure of a plurality of images wherein the speed of the exposure process is increased by exposing a plurality of images simultaneously, thereby providing increased throughput and productivity. In one embodiment, a plurality of masks 424 and 426 printed on medium 131 may be used as a master without being separated at position 427 (FIG. 4C). After photographic processing such as developing, processed film 131 having printed masks 424 and 426 may be used as a master 132 to contact print other masks 424 and 426 for duplication purposes. In one embodiment, masks 132 may have 16 masks that may be printed simultaneously, thereby enhancing throughout and productivity for mask duplication purposes.

Yet another advantage is provided for large photomasks, where a first portion of each photomask can be printed on a first film, a corresponding portion can be printed on a second film, and additional portions can be printed on other films. After photographic processing such as developing, the various portions of photomasks can be spliced together. Although this seems like a complex arrangement, all images on each portion will have high registration therebetween, with the primary consideration being splicing of the different portions together and preserving the high regestration. This should not be a problem using optical interference patterns such as the well known Moire fringe marks for aligning the two portions of the pattern to be mated together. This technique permits photomasks to be generated having reduced limitations on size or constraints caused by size of the machine, where portions of photomasks could be built up by splicing together to provide a desired photomask size and a desired cluster quantity. Therefore, tradeoffs between size of each photomask and the number of registering photomasks is simplified.

The combination of a mask generation capability and a mask duplication capability will now be described in greater detail.

As discussed above, it is well known in the art that masks have a tendency to wear due to printing operations in a production environment. Therefore, a master mask which is printed using prior art step-and-repeat projection systems, is duplicated to make mask copies. The copies are used in production so that the wear will occur on a copy but not on the master mask. In the prior art, different machines are used for high registration step-and-repeat operations to make a mask and for duplicating operations to duplicate a mask. Therefore, the dual capability of the system of this invention not only replaces the expensive prior art step-and-repeat machines but also may be used to replace the prior art mask duplicating machines.

Further, existing mask duplicating machines duplicate a single mask at a time, consistent with typical prior art mask generators that generate individual masks. The system of the present invention generates a plurality of masks virtually simultaneously which, in a preferred embodiment, are all exposed on a single medium being attached between exposure clusters and being aligned therebetween by the substrate of the medium that has been exposed. Therefore, a further advantage of the system of the present invention is that masks may be generated as a single image having many mask clusters or arrays and masks may be duplicated as a single exposure of a plurality of die arrays providing a "batch fabricated" duplicating process for duplicating a plurality of masks simultaneously. Therefore, additional advantage is obtained with the system of the present invention by simultaneously exposing a plurality of masks for mask duplication purposes.

The system of the present invention can further be used for duplicating masks in combination with the capability for generating high registration masks, thereby providing a dual capability with a single machine and providing further distinctions over the prior art. For example, the prior art systems discussed above provide an optical projection capability that permits projecting a die image having dimensions of very small fractions of an inch, but the prior art does not provide the capability to expose larger images such as a complete photomask having dimensions of several inches or a plurality of photomasks having significantly larger dimensions.

The system of the present invention provides the capability to expose a master mask having large dimensions on an illumination sensitive medium having large dimensions. Therefore, once the illumination sensitive medium has been exposed, such as with a large number of high registration contact prints; the exposed medium may be removed, photographically processed to provide a desired master image, then placed in the master containing device 136 for contact printing to provide copies for production use. Therefore, once a set of photomasks has been generated on an illumination sensitive medium, the illumination sensitive medium may then be processed with well known photographic processes and become a master for providing duplicate masks. It should be noted that, after the high registration contact print operation, medium 131 may contain a plurality of high registration masks 424 and 426 each having many images of a related die image 402 and 404 respectively, where these exposed images may be on a single medium 131 such as a large piece of film or on a plurality of smaller illumination sensitive medium such as a plurality of film elements mounted on the illumination sensitive medium containing device. After the exposed film has been processed such as with developing, washing, fixing, printing, and other well known photographic processes; it may then be placed in the master containing device 136 for use as a master. This form of the master contains a cluster or array of die images 424 and 426 corresponding to each die image 402 and 404 respectively used in the high registration exposure operations. If a single contact exposure was made of such a high registration mask array, the exposed medium would provide a print of the high registration mask array including a plurality of clusters 424 and 426. Therefore, it can be seen that the system of the present invention may be used both, for providing high registration step-and-repeat operations to generate high registration masks from die images and then to provide contact printing operations to duplicate the high registration masks that had previously been generated.

Many applications in the photochemical industries require the interspersing of a plurality of die images on a single mask, where a mask may have a first type of die image occupying most positions and with a second type of die image which may be an alignment image such as a Moire pattern occupying a selected set of other positions. In still other applications, it may be desired to intersperse a different arrangement of die images on a wafer such as providing combinations of different logical gates and flip-flops for interconnection on the wafer for LSI devices. An embodiment will now be discussed to provide interspercing of a plurality of different images on each mask and for preserving the high registration characteristic therebetween.

In a first embodiment, a plurality of master masks may be provided wherein each of the master masks contains the images for a plurality of masks that must have registration therebetween. For example, a first mask may have a plurality of die images corresponding to the die images to be placed on a corresponding plurality of production masks. A second master mask may have an alignment image for each of the masks and having relative locations the same as the relative locations between the die images on the first master mask. In this embodiment, the first master would be placed in master containing means 136 and would be used to provide contact exposures as described above for the exposure of a multiple die integrated circuit mask. Certain exposure locations might be omitted as being reserved for alignment images. After exposure of the medium with the first master mask, the first master mask would be removed and the second master mask having registration images would be inserted in master containing means 136. The second master mask would be used to provide one or a plurality of high registration exposures for inserting alignment images at corresponding locations in each mask exposure. As described above for exposure of die images, exposure of alignment images would have similar registration therebetween. Although there may be position errors introduced such as the position of the second master mask in master containing means 136, these position errors would not adversely contribute to registration errors for the reasons discussed above with reference to FIG. 4 for machine position errors.

In a second embodiment, a master image 132 may have two sets of die images, wherein the first set of die images may be arranged to provide a first plurality of exposures and the second plurality of die images may be arranged having spacing therebetween the same as for the first plurality of images. As discussed above for the two sets of master masks, these two sets of master images connected therebetween have the same relative positioning between master images for each set of images. Operation provides for a plurality of exposures on the illumination sensitive medium of the first set of master images to provide the first die image exposures at the desired positions. This first set of exposures may be provided with limited machine motion as described above for a single image mask having translational dimensions approximately the same as the dimensions of the masks to be generated. A second operation would be performed that would cause translation between the first set of master images and the second set of master images to move the first set of master images out of the sensitive area of the exposures and to move the second set of master images into position therewith. It should be recognized that the magnitude of this motion may be the center to center distance between the first set of master images and the second set of master images to effectively move the first set out of the sensitive exposure area and the second set into the sensitive exposure area. The second set of master images in the sensitive area may be used to provide high registration contact exposure operations to insert the second set of images into exposure positions in conjunction with the exposures of the first set of images.

In view of the above, it can now be seen that different die images may be interspersed within each mask yet still providing high registration between corresponding images of each mask.

In prior art systems, each master image must be treated independently because each master image must be independently positioned in a projection system or camera for exposure of film therewith. Problems exist in the prior art with separate master images, where photographic reduction of different images, when performed separately, may have different reduction ratios because of variations that can occur in the process. It should be recognized that the system of the present invention may provide a master mask having a plurality of master images connected therebetween as a single master mask having a plurality of images. Photographic reduction and processing of said single master mask insures that all photographic and process steps affect all master images substantially the same, thereby insuring improved correspondence between each master image. Therefore, another feature of the present invention provides for a master having improved correspondence between a plurality of master images on a master mask.

The system of the present invention has broad applicability such as described above for generating high registration masks. In one embodiment, certain printed circuit board operations such as "feed-through pads" for multi-layer circuit boards must have good registration in order to minimize short circuits due to feed-throughs and to insure that the feed-throughs align and overlay.

In one embodiment, a plurality of pad images similar to the die images 188 discussed above are positioned on a master 132 wherein each pad image corresponds to a particular layer on a multilayer circuit and wherein a plurality of master pad images will simultaneously print corresponding pads for a plurality of printed circuit boards. This arrangement can be seen with reference to FIG. 4 where the first master pad image 402 corresponds to a first printed circuit board and a second master pad image 404 corresponds to a second printed circuit board and are constructed to be part of master 132 for printing a film 131. As discussed above for printing die images, master image 132 and film 131 may be repositioned relative to each other for contact printing operations such as shown in FIGS. 4A-4C and as described above for die images. Cluster 424 and cluster 426 have good registration therebetween, as discussed above, and each cluster 424, 426 provides a mask for printed circuit board manufacturing operations. It can be seen from FIGS. 4D and 4E that the two printed circuit board exposures 424 and 426 have good registration and will precisely overlay so that the corresponding pads 408 and 410, 414 and 416, and 420 and 422 overlay as shown in FIG. 4E and as discussed above for the die image application.

As is well known in the printed circuit art, a printed circuit board is manufactured with a photomask having four printed circuit board images of identical form which are etched simultaneously to permit drilling with a four-spindle drilling machine. This arrangement enhances utilization of the four spindle drilling machine but does not improve registration between printed circuit boards of the same type because printed circuit boards of the same type are not used together in a multi-layer arrangement. Particular advantages may be obtained by providing a printed circuit board mask having a plurality of different printed circuit board artworks in contrast to the prior art arrangement of having the same printed circuit board artworks, where the printed circuit boards that will be used together in a multi-layer arrangement will be drilled simultaneously with the drilling machine and thereby provide greater registration between layers. This technique is consistent with the system of the present invention which exposes different masks such as for different integrated circuit waffer layers or circuit board layers in a multi-layer arrangement simultaneously as part of a single multi-mask exposure such as shown in FIG. 4C having two different printed circuit board artworks 424 and 426 as part of the same medium 131. If medium 131 was preserved without splitting into masks 424 and 426 along line 427, then a single photomask 131 having two different printed circuit board artworks 424 and 426 is generated which may be used for simultaneously manufacturing two printed circuit boards. Similarly, a plurality of artworks not limited to two artworks 424 and 426 may be produced on a single medium 131 and may be used for exposing a plurality of different circuit boards having high registration therebetween such as for subsequent drilling operations with a multi-spindle drilling machine. This feature of the present invention combines the economy of multi-spindle drilling, which is well known in the art, with drilling registration obtained by drilling different circuit boards such as related to different layers in a multi-layer circuit board arrangement, which is not known in the prior art; thereby providing both economy and registration advantages with multi-spindle drilling and further providing an improvement over prior art arrangements and methods.

Still another improvement may be obtained with the system of the present invention by providing both, artwork generation capability and high registration exposure capability. A high precision photoplotter arrangement is discussed in U.S. Pat. No. 3,738,242 Adaptive Illumination Source Intensity Control Device issued on June 12, 1973 by Barry T. Lee, Gunther W. Weimer, and Gilbert P. Hyatt and in the continuations and divisionals therefrom including applications Ser. No. 325,792 filed on Jan. 22, 1973 and Ser. No. 327,918 filed on Jan. 30, 1973 and incorporated herein by reference as if fully set forth at length herein. This photoplotter system generates interconnection artwork such as for printed circuit boards. The system of that invention had been reduced to practice in conjunction with the control system described in the parent applications and the P-25 step and repeat machine manufactured by the Dainippon Screen Manufacturing Company. That system has the capability to provide both contact printing and photoplotting capability. From the teachings of the present invention, combining the high registration contact printing capability with the above mentioned photoplotting and contact printing system provides a high registration contact printing system in conjunction with a photoplotter system, which provides special advantages that will be discussed hereinafter.

As discussed above, pad arrangements for a plurality of multi-layer printed circuit boards can be printed having high registration therebetween. Further, the combined high registration contact printing capability in conjunction with the photoplotter interconnection capability permits the same machine to generate interconnection for the high registration pad arrangement. In such an arrangement, the pad arrangement would have high registration and each circuit board may have a pad arrangement identical to each other circuit board. When the pad arrangements are completed, the photoplotting capability may be used to generate the interconnections between pads on each board, where the interconnections for different boards may be different. The results would be a photomask having a plurality of boards wherein the pads of different circuit boards have high registration therebetween and wherein the pads are interconnected to provide a unique pattern for a particular layer on each board. In a still further improvement, a multi-spindle drilling machine may be used to drill corresponding pad locations simultaneously on each of a plurality of boards to provide high registration hole arrangements; wherein the improvement over the prior art includes a multi-spindle drilling machine simultaneously drilling a pad on each of a plurality of different circuit boards that each have different interconnections but that each have registering pads for providing high registration drilling operations. Still another improvement is provided by preserving the identification of all boards drilled simultaneously and manufacturing the multilayer circuit board arrangement so that it uses a plurality of circuit boards that were drilled simultaneously, thereby preserving the high registration of the drilling arrangement.

Figures are presented in schematic form, wherein the symbols and form used may only be representative of the physical embodiment of electrical or mechanical devices. In addition, these schematics are simplified for ease of presentation of primary features, where features not essential to the description may be eliminated. The simplified symbolic representations in the figures are intended to represent actual devices and are intended to include those other features that would be obvious to those skilled in the art from the teachings of the present invention for the described implementation of an embodiment of this invention.

It should be appreciated that the term "registration" as used in the specification and the claims refers to the measure of the overlay of corresponding portions of a group of arrays. It is well known in the art that reference marks are often provided and aligned for corresponding areas to overlay, where the devices discussed herein are intended to include all necessary reference marks, alignment, and other such well known techniques, means, and methods.

Contact exposures are often referred to as contact prints, wherein the terms "exposure" and "print" may be used interchangeably. Also, the various photographic processes such as developing, washing and fixing the film are well known in the art and may be assumed as part of the photographic process. Therefore, no formal distinction is made between an exposed film and an exposed film that has been developed, washed, fixed, and otherwise processed to provide a useable mask. Terms such as exposure, print, and mask may be used interchangeably and are intended to include all necessary photographic processing well known in the art to provide the required characteristics.

The term "high" registration is herein intended to mean good registration or precision registration.

Terminology used herein such as mask, image, print, exposure, and film are terms well known in the photochemical art. The scope of the present invention is not limited to the photochemical art, but is intended to be broadly interpreted to be applied to high registration systems in general wherein the photochemical terminology is intended to be merely exemplary of the broader scope of the present invention.

Prior art exposure systems such as contact exposure mask duplicating systems incorporate well known means and methods to enhance performance. For example, exposed film may be processed such as with developing, fixing, washing, and printing operations. Further, contact printing may be enhanced by purging the region such as with dry nitrogen or providing a vacuum, or both. Still further, exposure may be enhanced by using narrow angle illumination, coherent illumination, or collimated illumination. It is herein intended that the system of the present invention be useable in combination with well known prior art means and methods in the photographic and mask making art.

Control Unit

The system of this invention will now be described, where the previously referenced applications provide the preferred embodiment of this invention. The system 110 is shown in FIG. 1A. The data processor 112 communicates with the control panel 114 and the display panel 118 over signal lines 115. The primary function of the main memory 130 is to contain the stored program for the data processor 112. In one embodiment, this main memory is a core memory and is also used to store a parts program. The tape reader 116 is primarily used to load a parts program. In one mode of operation, this tape reader 116 is used to access the parts program for execution by the data processor 112 to control the machine 124. In another mode of operation, this tape reader 116 is used to access the parts program for loading a parts program memory, which may be a portion of the main memory 130 or auxiliary parts program memory.

Prior art systems typically use remote computers to process numerical control data and use local, non-computerized systems for real time operations. Problems associated with using a remote computer and the limitations of non-computerized local numerical control systems have greatly limited their effectiveness. The system of this invention provides a local, dedicated computer contained in the system for performing real time machine control operations.

Terminology used in this description now will be defined to more clearly illustrate the intended meaning.

The terms "off-line" and "stand-alone" are terms that refer to the operation of a device in a self contained manner such as a prior art peripheral, without the requirement for interaction with the data processor in real time under program control.

The term "word" is intended to mean a generalized parameter comprising a plurality of digital bits or other conditions and may relate to letters, numbers, conditions, and combinations of the foregoing.

The term "computer" as used herein is intended to mean a stored program digital data processor. This includes the well known prior art general purpose digital computers such as mini-computers, but also includes the monolithic data processor and factored data processor disclosed herein and the extension of these data processor concepts to higher levels of integration; where the computer may be distributed throughout the system and may be physically and operationally associated with an extremity of the system, or the computer may be merged to such a degree that the component computer parts are individually indistinguishable.

A dedicated computer system may be dedicated to one or more tasks which may include a prime task such as numerical control, payroll processing, or calculator processing and one or more sub-tasks such as controlling extremities. Also, the data processor need not maintain it's physical or operational identity. This invention is not limited to a single computer but may include a plurality of computers associated with various portions of the prime task and sub-tasks.

A data processing system can be structured with (1) extremities that may have a physical size and form and (2) monolithic data processors that may have relative inconsequential size and form; where the data processors can be totally distributed to the extremity for performance of the functions of the extremity under program control and may be dedicated to one or more extremities. In this case, a plurality of data processors may be distributed throughout the system, each dedicated to a data processor prime task, which may be a system prime task or sub-task.

The term "real time" should be defined since it is sometimes used or misused in the computer art to have a number of different meanings. As used in this application, a data processing system is said to be operating on a real time basis when time of occurance of the computer operations in the data processing subsystem is dictated by the requirements of the machine subsystem rather than by the data processor operations.

In one embodiment of the present invention, the machine may be an extremity of the system which can be implemented as an elemental extremity in conjunction with the data processor. Direct control of the various machine functions, such as storing the tool positions, compensating for tool characteristics, and controlling a turret motor for tool selection will reduce the machine interface that is often implemented with relay logic and other such "magnetics". This elemental machine 124 may be considered to have physical distribution, operative dispersion, and operate with intrinsic signal forms in accordance with the invention. The operative dispersion of the system permits the elemental processor dependent machine 124 to operate in conjunction with other elements performing prime functions to accomplish a task, which may be the performance of various machine operations.

The system of the present invention provides a simple and inexpensive arrangement and method for implementing computerized capability for control applications. This system will be described as a milling machine numerical control system. It should be understood that any reference to such a numerical control system is intended to include any system wherein digital command and control capability is to be provided for a machine. The particular system discussed herein is one class of such devices.

The preferred embodiment of this invention is an advanced numerical control system, containing a general-purpose digital data processor for high levels of capability and versatility. Computerized capability is provided at a price competitive with prior art non-computerized systems, qualifying computerized numerical control (CNC) on only one machine. A major portion of the machine shop budget and production capability does not have to be committed to a limited capability, expensive central DNC multi-machine control computer. This computerized numerical control system at each machine yields economy, because this system is cost competitive with prior art non-computerized systems that do not have CNC capability, and provides protection of production capability, because the shop is not dependent on a single central DNC computer which can malfunction and shut down the whole production capability. The system of this invention can provide one computer per machine "dedicated" to the individual machine on a stand-alone basis, which operates in conjunction with the machine in real time to provide self-contained CNC capability. Major assemblies in this system include a general purpose digital computer, interactive control panel, multi-axis servo drives, machine interface electronics, memory, CRT display, typewriter, punched tape reader, power supplies, and other equipment. Capability includes complex contouring with linear, circular, and parabolic curves; curve fitting; automatic fairing contours; six axes of simultaneous contouring; digital resolution of 50 millionths (0.000050) inch; departure range of 99.999 950 inches; contouring velocities of 1,200 inches per minute; and other features. Also provided are closed-loop DC servos with resolver feedback; inductosyn (Ferrand Scale) feedback; full absolute position feedback with multi-speed pickoffs and other features.

Special features include automatic tool change with up to 99 tool offsets in core memory, spindle speed control, constant cutter chip load, and adaptive feeds and speeds. Tool history is automatically recorded for preventative maintenance. Thread cutting with direct IPR and RPI (pitch) feedrate programming is provided for lathes, and cutter compensation is available for milling and grinding machines.

Numerical control systems typically accept parts programs from a punched tape reader. This system provides access to parts programs from a tape reader, remote large-scale computer, internal memory, or other sources of parts programs. The input data format meets the requirements for "interchangeable perforated tape" as defined in EIA Standard RS-274. Block search and buffer memory features are provided. Data can be entered in either absolute or incremental coordinates, G code selectable, with the capability to mix both coordinate schemes in the same block of commands. Addressing is either variable block or tab sequential. Direct feedrate programming is standard. Full range floating zero and zero offsets are redefinable from the parts program. Other parts programming features include an unlimited number of M and G commands contained in one block, editing symbols such as decimal points, sequence of commands at the parts programmers convenience, and a full circle can be programmed in one block of commands.

This dedicated computer system includes a computer integrated into the system for versatility, economy, and performance. For example, the control panel is an extension of the computer I/O section. This I/O section is physically partitioned so that many of the interface functions, normally performed in a computer I/O, are physically contained on the panel motherboard. This system is under program control, where control, display, data processing, contouring, and machine control functions are handled under program control by the computer. The executive routine permits time-share operation and self-contained diagnostics. Therefore, the system can be conveniently upgraded to incorporate additional features, primarily by reprogramming the computer.

System checkout uses the computer to automatically check its own operation and the operation of the peripheral equipment including use of diagnostic routines, check-sum, and computer iteration timer. System self-check is accomplished under automatic computer control to verify system operation and isolate malfunctions. Self-check and system test programs are included, where these routines are executed upon system turn-on to verify operation or isolate malfunctions and provide continual system checkout and validity checks during system operation.

Prior art systems use remote computers to process parts program information, but have used local, non-computerized numerical control systems for real time machine control operations. Problems associated with using a remote computer and the limitations of a non-computerized numerical control system have greatly limited their effectiveness. The system of this invention provides a local, dedicated computer contained in the numerical control system for performing the real time machine control functions such as contour interpolation, sequencing a spindle on or off, and other such machine control functions. This system also provides parts program processing to eliminate the need for a remote computer for many applications. In addition, parts program editing capability is provided that does not require the extensive capabilities of a large scale computer with a parts program compiler such as the APT compiler.

In prior art numerical control systems, the parts program is resident on a punched tape, which is loaded through a tape reader to define machine motion and control functions for the particular part to be machined. These prior art systems execute tape commands to machine the part. Use of punched tape has several severe limitations including: (1) the tape reader is the most unreliable part of the system, requiring periodic preventative maintenance and sporadic repair, (2) tape reading errors and tape breakage decrease machine utilization; (3) tape reader speed is low, limiting performance or requiring buffer memory to partially compensate for the low speed; and (4) logistics problems and time delays are involved to generate, duplicate, or modify punched tapes.

Limitations associated with the punched tapes are virtually eliminated with a self-contained parts program memory for parts program storage which overcomes tape reader limitations where: (1) the parts program memory is highly reliable and does not require periodic maintenance; (2) tape breakage does not apply to a parts program memory, reading errors are reduced to the trivial, and the parity check is supplemented with a check sum and validity check to ensure correct operation; (3) parts program memory access time is significantly better than tape reader access time, where the parts program memory effectively operates as a large buffer memory; and (4) logistics problems are greatly reduced where parts programs can be loaded directly into the parts program memory from a remote large scale computer over a telephone line or other data link; parts programs can be modified by the operator, where he can conveniently change a block of commands in the parts program memory thru the keyboard or typewriter; and tape duplication is not required, where a tape would be used for the shop archives but not for continuous machine operation.

Parts programs are loaded into the parts program memory through several interface channels from a punched tape reader, remote large scale computer data link, typewriter punched tape reader, typewriter keyboard, control panel keyboard, or other such devices. Parts program modification is implemented through any or all of these channels. Tapes are accepted with various codes, such as EIA or ASCII codes, and accurate tape loading is assured with techniques such as parity checks, validity checks, and other such techniques.

The system of this invention provides a tape preparation capability, where tapes are generated, checked, modified, duplicated and code converted. The tape punch on the typewriter is used for paper tape, while mylar tape requires an auxiliary tape punch. Tape generation is accomplished by loading a parts program into the memory, then formating and punching a tape in either EIA or ASCII code. Tape checking is accomplished by loading the tape and comparing it with the parts program in the parts program memory. Differences are detected and printed on the typewriter as a permanent record. Tape modification is accomplished by loading and modifying a parts program in the parts program memory, then punching a tape as described above. Tape duplication is accomplished by repetitive punching of a tape from a parts program resident in the parts program memory. Code conversion is accomplished by loading a parts program into the parts program memory in a convenient input code, then punching a tape with the tape generation capability, where EIA, ASCII or other codes may be selected.

Parts program editing capability permits complete control of the program checkout process within the shop, precluding the need to depend on outside computer organizations. In addition, start up delays and expenses are significantly reduced. This capability greatly enhances productivity to add to the cost-effectiveness of the numerical control system. Editing of a parts program is performed at the machine during program checkout, resulting in rapid production start up. The internal parts program storage feature provides editing capability for on-line checkout and modification of parts programs. Editing is performed with various devices such as the Manual Data Input (MDI) keyboard or typewriter. Blocks of parts program commands can be added, deleted, modified and verified. An add operation can insert the entered block of commands in-between two other blocks of commands. Similarly, delete and modify operations delete or modify the selected block of commands. A verify operation displays the selected block of commands on the numeric display and prints those commands on the typewriter for "hard-copy" output.

Machine information is provided to the shop manager to aid in the determination of machine use, preventative maintenance records, and operator efficiency. A remote readout of current operation is provided which includes feedrate override, operating mode, block sequence number in process, and part in process. This current operation report defines the instantaneous condition of the equipment. A remote readout of past operation includes total time in each mode and cycle-on/cycle-off conditions. Down time and delays are identified and logged based upon type and duration of the condition. Machine historical records are maintained, including machine operation cycles and accumulated time with automatic notification of preventative maintenance.

Parts program checkout on prior art numerical control systems requires identification of the program errors at the machine, with correction of errors on a remote large-scale computer. Tape correction logistics are time consuming, where poor availability of the large-scale computer in conjunction with its remote location often preclude rapid turnaround. Several iterations of parts program checkout and correction may be required, with up to a week of delays due to punched tape turnaround. Numerical controls systems can be tied up for that excessive nonproductive period. With the editing capability of this invention, the parts program can be corrected as it is checked-out, thereby eliminating the expensive, time-consuming logistics usually associated with parts program correction.

Cutting of parts from sheet metal plates is performed with flame cutting machines, where it is often necessary to nest or fit the patterns together to minimize scrap. Nesting of patterns involves both position offsets and axis rotation to reorient and fit the programmed part on the sheet metal plate. Floating zero point redefinition for automatic position offsets and resolution of the parts program departure commands through a predefined angle for axis rotation provides this capability. Position offset and axis rotation parameters are commanded either from the tape or with the manual data input (MDI) keyboard. Pattern nesting capability results in substantial economy for the user, where the reduction in scrap, ease of programming, and simplified operation greatly enhance the "cost-of-ownership" characteristics of the system.

Parts programming is significantly simplified with this computerized numerical control system, where the computer relieves the parts programmer of much of his tedious calculations. Large scale computers with sophisticated software such as APT are often used to simplify the parts programming effort. This system simplifies parts programming when using APT and enhances the feasibility of manual parts programming when APT is not available. The features provided in the system of this invention that simplify parts programming include direct feedrate programming with various systems of units, combining incremental and absolute coordinate programming, cutter compensation, axis alignment and others.

Simplified parts programming described hereafter, permits parts program changes to be made in a control oriented language such as the EIA Standard format, instead of requiring a compiler oriented language and the associated large scale computer to generate a parts program or a parts program correction. Therefore, a programmer can conveniently generate a parts program or a correction.

In the prior art, calculations required to generate a parts program or to change a parts program were complex; often requiring a large scale computer with a parts program compiler. The capability provided with the CNC system of this invention simplifies parts programming, permitting parts programs to be generated manually without a large scale computer and simplifies changes to parts programs so changes can be made manually without a large scale computer. The simplified parts programming features include cutter compensation, selectable dimensioning, acceleration and deceleration, and other special capabilities. Other features, such as axis alignment, simplify setup and operation of the system.

A computerized numerical control system will be termed a CNC system, which is herein intended to mean the special numerical control capabilities of a stored program data processor and the associated system.

Prior art numerical control systems have been designed around special purpose digital devices where operations such as logic, control, and computations are performed with special purpose logic. Because of the high cost and limited capability of these special purpose numerical control systems, most of the computations are preprocessed with a remote, large scale computer using a parts program compiler such as APT. The remote computer preprocesses the information and generates a punched tape in a control oriented language containing the initial conditions and commands required by the special purpose numerical control equipment. These parts program tapes describe the part to be generated and are used as the command inputs to the numerical control system to cut the part. Tape program errors are common, requiring test runs to isolate and correct these errors. When a test run is completed, the parts programmer provides corrections to the remote computer in a compiler oriented language to generate a corrected tape. Turn-around time for a new tape is often twenty four hours and it is common for five corrected tapes to be required before an acceptable production tape is generated. Therefore, a week of parts program checkout time can be required prior to starting production. An expensive numerical control system can therefore be tied up waiting for a production tape to be checked-out and regenerated. In addition, excessive expense can be incurred for repeated use of the remote large scale APT program computer. Other problems and expenses are incurred associated with the uncertainty of when a production tape will be available and the expensive delays in production start up.

In order to simplify programming of complex parts, various parts programming compilers have been developed. The APT compiler is the most common of these parts programming compilers. It is serviced by the Illinois Institute of Technology Research Institute (IITRI) which provides documentation, services, and software for this parts program compiler.

An attempt has been made to circumvent the tape correction problems by providing a remote large scale computer operating in a time-shared mode to provide rapid correction of parts programs. In such a system, the remote computer is located in the plant containing the machines and provides storage for the parts programs for many numerical control systems in that plant. In operation, this central computer will transmit a new block of commands to each special purpose numerical control system when the prior block of commands has been executed. When the parts programmer detects an error, he will stop the operation of the numerical control system and enter a correction, which will be transmitted to the remote computer. This correction is made in a compiler oriented language which is acceptable by a large scale computer containing a parts program compiler such as APT. The remote computer will compile a new program, convert it to a control oriented language such as the EIA standard format, then make this corrected parts program available to the special purpose numerical control system for continued operation. Such systems using a remote computer in conjunction with special purpose, noncomputerized numerical control systems at every machine are typified by the Sundstrand Omnicontrol and the General Electric Commander systems.

Excessive expenses are incurred with the requirements for these remote computers generating control oriented commands for various non-computerized numerical control systems located at the machine being controlled. In addition, the capabilities of each numerical control system are still limited by the non-computerized numerical control, where the remote larger scale computer can't adequately service all numerical control systems in the shop with any more than parts program modification and superficial preprocessing operations.

The CNC system of the present invention is represented in block diagram form in FIG. 1A as a numerical control system 110, including an electronic data processor 112, arranged in accordance with the invention. A specific example referred to here and described hereafter relates to a multi-axis controlled machine, but it will readily be appreciated that systems in accordance with the invention may be applied to a wide variety of tasks including communication, process control, processing of business data and other control functions such as photo optical pattern generators and multiturret machines.

In accordance with the basic concepts of a factored electronics system, the numerical control system (FIG. 1A) provides an illustration of this factoring process. The data processor is used in conjunction with the various extremities of the system where some of these extremities are elemental extremities. The data processor has a distributed characteristic, where the raw instruction signals comprised of micro operation and operand address signals are communicated in intrinsic signal form to the interface assembly which is physically distributed and set apart from the data processor 112 and the various extremities that communicate with the data processor through this input-output structure.

The data processor 112 is shown by way of this example to be used in conjunction with a main memory 130. The basic architecture of this data processor will permit an integrated circuit memory, such as a read-only memory (ROM), or a random-access memory (RAM) or flip-flop type memory to be substituted for the main memory 130, which might be called a monolithic computer.

The architecture of the computer is oriented towards a factored computer system to permit the data processor to operate in close conjunction with the extremities for this factored computer system. The special organization and instruction repertoire aid in implementing this factored computer system.

The operator panel 117 operates with the data processor in a mutually interdependent fashion to yield interactive capability for operator functions.

The photoelectric tape reader 116 is an extremity that inputs programs to define a part for the machine 124. The real time non-adapted signal form intrinsic to the tape reader 116 includes not only data but tape reader characteristics caused by photo-optical, electro-mechanical, and electrical effects that are inherent to the tape reader. The data processor accepts these intrinsic signal forms directly from the tape reader and derives the required data from the ambiguity and errors present in this intrinsic signal form.

The machine 124 may be an extremity of the system which can be implemented as an elemental extremity in conjunction with the data processor. Direct control of the various machine operations, such as storing the tool positions, compensating for tool characteristics, and controlling a turret motor for tool selection, reduce the machine interface that is often implemented with relay logic and other such "magnetics". The machine axes pickoffs in the square-wave servo loop can be used directly by the data processor to derive position, velocity and acceleration information pertaining to the motion of machine axes.

The axes servos 120, 121, 122 are a typical example of elemental extremities. The communication between the data processor and the axes servos is in a signal form wherein the whole number aspect is intrinsic to the data processor and wherein the square-wave aspect is intrinsic to the axes servos. This intrinsic signal form simplifies the communication interface between the data processor and the axes servos and relieves limitations previously imposed on servos for numerically controlled machines.

The operative dispersion associated with this factored computer system is typified by the multi-axes contouring capability of the system. The data processor performs the contouring computations in whole number form intrinsic to the data processor and generates the resultant whole number commands for the axes servos. The operative dispersion provides extremely high levels of performance with a significant reduction in hardware and a reduction in the computational burden placed on the data processor. The intrinsic signal forms of the servos have a whole number square wave characteristic that is acceptable to the data processor in a non-adapted form to provide interactive communication between the data processor and the axes servos to provide adaptive control capability with this elemental extremity. The axes servos illustrate an elemental extremity that can yield a high level of economy and versatility with a reduced burden on the data processor together with the additional capability of adaptive control.

The present invention more particularly incorporates the normal computer operations of controlling, performing mathematical operations, and storing data into a physically distributed, operatively dispersed system providing concurrent internal control of coaction with associated extremities. Although interfacing is not prohibited, these systems utilize substantially direct communication with elemental subsystems as needed for a chosen class of tasks.

One technical area in which systems in accordance with the invention have particular advantage is in the control of multi-axis machine tools and the control of photo optical plotters to provide output products. Other areas of particular advantage include the processing of communications and business data, for instance, payroll processing and inventory control. In all of these applications the data processor 112 in the system can receive rudimentary data in intrinsic signal form from an elemental extremity such as an axis servo, process the non-adapted intrinsic signals in real time, and provide data to the system. The data processor 112 in the system in turn commands an output device in a signal form which may be readily useable by or intrinsic to the output device, such as a servo system. Use of the physical distribution and operative dispersion of the system in conjunction with processor-dependent elemental extremities operating in non-adapted language modes permitting great versatility to be attained with low manufacturing cost. Furthermore, orientation of the system to a different class of tasks involves no significant redesign but primarily involves changes in the data processor program.

A general purpose data processor in accordance with this invention may include multiple data and program registers, a random access memory and a scratch pad memory, and nonbuffered, directly coupled input-output lines connected to elemental input-output devices. These elements perform basic or prime functions and are physically distributed at different locations in the system, with operative dispersion making them functionally available throughout the system. This system comprises a numerical control machine, e.g. for multiaxis controlled machine, and closely integrates the operator and other input and output operations into the numerical control tasks. Minimal structure input-output extremities in this particular example comprise an elemental tape reader 116 and operator panels 114 and 118, servos 120, 121, 122 for independent servo axis control and a passive data display 118. The data processor, in real time, concurrently monitors these extremities, pre-processes the external manifestations into machine-adaptable or intrinsic data, and generates extremity intrinsic or extremity-adapted extrinsic commands. The system concurrently operates under program control to perform the other aspects of the task, including carrying out complex computations for path control, generating servo commands for each of the controlled axes, sequencing through the program, providing other machine controls and generating graphical and printed output data if needed.

Part program inputs are provided by a photoelectric punched tape reader 116 having Model No. RRSO30-4RA, manufactured by Remex Electronics.

Data and program storage is provided by a main memory 130 which may be a commercially available memory having Part No. 909838-A01, manufactured by Electronic Memories, Inc. This is an 8 bit 4096 word core memory which is primarily devoted to program storage. Remaining portions may be used for data storage if desired. In one embodiment, the main memory 130 may be replaced by a read-only memory (ROM) or flip-flop memory.

In a typical example of the operation of the system of FIG. 1A for control of a machine 124, the data processor 112 accepts part program data from the tape reader 116 and operator inputs from the control panel 114 to commence the computation of servo commands. As the reader 116 and panel 114 are operated, the processor 112 is under program control to monitor the operative states and pre-process the rudimentary data. Concurrently, and also under program control, the display panel 118 is activated by exciting the passive elements to form desired characters at a flicker-free rate. These time related monitoring and pre-processing subtask operations concerned with the extremities continue to be carried out as needed as the processor 112 performs the computational and processing operations concerned with its main task, that of executing the parts program in real time.

Thereafter, command data is translated into servo commands for the individual servos 120, 121, and 122, in intrinsic servo signal form. Feedback signals in the intrinsic servo format are likewise returned to the processor 112, pre-processed by the data processor 112 under program control for conversion into the processor base language and utilized in further computations.

There are profound differences between systems thus arranged and operated and systems of the prior art. In the physical and operational sense, the data processor 112 is a much greater portion of the whole, and the associated units 114, 116, 118, 120, 121, and 122 are extremities of the processor 112. These extremities, which may not be independent in terms of control, are largely directly coupled to the processor 112. Each elemental extremity has certain characteristic relationships to the system, although other differences necessarily exist. Each relies essentially upon the operatively dispersed program capabilities of the processor 112. Each further effectively relies upon the processor 112 for pre-processing of the non-adapted signal forms for interpretation of signals and meaningful time related data transfer. In this respect, digital buffering, conversion, and signal conditioning operations ordinarily provided by interface logic circuits are also avoided. Furthermore, the processor 112 itself need not be tailored in configuration to cooperate with predetermined interface formats and requirements. In a further respect, the data processor presents data or accepts data in real time from/to system extremities in intrinsic signal forms such that the processor itself can effect the significance of such terms.

Elimination of physical identities are representative of what is herein termed physical distribution, where the processor 112 can be distributed throughout the preponderance of the task-performing system. Yet, by virtue of the operational dispersion of the system and other prime functions, this task-performing system may readily be modified with a minimum of hardware changes to perform another task. Such change primarily involves modification of the system program and also modification of the subtask programs and their relation to the task-pertinent program. It should be appreciated that the operative dispersion of the system encompasses and eliminates much of the interface circuitry that is redundant when used in conjunction with a data processor.

For the performance of many tasks, as in the numerical control field, systems in accordance with the invention can utilize a relatively small-scale computer without overloading. Concurrent performance of the subtasks does not in the usual instance result in excessive demands on the processor. To the contrary for numerical control systems, the general purpose computational capability of the system hereafter described may perform many additional operations such as contouring.

The data processor 112 is organized to operate in a manner somewhat similar to presently known stored program digital computers. The fundamental theory and technology of such presently known systems are described in Chapter 11 of *DIGITAL COMPUTER DESIGN FUNDAMENTALS,* Yaohan Chu, McGraw-Hill Book Co., Inc. (New York 1962) incorporated herein by reference.

The data processor 112 includes a 12-bit memory address register (M-Register) which defines a memory location being accessed in the main memory. A memory data register (D-Register) provides communication with the memory and an accumulator (A-Register) receives the results of numerical and logical operations and communicates with several input/output (I/O) channels. Scratch Pad Memory (SPM) Registers provide alterable intermediate operand storage separated from the main memory. A three bit counter divides the execution of program instructions into word times and a four bit counter subdivides the word times into bit times.

The data processor operates by performing programmed instructions received from main memory 130 at other storage. When an instruction is received, control logic causes the data processor to progress through a sequence of micro-operations, the exact path being related to the instruction being executed. Each micro-operation occurs during one of eight word times, 0 thru 7 executing a micro-operation portion of the instruction being executed. Upon completion of a last micro-operation, the data processor returns to a first micro-operation to begin execution of the next instruction accessed from the main memory 130.

Referring now to FIG. 1A, the tape reader 116 may be a commercially available paper tape puncher and reader such as Model RRSO304RA manufactured by Remex Electronics. However, it has been found that by implementing this tape reader 116 as an Elemental Extremity and using the Intrinsic Signal Form concept and Operative Dispersion concept, significant advantages can be achieved. One arrangement is described in detail in application, "A Method and Apparatus for Processing the Digital Output of an Input Means," Ser. No. 879,293, filed Nov. 24, 1969, by Gilbert Hyatt; incorporated herein by reference. Generally, the system operates by having the data processor sample the output of the tape reader 116 at a cyclic rate which is much faster than the operation of the tape reader 116 in a manner similar to the sampling of the control panel outputs. Punching and formatting of the paper tape is in accordance with EIA standards RS-274-B, interchangeable perforated tape variable block format for contouring and contouring/positioning numerically controlled machines incorporated herein by reference.

In the CNC system shown in FIG. 1A, the data processor 112 communicates with the operator panel 117 comprising the control panel 114 and the display panel 118 over signal lines 115. The primary purpose of the main memory 130 is to contain the stored program for the data processor 112. In one embodiment, this main memory may be a core memory and may also be used to store a parts program. The tape reader 116 is used to load a parts program and other data. In one mode of operation, this tape reader 116 is used to access the parts program for execution by the data processor 112 to control the machine 124. In another mode of operation, this tape reader is used to access the parts program for loading a parts program memory, which may be a portion of the main memory 130 or auxiliary parts program memory 152.

Various CNC commands may be entered through the tape reader 116 and the control panel 114 to provide the CNC capability described in conjunction with the flow diagrams in FIGS. 3A-3G. In addition, special CNC panel controls can be provided for entering CNC commands in place of or in addition to the tape reader means of entering these CNC commands. Other embodiments and methods for providing this capability will become obvious to those skilled in the art from the teachings of the present invention.

The data processor 112 may access other subsystems through the spare I/O channels 128 for alternate sources of CNC commands, alternate sources of parts programs, and alternate parts program memories. The machine 124 is controlled with multiple axis servos 120, 121, and 122 operating from data processor real time command signals 123 and is controlled with various auxiliary command signals 126. These command signals are provided by the data processor 112 which accesses a parts program and computes the command signals required to command the machine 124 to execute the parts program.

The data processor 112 accepts parts program commands at a data rate and at operating times dictated by the source of parts program commands and by the numerical control system operations. The machine 124 requires commands at a rate dictated by the machine considerations such as machine dynamics for contouring; discussed in the parent patent application, Control System and Method; and machine response time such as for tool change and spindle speed change requirements. These machine command requirements place a real time operation constraint on the control system 110. Real time machine commands are herein intended to means commands to the machine 124 with time constraints dictated by machine requirements.

Parts program information is typically accessed by a punched tape reader 116 but may be obtained from other sources. One source may be a remote large scale computer system that generates the parts program with an APT compiler, then transmits this program over a data link 150 to the CNC system 110. The data link 150 could be a telephone line or other well known means with appropriate terminal devices such as modems that are well known in the art. This data link 150 would connect to this CNC system 110 through the auxiliary I/O channels 128 for access of the data by the data processor 112. Another source of parts program data is from a typewriter 156 such as a Teletype model ASR-33 or from other well known sources of digital information such as computer peripherals.

The parts program memory in one embodiment is a portion of the data processor main core memory; but may be a drum memory, disc memory, shift register memory or other such memory well known in the computer art. This parts program memory may be an internal part of the CNC system 110 as with the main memory 130 and the data processor scratch pad memory, or may be a peripheral of the CNC system 110 with communication through the spare I/O channels 128. In some cases interface controllers such as a disc memory controller may be required with the peripheral memory. These memories, controllers, and associated devices are well known in the computer art.

A well known auxiliary input and output channel 128 is a 110 baud auxiliary channel for communication with a typewriter such as a Teletype Corporation Model ASR-33, a data link 150, an alpha-numeric CRT 158, a remote large scale computer center 160, or other devices. This 110 baud auxiliary channel provides serial data at a rate of approximately 110 bits per second. Eleven bits are required for each word; comprising a start pulse, eight data pulses and two stop pulses. In this invention, the data processor 112 performs the timing, control, sequencing, and buffering operations associated with the signal processing and command signal generation under program control, thereby eliminating the requirement for prior art interface control devices.

For data inputs, a well-known transistor line receiver circuit provides digital intergrated circuit signal levels. Now referring to FIG. 5, the data processor periodically samples the input line with a Skip-On-Discrete SD instruction thru Discrete Input-2 DI-2 on pin 69 (which is a Skip On ASR input relating to the Teletype Corporation typewriter Model ASR-33) under program control to detect a start pulse. If a start pulse is not detected, the data processor performs other program operations. If a start pulse is detected, the data processor branches to an input program, performing time delay calculations to determine when to sample each successive input sequential bit. This sample time delay precludes errors due to noise such as switch bounce that occurs at the transition between binary states. The data processor assembles the successive serial bits from this input into a digital word, further processes that word for a parity check and a BCD to binary conversion and stores the data for later use. The data processor treats these inputs signals as rudimentary signals which have a quasi-digital characteristic rather than as absolute digital signals because these rudimentary signals have non-digital characteristics.

For data outputs, the data processor generates commands by loading a sequence of digital command bits into an interface command flip-flop at approximately that 110 cycle bit rate. The data processor assembles the eight bit data word with a one bit leading start pulse and two bit trailing tart pulses in the A-Register 108 (FIG. 1B). This word as updated is stored in the data processor for successive output iterations. The data processor fetches this word from storage, then outputs this assembled word to the appropriate auxiliary output channel at a 110 baud rate (approximately 0.009 second intervals), where the appropriate data bit is latched in an interface flip-flop for this period of time inbetween outputs, where this output flip-flop latch excites a well known interface line driver to drive the output device. Two auxiliary output channels will be described for this system, while others will then become obvious to those skilled in the art.

The first output channel will be described with reference to FIG. 5B. The output word is assembled with the start pulse in the most significant position of the A-Register ($A_{15}Q$), with the next sequential data bits in descending order in that register. The Z11 flip-flop is used as the output flip-flop latch to generate the YL-5 output signal on pin 50 to the line driver and output device. The A-Register word is output under control of the EX-7 input/output instruction, where the A-Register contents are shifted into the Z-Register as $P4(A_0Q)$ on pin 48, with the EX-7 instruction gated clock provided as OW-7 on pin 5. The most significant bit of that output word is latched up in the Z11 flip-flop to provide the YL-5 output signal. The assembled word is loaded into the A-Register and is next shifted left to place the next sequential data bit in the most significant position for the next output iteration, then stored in the data processor for further use.

The second output channel will be described with reference to FIG. 5A. The output word is assembled with the start pulse in the least significant position of the A-Register ($A_0Q$), with next sequential data bits in ascending order in that register. An interface flip-flop latch such as latches $I_1-I_4$ (FIG. 5A) is used to generate an output signal to a line driver (not shown) and output device. The A-Register least significant bit signal $A_0Q$ on pin 80 is presented to that interface flip-flop, which is then clocked with the DO-1 pulse on pin 71 (which is the ASR Output Set relating to the Teletype Corporation typewriter model ASR-33) generated with a Discrete Output-1, DC-1, instruction. The least significant bit of the A-Register word $A_0Q$ is therefore latched up in the interface flip-flop to provide the output signal. The assembled word is loaded into the A-Register and is shifted right to place the next sequential data bit in the least significant position prior to the next output iteration, then stored in the data processor for further use.

The auxiliary I/O channels 128 can accommodate various other I/O devices 152–158 and the data link 150 can accommodate various other external devices 162 as will now become obvious to those skilled in the art.

In yet another embodiment of this invention, the numerical control system 110 receives parts program commands from a remote computer facility over a data link 150 such as a telephone line. The data processor 112 is responsive to this parts program information and generates responses over the data link 150 to verify receipt of the information, request more information, or other such communication. For example, the parts program can be transmitted over the data link 150 to the CNC system 110 one block at a time. The CNC system 110 executes each block as received to control the machine 124 as commanded by the parts program. The CNC system 110 also requests a new block when required. This form of operation permits CNC operations without the requirement for the parts program memory or the tape reader as the sources of parts program commands.

CNC operations may use the operator panel controls such as the selector switches and momentary switches. The control panel 114 permits convenient addition of switches as described herein. The lamp and numeric displays inform the operator of the system conditions. Position of the Mode selector switch 240 in conjunction with the CNC condition lamp displays 270, 272, 274, 276, 278 define the response of the data processor 112 to operator commands.

One of the modes of operation provides typewriter inputs such as with a Teletype Model ASR-33, connected to the system with well known interface devices for communication between the operator and the system. Various letter symbols typed by the operator are used as commands to the data processor such as E for edit or input a tape, C for check a tape, R for record or output data and other such symbolic commands. Numbers following a letter command further define the command parameters.

Still another means for providing CNC commands is over a data link 150 such as communicating with a remote computer system. This remote computer system may be a time share system, a remote batch processing system, or other computer system such as the System 360 manufactured by International Business Machines and the Model 1108 manufactured by Univac.

CNC commands can be obtained from many sources to select the modes of operation, the sources of parts program commands, and other commands.

Data Processor Description

As shown in FIG. 1A, the data processor 112 receives data from the various input sources, performs calculations or otherwise manipulates data in accordance with the input information and outputs processed information to control the machine 124 through servos 120, 121 and 122 and auxiliary control signals 126. The data processor is built from series SN7400 integrated circuits manufactured by Texas Instruments, Inc. which are located on a series of printed circuit boards. These printed circuit boards plug into a Mother board which provides necessary interconnections between the terminals of the printed circuit boards.

The architecture of the data processor 112 lends itself to a fully integrated circuit computer mainframe where all of the logic may be implemented with integrated circuits in a conventional manner and additionally includes an integrated circuit scratch pad memory (SPM). Further, this data processor 112 has the architecture to use an integrated circuit read-only memory (ROM) in place of or in addition to a core memory such as for the main memory 130 providing a data processor wherein the digital portion is constructed wholly of integrated circuit components.

A general purpose data processor is provided which is fully implementable with integrated circuits. Thus, an integrated circuit read-only memory (ROM) provides an example of a capability not found in present data processing systems. Other examples are a random access memory (RAM) and other types of flip-flop memories used alone or in combinations of integrated circuit memories for this data processing system.

The data processor 112 is organized to process 8 bit words with most working and storage registers having a 16 bit capacity permitting the storage of two words. Serial transfer of data is used throughout the data processor 112 to minimize the control logic required.

In a simplified block diagram, the data processor 112 is shown in FIG. 1B as control logic 102 interconnecting registers, timers and communication channels.

The basic timing operations of the data processor 112 are performed by a word timer 104 and a bit timer 106. The synchronization of the data processor 112 is provided by an 8 MHz clock signal which is included as part of the control logic 102. A synchronizing clock signal is an asymmetric square wave, the positive portion of which is designated $P_3$ and the negative portion of which is designated $\overline{P}_3$. An asymmetrical character of the clock signal permits a longer clock period without sacrifice of processing speed. The word timer 104 is a three-bit counter with associated decode logic. It counts from 0 to 7 as the data processor cycles through the micro-operations during the performance of an instruction with each micro-operation being performed in a different word time. The associated decode logic provides eight output lines, each being true during one of the eight different counting states of the word timer 104. These output signals are used by the control logic 102 for sequencing the data processor through the micro-operations associated with an instruction. The bit timer is a four-bit binary counter with associated decode logic. The bit timer 106 counts down from 15 thru 0 and consequently the associated decode logic has 16 output lines, each going true during a different one of the 16 possible counts of the bit timer 106. The bit timer 106 provides sequencing and timing within a given micro-operation or word time.

An accumulator (A-Register) 108 is the basic arithmetic register and is used as the repository of the results of arithmetic and logical operations. It is also the source and destination of the Input/Output (I/O) parameters. The A-Register is a 16 bit serial-in, serial-out shift register. Associated with the A-Register 108 is a serial full adder which is included within the control logic 102.

A scratch pad memory (SPM) 170 provides storage for intermediate computational results, return addresses, indexes and other pertinent information. The SPM 170 provides rapid internal storage without the need for transferring data to the main memory. It is a group of 32 16 bit serial in, serial out registers which are divided into two pages with 16 registers on each page. Paging is accomplished by toggling a flip-flop which automatically selects page 0 when the power is turned on.

A memory address register (M-Register) 172 holds the 12 bit address of an eight-bit byte to be accessed from the program memory. The M-Register 172 is a 12-bit shift register having the capacity to address up to 4,096 different memory locations. It has a serial input and both serial and parallel outputs. Associated with the M-Register 172 but represented as being within the control logic 102 is a serial full adder which increments the M-Register to access sequential instructions or, as applicable, the next two bytes of in-line instructions. The M-Register is incremented by two for a TX instruction when the condition for that transfer is not met, resulting in a skip of two bytes. The M-Register is incremented by three for a Skip-On-Discrete (SD) instruction. The M-Register is exchanged with the $SPM_2$ register for transfer type instructions and exchanged with a data address register (D-Register) 174 to access operands from the main memory. The M-Register is also exhanged with the $SPM_2$ register at the start of an ST instruction which causes the contents of the A-Register to be stored in main memory.

The data address register (D-Register) 174 is a 12 bit shift register that usually contains an operand address and is used to select: (a) SPM register, (b) I/O channel, and (c) number of shifts; depending upon the type of instruction being executed. The D-Register has a serial input and serial output, with the eight least significant bits ($D_0$–$D_7$) having parallel outputs in addition.

A C-Register 176 is composed of six flip-flops which store the six most significant bits of an eight-bit instruction byte obtained from program memory. The flip-flops $C_3$, $C_2$, $C_1$, $C_0$, $K_{11}$, and $K_{10}$ store the instruction bits designated $I_7$, $I_6$, $I_5$, $I_4$, $I_3$ and $I_2$, respectively as received from the main memory output lines (I). These instruction bits are stored by the C-Register during the execution of an instruction to control the sequence of micro-operations executed during the performance of the instruction.

An element designated K-Register 178 is a group of miscellaneous flip-flops for various operations. The $K_0$, $K_1$, and $K_2$ flip-flops are used primarily to control sequencing through the micro-operations. A $K_1$ flip-flop is also used to store the sign of the operand in the A-Register and the sign of a decremented number during a TX instruction. A $K_2$ flip-flop is also used to extend the A-Register during a shift left operation where the $K_2$ Register acts as the $A_{-1}$ stage of the A-Register. $K_3$, $K_4$, and $K_5$ flip-flops may be grouped together and designated a KA-Register and may be used to store the address of the index. The KA-Register is also used as an extension of the A-Register during a shift left operation with $K_3$ as an $A_{-2}$ stage, $K_4$ as an $A_{-3}$ stage, and $K_5$ as an $A_{-4}$ stage of the A-Register. A $K_7$ flip-flop is used as a carry flip-flop in conjunction with the A-Register full adder. It is also used in a transfer of the D-Register contents to the M-Register as a shift left operation to multiply the D-Register word address to the level of the M-Register byte address. A $K_8$ flip-flop is used as a carry flip-flop in conjunction with the M-Register full adder. As previously described, the $K_{10}$ and $K_{11}$ flip-flops form the two least significant bits of the C-Register.

An element designated L-Register 180 is a group of miscellaneous flip-flops for performing control operations. The most significant is the $L_1$ flip-flop which controls turn-on and turn-off of the data processor.

Input/Output (I/O) channels 182 connect the A-Register with the various entities and extremities. The I/O channels are arranged in pairs so that as the output from the least significant bit ($A_0Q$) of the A-Register shifts information to an output channel a corresponding input channel may simultaneously shift information into the A-Register through the input to the most significant bit ($A_{15}D$).

A data path 184 provides two-way communication between the data processor and the main memory. This path carries the main memory address stored in the M-Register and transfers operands to or from the main memory data register (I).

The program instructions for the numerical control system 110 are encoded as 8-bit bytes, each byte being stored in a different program memory location of the main memory. Instructions may have multiple bytes, but most have a length of only 1-byte. Each instruction contains an operation code in the most significant portion and, when required, an operand address in the least significant portion. Indexing is achieved with an index functional modifier byte preceding the instruction byte containing an operand address is to be indexed. Operands can be located in any of the SPM Registers, the constant memory part of the main memory or in two bytes following an instruction (in line) in main memory.

A brief description of data processor interface instructions will now be presented to exemplify data processor operation. A detailed description of the data processor instruction repetoire is provided in the co-pending application Ser. No. 101,881.

The Input/Output (EX) instruction is a one-byte indexable instruction, wherein the four most significant bits identify the operation code and the four least significant bits identify an I/O channel address. When an EX-instruction is executed, the contents of the A-Register is output to the addressed channel defined by the operand address portion of the instructions and the contents of the addressed channel are simultaneously loaded into the A-Register. A shift enable signal FAB is output to gate 16 clock pulses to the selected channel. The FAB micro-operation occurs in word time 1 for an Input/Output instruction and has a duration of 16-bit times. The contents of the A-Register 108 are shifted to a selected output channel while the contents of a selected selected input channel are simultaneously shifted into the A-Register.

The data processor 112 can generate discrete outputs (DO) with a Discrete Output instruction under program control. The DO assignments are:

DO-0 — Spare.

DO-1 — Provide clock pulses to ASR-33 (teletypewriter).

DO-2 — Provides a clock to set the power turn-on interrupt, $L_1$. A DO-2 instruction (1100–0010) will be contained in program memory location $40_{16}$ to reset $L_1$ during power turn-on.

DO-3 — Iteration timer reset

DO-4 — Trigger to $I_2$ latch, the discrete input 4(DI-4) input. The $I_2$ flip-flop is automatically zero set during the power on sequence.

DO-5 — Trigger to $I_3$ latch, the discrete input-5(DI-5) input. The $I_3$ flip-flop is automatically zero set during the power turn-on sequence.

DO-6 — Trigger to $I_4$ latch, the discrete input-6(DI-6) input. The $I_4$ flip-flop is automatically zero set during the power turn-on sequence.

DO-7 — Intensity control

DO-8 — Toggles the $I_1$ flip-flop causing scratch pad memory paging.
DO-9 — Main memory paging.
DO-10 — Not implemented.
DO-11 — Servo set.

The Discrete Output (DC) instruction is a one-byte indexably instruction, wherein the three most significant bits define the operation code and the five least significant bits define an output channel address. An FAH discrete output signal, an inverted 3 microsecond pulse, is generated on the addressed output channel.

The data processor 112 can operate on a discrete input (DI) with a Skip-On-Discrete instruction under program control. The discrete inputs are various low frequency digital signals. The purpose of the discrete inputs is to define a status or condition. The DI assignments are:

DI-0 — Not implemented.
DI-1 — Skip unconditional.
DI-2 — Skip on ASR-33 (teletypewriter).
DI-3 — Skip on the sign of (A).
DI-4 — Skip on $I_2Q$ latch (DO-4 trigger).
DI-5 — Skip on $I_3Q$ latch (DO-5 trigger).
DI-6 — Skip on $I_4Q$ latch (DO-6 trigger).
DI-7 — Skip on logical overflow in A-Register.
DI-8 — Used for troubleshooting.
DI-9 — Skip on arithmetic carry from A-Register.
DI-10 — Skip on positive.
DI-11 — Skip on servo ready.

The Skip-On-Discrete (SK) instruction is a one-byte indexable instruction, wherein the three most significant bits identify the operation code and the five least significant bits identify a discrete input channel address. If a discrete exists on the addressed channel, three bytes (usually a transfer instruction) are skipped and the next instruction is obtained from the fourth byte following the Skip-On-Discrete instruction. If a discrete does not exist on the addressed channel, the next instruction (usually a three-byte transfer instruction) is obtained from the three bytes immediately following the Skip-On-Discrete instruction. The FAG micro-operation occurs in word time 1 for the Skip-On-Discrete instruction and has a duration of 12 bit times. If the selected discrete is true, the M-Register 172 is clocked and incremented by three. If the selected discrete is false, the M-Register 172 is not clocked and is therefore not incremented.

Operator Panel

An operator panel in accordance with the present invention provides bidirectional communication between an operator and a data processing system via intermediary binary digital words. The interactive control system may be an elemental extremity of the data processing system, providing unprocessed rudimentary data for a data processor and receiving preprocessed data for control of display illumination from the data processor. This elemental control system is dependent on data processor coaction for performance of the task of interactive communication with an operator. The data processor 112 operates under the control of a selected stored program to interpret input words, produce an appropriate system response, and provide output words having an appropriate format.

An elemental panel 114 for use in systems of the type disclosed herein are processor dependent structures having means for receiving panel elements, having circuit conductors for coupling elements, and having electronic means in the conductive paths for signal processing. By this arrangement, uncommitted elements can be added or changed and the significance of given panel positions can be determined at processor option under program control without being previously committed through wired operations. The outputs of operator controllable selector switches and momentary switches are transformed to binary codes for greater efficiency. The coded outputs from the momentary switches may be gated to latches which hold the information until sampled by the data processor. Appropriate interlocks and interlock overrides may be used to control the effect of continuous depression of a momentary switch. The binary coded outputs of each selector switch and the combined momentary switch are combined to form a single intermediary input word with each binary coded output occupying a different portion of the word. The word is them sampled and interpreted by the data processor.

A display panel 118 is composed of both lamp displays and numeric displays. Each lamp display driver may be connected to operate in response to a different bit of a lamp display register. In one embodiment, when a register bit stores a binary "1" or is "set", the lamp display element is lighted. The data processor provides an output word to the lamp display register comprising packed discrete lamp control bits, wherein each bit controls a corresponding lamp which is lighted in response to the storage of a "1" bit or extinguished in response to a "0" bit.

The numeric display elements may be segmented tubes, Nixie tubes, or other devices for displaying a selected character. A single numeric character display register may be used to control all of the numeric displays. Output words may be transferred to the numeric display register at a rapid periodic rate for refreshing the display. One portion of these words contains a tube (element) select code identifying a particular element of a plurality of elements and a second part of the word contains a segment select code identifying the segments to be illuminated for a character to be displayed on the selected element. Decoding logic, element select drivers, and character drivers are responsive to signals from the numeric display register to excite the selected segment drivers of the selected numeric display tube to be activated to display the output character. Each numeric display element is selected in turn, sequentially, to display a related character. In order to refresh the numeric display at a flicker-free rate which, in one embodiment, may be thirty times per second; the data processor operating under program control outputs a sequence of display words to be stored in the numeric display register at a cyclic rate of thirty times the number of numeric word displays desired each second. In an embodiment having eight numeric display elements and refreshed at a thirty displays per second rate, the data processor word output rate would be 240 times per second. This output rate may consume only a small part of the operating time of a modern high speed data processor.

Figures 5B, 5D:
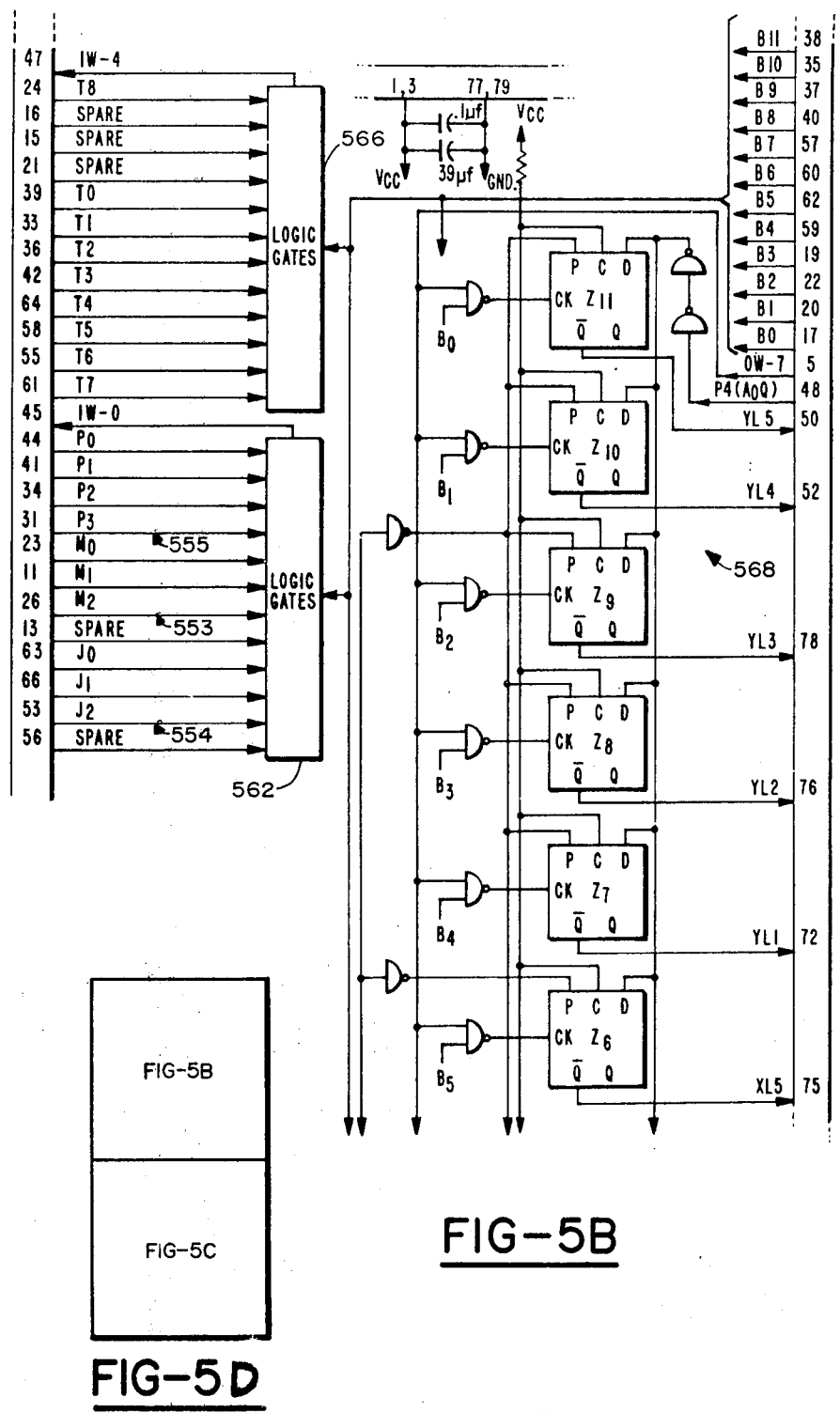
FIG. 5 is a schematic and block diagram representation of the system IFA comprising FIG. 5A showing IFA-1 logic, FIGS. 5B and 5C showing IFA-2 logic, and FIG. 5D showing the form in which FIGS. 5B and 5C connect together.
Figure 6:
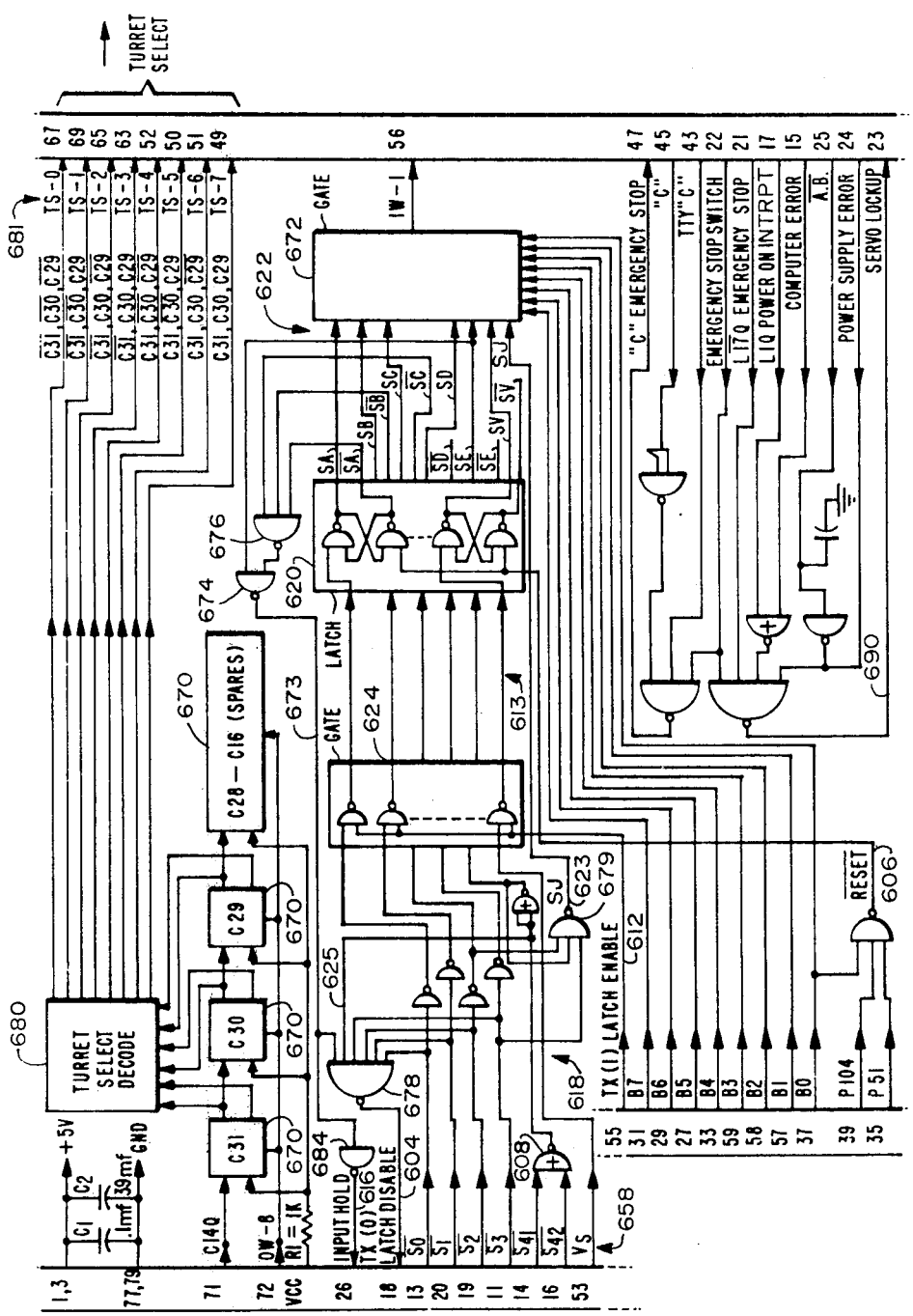
FIG. 6 is a schematic and block diagram representation of IFA-3 logic.

The lamp display register and the numeric character display register may each be well known registers, but in a preferred embodiment are registers such as the C-Register 560 and the C-Register extension 670 shown in FIGS. 5A and 6, respectively.

The reduction of direct wiring connections between the interactive control system and the data processing system not only reduces manufacturing costs but provides tremendous versatility for changing system tasks to which the data processing system may be committed. Panel elements are not committed by wired connection to system circuits but are committed under program control of the data processor, providing generalized elements whose significance may be readily changed through changes in the task defining program. System controls and outputs can be varied by merely adding or deleting spare switches and spare displays and by changing assoicated captions or legends which identify panel elements to an operator in the interactive control system. Corresponding changes in data processor responses are accomplished by making appropriate changes in the stored program.

This invention provides an interactive control system establishing bidirectional communication between an operator and a data processing system. Control and data information passing between an operator and the system passes through an electronic data processor via the medium of intermediary binary digital words.

As shown in FIGS. 1A and 7A, an electronic data processing system 110 includes an electronic data processor 112 and an interactive control system 117. In general, the electronic data processing system may be any such system but the full advantages of this invention are best realized when used in conjunction with a system which has been committed or dedicated to a specific task or family of tasks such as numerical control, payroll, accounting, or inventory control. It will be assumed herein, however, that the electronic data processing system 110 is committed to the task of numerical control of a machine.

The interactive control system 780 includes an operator panel assembly 117 mounting various panel devices and may include devices such as gates 624, one shot 762, trigger logic 678, and latches 620 which are physically located on available space of a printed circuit board within the electronic data processor 112 but which may operate as part of the interactive control system 117.

Figure 2B:
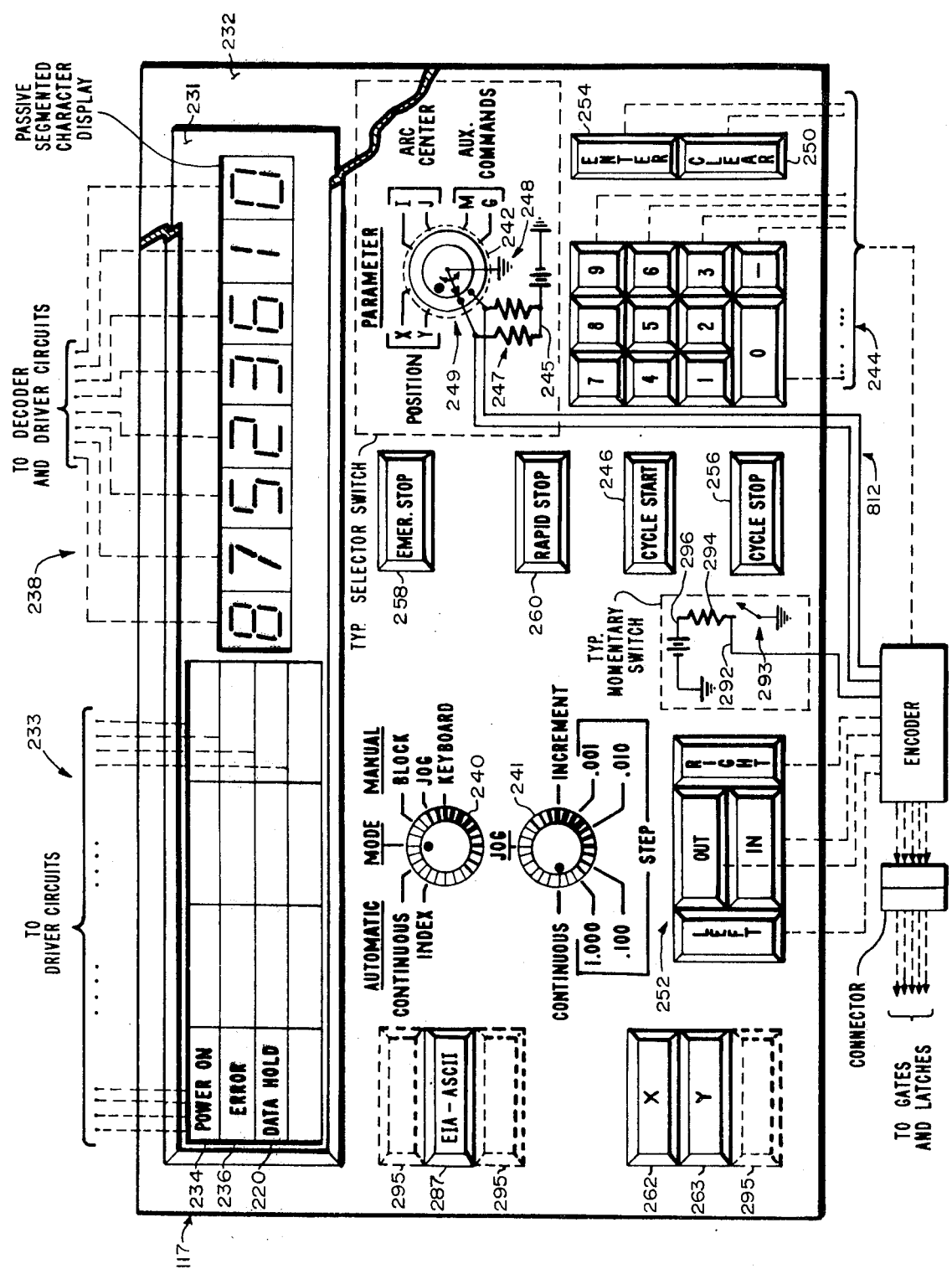

As shown in FIG. 2B a master panel board 232 provides physical support and interconnection for components and circuits including a display portion 118 and a control portion 114 of the operator panel 117. The panel board 232 may be a printed circuit board having conventional spaced apart apertures or receptibles such as at switch locations 240 and 241 into which selector switches may be inserted and 246 and 260 into which momentary switches may be inserted. Printed circuit wiring to each of the element positions and some electronic circuitry may be mounted on the back of the panel board 232 to facilitate error free communication with the data processor 112. By placing this circuitry in close proximity to the switches and displays, signal lines are reduced in length and quantity and wire bundles are reduced or eliminated.

As illustrated in FIG. 2A, the Interactive Control System 117 comprises a control panel 114 and a display panel 118 mounted in a single rectangular plane with the display panel 118 occupying the upper portion of the plane and the control panel 114 occupying the lower portion of the plane. The lefthand portion of the display panel 118 is occupied by status indicator lamp displays 233 such as the Power On indicator lamp 234 and an error indicator lamp 236. These lamp displays provide feedback to the operator by indicating system modes and conditions. All status indicator lamp displays 233 are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays. Included within the status indicator lamp displays 233 are a bank of troubleshooting lamps such as an error indication lamp 236, which are normally obscured behind the filter, but become flashing displays if a malfunction or error should occur. The righthand portion of the display panel 118 is composed of eight numeric displays 238 which may be used to identify the magnitude of system parameters.

Each lamp display 233 is driven by a well known lamp driver circuit which is controlled by one bit in a lamp display register 700. The lamp display register 700 stores an intermediary output word output from the data processor 112 which defines the status of the lamp displays 233. In contrast, the numeric displays 238 are driven sequentially in accordance with an intermediary output word stored in a numeric display register 798.

Each numeric display lamp 238 is excited at a 30 cycle per second flicker free rate under program control in accordance with information contained within a numeric display register 798. Since the numeric display register 798 controls the excitation of all eight numeric display tubes 238, its content may change at a cyclic rate of $8 \times 30 = 240$ times per second. When an intermediary output word is clocked into the numeric display register, the first three bits select the one of eight lamps to be driven. The remaining bits within the numeric display register select the segments within the driven numeric display which are to be excited. This arrangement affords high versatility with reduced hardware. The operation of each numeric display is under program control and only one numeric display register is needed to drive all eight numeric displays.

The control panel has three selector switches and a plurality of momentary switches as shown in FIGS. 2A and 2B. The three selector switches; a Mode switch 240, a Jog switch 241, and a Parameter switch 242; are multiple position rotary switches. The Mode selector switch 240 defines one of the six operating modes of the system, the Jog selector switch 241 defines the machine displacement for each jog command executed when in the jog mode, and the Parameter selector switch 242 defines the parameter to be displayed on the numeric displays 238 and, when in the keyboard mode, defines the address of the parameter to be entered through the keyboard 244. The remaining switches are momentary switches which maintain contact only so long as they are held down.

The Mode selector switch 240 defines the major operating conditions of the system which are: (1) Search, (2) Index, (3) Continuous, (4) Block, (5) Jog, and (6) Keyboard. The Search position 290 of the Mode selector switch 240 permits an operator to identify a desired part program block of commands from a punched tape or from a self-contained parts program memory such as the main memory 130 in systems where this capability is provided, and then initiate an automatic search for that block of commands. A sequence number, which is used to identify the selected block of commands, is entered by an operator through a keyboard 244. The number which is entered through the keyboard 244 is processed by the data processor under program control and displayed on the numeric displays 238 to permit the operator to verify the number which has been entered.

The numerical control system 110 uses a machine index point as a reference for machine positions. The Index position of the Mode selector switch 240 causes the data processor 112 to command the machine axes to return to the previously defined index point. When in the index mode, depression of the Cycle Start switch 246 will command the data processor 112 to generate commands 123 to the servos 120-122 to drive the machine to the index position.

The Continuous position of the Mode selector switch 240 is used after system initialization and initial work piece setup. Depression of the Cycle Start switch 246 by an operator while in the Continuous mode 288 commands the data processor 112 to initiate automatic operation in response to the parts program commands from the tape reader 116 or other source of parts programs.

The Block position 286 of the Mode selector switch 240 permits an operator to control the numerical control system 110 in a semi-automatic mode for operations such as parts program checkout. In this mode, the data processor 112 accesses a single block of commands from a parts program, executes the accessed commands, then enters the Cycle Stop condition. When in the block mode, a parts program can be executed one block at a time by having an operator depress the Cycle Start switch 246 for each block executed.

The Keyboard position 284 of the Mode selector switch 240 permits an operator to control the system in a semi-automatic mode. A block of parts program commands can be entered by the operator through the keyboard 244 and then executed by the data processor when the Cycle Start switch 246 is depressed by the operator. When commands are loaded through the keyboard 244, the data processor 112 will process these commands and display the loaded commands on the numeric display 238. Data input errors can be easily corrected by the operator depressing Clear switch 250, causing the data processor 112 to blank the numeric display 238, and by the operator reentering the parameter through the Keyboard 244, causing the data processor 112 to display the new commands entered by the operator.

The Jog position of the Mode selector switch 240 permits an operator to command the data processor to reposition the machine in a semi-automatic manner for operations such as initial workpiece setup or index position definition. The Jog selector switch 241 and the Jog Direction switches 252 may be used by the operator to command the data processor 112 to reposition the machine. In this manner, the data processor can be commanded by an operator to control the machine through the servos so that the machine may be positioned with a minimum of effort, fixtures, readouts, and optics within the resolution of a system (0.0005 inch). The data processor 112 in the numerical control system 110 generates position commands under program control in accordance with the distances and directions selected by the operator without burdening the operator with tedious measuring functions. In addition, the data processor 112 controls the numeric displays 238 to show the machine position, providing verification for an operator while in this mode.

The Jog selector switch 241 becomes operative when the Mode selector switch 240 is in the Jog position and defines the magnitude of machine displacement for each jog command executed. The selectable positions are: (1) Continuous, (2) 1.0000 inch step, (3) 0.1000 inch step, (4) 0.0100 inch step, (5) 0.0010 inch step, and (6) Increment.

The Continuous position of the Jog selector switch 241 commands the data processor in the system to control the servos to drive continuously in a direction wherein the direction is commanded by one of four Jog Direction switches 252. These direction switches 252 are interrogated by the data processor and command the data processor to control the servos to drive the machine left, right, in, or out depending upon which one of the four Jog Direction switches is depressed. While in the Continuous Jog position, the machine is driven continuously by the servos as commanded by the data processor in the commanded direction for the duration of time that a Jog Direction switch is maintained in a depressed state.

The four step positions of the Jog selector switch 240 cause the data processor to command the servos to drive the machine a selected step distance each time a Jog Direction switch is depressed.

The Increment position of the Jog selector switch 241 commands the data processor to control the servos to drive the machine a single least significant increment of distance each time a Jog Direction switch 252 is depressed, 0.0005 inch in this embodiment of the invention. When in the Step or Increment positions, regardless of whether a Jog Direction switch 252 is maintained in a depressed state for a short time or continuously, the data processor will command the machine to reposition by only the single commanded step and then to halt. Additional motion can be initiated by the operator by releasing and again depressing a Jog Direction switch 252. This data processor interlock eliminates the need for rapid operator response, since the precise step commanded will be executed independent of the duration of time that a Jog Direction switch 252 is depressed.

The position of the Parameter selector switch 242 defines for the data processor the parameter that the operator selects to be displayed on the numeric displays 238 and, when the Mode selector switch 240 is in the Keyboard position 284, defines for the data processor the block of commands being entered by the operator through the keyboard 244 for entering into the data processor and for display to the operator. Selectable parameters for display with one embodimnt include: (1) Sequence No.-N 223, (2) Absolute Position-X 227, (3) Absolute Position-Y 226, (4) Arc Center-I 228, (5) Arc Center-J 229, (6) Auxiliary Command-M 231, and (7) Auxiliary Command-G 298.

The Sequence Number position commands the data processor to control the numeric displays 238 to show the address of a block of punched tape commands being read from the punched tape while the Mode selector switch is in the Continuous or Block positions and commands the data processor to control the numeric displays 238 to show the sequence number being entered by the operator through the keyboard 244 while the Mode selector switch is in the Keyboard position. This keyboard entry operation is performed prior to initiating a tape search in the Search mode.

The Absolute Position locations of the Parameter selector switch 242 commands the data processor to control the numeric display 238 to display the position of the machine relative to the floating zero or index point. When the Mode selector switch 240 is in the Keyboard location 284 and the Parameter selector switch 242 is in one of the Position locations, the data processor is commanded to enter the position commanded by the operator through the keyboard 244 and to display the entered position on the numeric display 238. For example, when the operator wishes to position the machine to an X coordinate of 05.6000, he positions the Mode selector switch 240 to the Keyboard position 284 and the Parameter selector switch 242 to the Absolute Position X position 227, then he enters the numbers 05.6000 with the keyboard 244. The data processor will enter and display this position number on the numeric display 238 and the data processor will command the servos to move the machine to this X position when the operator depresses the Cycle Start switch 246.

In similar manner the Arc Center and Auxiliary Command locations of the Parameter selector switch 242 are used in the Keyboard mode to enter the commands from the keyboard 244.

The momentary switches may be hermetically sealed reed relay switches. A latching interlock is provided to make the system insensitive to dynamic switch conditions such as switch bounce. In addition, operation is independent of the duration of time of switch depression where additional switch commands that may result in ambiguities are automatically locked-out as long as a previously depressed momentary switch remains depressed.

Momentary switches are grouped into functional arrays for operator convenience. For example, the keyboard switches 244 and the Jog Direction switches 252 are grouped into functional arrays.

The keyboard 244 is composed of ten numeric switches, defined as switches 0 through 9, and a negative sign switch. The 0 key can be used to command the data processor to load a plus sign when required. The numeric and sign keys of the keyboard 244 are used to command the data processor to enter data in the Keyboard mode and a Clear key 250, adjacent to the keyboard 244, is used to command the data processor to blank the numeric displays 238 prior to the operator entering data from the keyboard 244. An Enter key 252 causes a parameter to be accepted by the data processor after it has been entered through the keyboard 244 and verified by the operator's observation of the numeric display 238. In the Keyboard mode the various parameters can be entered or changed as required by an operator. Parameter verification is achieved by an operator positioning the Parameter selector switch 242 to the desired parameter position, which commands the data processor to display the selected parameter on the numeric display 238. Parameter modification is accomplished by the operator depressing the Clear key 250, commanding the data processor to blank the numeric display 238, followed by the operator sequentially depressing the sign and numeric switches of the keyboard 244. The data processor loads the parameter entered through the keyboard and provides a presentation of the entered parameter on the numeric display 238. The entered parameter may be automatically accepted by the computer for processing and for display under program control.

The Cycle Start switch 246 and the Cycle Stop switch 256 are used by the operator to command the data processor to initiate and to terminate automatic operation, respectively. When in the cycle off condition, as identified by the data processor illuminating the Cycle Off status indicator lamp 271, the operator can command the data processor to initiate automatic operation by depressing the Cycle Start switch 246. The data processor will automatically execute parts program commands until detecting a condition that commands a cycle stop condition. Such conditions are enabled by the Mode selector switch and include:

(1) detecting the required tape location in the search mode, (2) completing repositioning of the machine to the floating zero point in the index mode, (3) completing execution of a block of tape commands in response to appropriate G or M commands contained therein or if the operator has depressed the Cycle Stop switch 256 in the continuous mode, (4) completing execution of a single block of tape commands in the block mode, (5) completing execution of the jog command in the jog mode, and (6) completing execution of a single block of keyboard commands in the keyboard mode.

When in the continuous mode with the cycle on condition activated as identified by the Cycle On status indicator lamp 213 illuminated, the operator can command the data processor to discontinue automatic operation by depressing the Cycle Stop switch 256. The data processor will complete the execution of the block of parts program commands in process and then enter the cycle off condition as identified by the Cycle Off lamp 271 being illuminated. When the data processor is operating in a mode other than the continuous mode with the cycle on condition displayed, it is not necessary for the operator to depress the Cycle Stop switch to discontinue automatic operation because, in all modes other than the continuous mode, the data processor executes a single set of commands and then automatically enters the cycle off condition.

An Emergency Stop switch 258 is used to discontinue automatic operation rapidly and to force the system into a reinitialization condition. After the Emergency Stop switch has been depressed, it is necessary for the operator to perform the system initialization sequence prior to operating the system. The system initialization sequence involves:

(1) positioning the Mode selector switch 240 to the Jog position, (2) jogging the machine tool to the index position, (3) positioning the Mode selector switch 240 to the Index location, (4) depressing the Cycle Start switch 246 to load the index position of the machine tool, and, (5) if required, loading the punched tape in the tape reader 116.

The Jog Direction switches 252 are used by the operator to define direction of motion and to command the data processor to initiate this motion, but only when the system is in the jog mode. In addition, the position of the Jog selector switch 241 defines for the data processor the type of motion, i.e. Continuous, Step, or Increment. The jog directions of (1) Right, (2) Left, (3) In, and (4) Out, may be defined by facing the machine from the control panel side. A Jog Direction switch is provided for each direction of each axis or two Jog Direction switches per axis. For simplicity, only four Jog Direction switches are shown to exemplify operation in two axis. Additional axis of control can be provided such as with additional pairs of Jog Direction switches.

The Rapid Stop switch 260 commands the data processor to control machine motion to stop immediately, but permits operation to be resumed by the data processor when the operator depresses the Cycle Start switch.

A pair of Mirror Image switches 262, 263 are used by the operator to command the data processor to selectively reverse the commanded directions of motion. Alternate depression of the X or Y Mirror Image switches 262, 263, respectively, will command the data processor to cause the Mirror Image status indicator lamps, contained in the bank of lamp displays 233, to change state from +X or +Y to −X or −Y and conversely. The operational condition presented by the data processor on the Mirror Image status indicator lamps 233 defines system conditions to the operator. Additional Mirror Image switches and lamps can be provided for additional axis of control.

The control switches of the control panel are not hardwired directly into the control panel lamps and other functions. Instead, the data processor periodically samples the status of the various switches under program control. The data processor then further acts under program control to operate the various entities of the system in accordance with the status of the control switches. Because the switches are sampled in this way as opposed to being hard wired, the basic numerical control system 110 can be used for a different but related application by merely providing different extremities, changing the designations associated with the various switches, and changing the program which interprets the various switch positions and causes the system to react accordingly. In addition, existing switches can be easily deleted or, if desired, spare capacity permits the addition of either extra momentary switches or extra selector switches or even additional positions of existing selector switches.

In order to reduce the number of wiring connections and facilitate convenient processing, the individual switches and switch positions are first encoded into a binary format before being presented to the data processor 112. The encoded positions of the Mode selector switch 240, Jog selector switch 241, and Parameter selector switch are shown in Tables I, II, and III respectively.

TABLE I

| M2 | M1 | M0 | |
|---|---|---|---|
| 0 | 0 | 0 | Spare (Error) |
| 0 | 0 | 1 | Block |
| 0 | 1 | 0 | Continuous |
| 0 | 1 | 1 | Search |
| 1 | 0 | 0 | Keyboard |
| 1 | 0 | 1 | Jog |
| 1 | 1 | 0 | Index |
| 1 | 1 | 1 | Spare |

TABLE II

| J2 | J1 | J0 | |
|---|---|---|---|
| 0 | 0 | 0 | Spare (Error) |
| 0 | 0 | 1 | Continuous |
| 0 | 1 | 0 | 1.000 inch |
| 0 | 1 | 1 | 0.100 |
| 1 | 0 | 0 | 0.010 inch |
| 1 | 0 | 1 | 0.001 inch |
| 1 | 1 | 0 | Increment |
| 1 | 1 | 1 | Spare |

TABLE III

| P3 | P2 | P1 | P0 | |
|---|---|---|---|---|
| 0 | 0 | 0 | 0 | Spare (Error) |
| 0 | 0 | 0 | 1 | X-Position |
| 0 | 0 | 1 | 0 | Y-Position |
| 0 | 0 | 1 | 1 | Spare |
| 0 | 1 | 0 | 0 | Spare |
| 0 | 1 | 0 | 1 | I-Arc Center |
| 0 | 1 | 1 | 0 | J-Arc Center |
| 0 | 1 | 1 | 1 | Spare |
| 1 | 0 | 0 | 0 | Spare |
| 1 | 0 | 0 | 1 | M-Auxiliary Command |
| 1 | 0 | 1 | 0 | G-Auxiliary Command |
| 1 | 0 | 1 | 1 | Spare |
| 1 | 1 | 0 | 0 | Spare |

TABLE III-continued

| P3 | P2 | P1 | P0 | |
|---|---|---|---|---|
| 1 | 1 | 0 | 1 | Spare |
| 1 | 1 | 1 | 0 | Spare |
| 1 | 1 | 1 | 1 | Spare |

In a similar manner, all of the momentary switches are encoded into five binary bits designated S0, S1, S2, S3, S4, as shown in Table IV. These five bits can accommodate up to 31 momentary switches. In addition, a sixth bit, $V_s$ provides a verify function for the stop switches.

The encoded selector switch bits are combined into a single sixteen bit word having the format of P3, P2, P1, P0, Spare, J2, J1, J0, M2, M1, M0, Spare, and four zero states shown in FIG. 5B with logic gates 562. This word is serially scanned into the central data processor 112 with logic gates 562 (FIG. 5B) whenever the selector switches are to be sampled under program control. Similarly, the encoded outputs of the momentary switches make up a separate word which is periodically sampled under program control with logic gates 672 shown in FIG. 6.

Three multi-position selector switches, a Mode selector switch 240, a Jog selector switch 241 and a Parameter selector switch 242 provide primarily control type functions. Because hardwiring of switch controls is avoided by having intermediary output words communicated to and interpreted by the data processor 112, the number of selector switches as well as the number of contacts on each selector switch can be easily varied to meet the requirements of a specific application. The selector switches are implemented by grounding the wiper arm 249 and connecting each switch contact 248 to a positive voltage 245 through a resistor 247. This arrangement causes the signals 812 from the contact outputs to represent the inverse of the selector switch position, a condition particularly suitable to modern integrated circuit logic gates.

As shown in FIG. 7, the 7 signals 750 from the contact of the Mode selector switch 240 and the 7 signals 751 from the contacts of the Jog selector switch 241 are each converted by encoders 726 and 728 respectively into 3-bit binary coded signals 553 and 554, respectively. Similarly, the 15 signals 752 from the contacts of the Parameter selector switch 242 are converted by an encoder 730 to 4-bit binary coded signals 555. These encoded signals are connected to Scanout and I/O Channel-0 562 which converts the parallel signals 553, 554, 555 to a serial intermediary binary digital word IW-0 as they are shifted into the A-Register 788 of the data processor 112 under control of an input instruction.

Although each of the encoders 726, 728 and 730 can accommodate one more input signal, the binary coded output represented by binary all zeros is not implemented to permit the data processor to detect a switching error. If a wiper arm of a selector switch 240, 241 or 242 is between contacts or fails to make proper contact with a contact, the associated encoder 726, 728, or 730 provides an all zero output. The data processor 112 interprets an all zero output as an error condition and, after a short delay to allow for normal switching time, commands an "error" display lamp 236 to be illuminated.

Referring now to FIG. 2B, 24 momentary switches 734 (FIG. 7A) typified by switches 262, 263 are mounted on the panel board 232. As described for the selector switches 240, 241, 242; the number of momentary switches 734 can be easily varied to meet the requirements of a specific application. The circuitry of the present embodiment can accommodate up to 31 momentary switches with locations for possible additional switches represented by dotted outlines 295.

In a preferred embodiment, reed switches are mounted in apertures in the panel board 232. Other well known switches may also be used. As described for the selector switches, the momentary switches 734 are implemented by grounding the wiper contacts 293 and connecting the stationary contacts 292 through a pull-down resistor 294 to a positive voltage 296.

As shown in FIGS. 6 and 7A, the 31 switch outputs 757 are converted to a 5-bit binary coded signal 658 by encoder 738, thereby reducing the number of transfer lines to minimize interconnections and circuitry. The five binary signals are $\overline{S}_0$ through $\overline{S}_4$ with two partial signals $S_4^1$ and $S_4^2$ being NORed together with gate 608 to form the $\overline{S}_4$ signal. In addition a redundant sixth signal VS performs a verify function by indicating depression of either a Rapid Stop switch 260 or an Emergency Stop switch 258. The signals $\overline{S}_0$ through $\overline{S}_4$ 658 are connected through inverting logic gates 618 to logic gates 624. The signal VS is connected directly to logic states 624. The logic gates 624 connect gated signals $S_0-S_4$ and Vs to latches 620, but only when an enable signal 612 is received from a delayed one shot 762.

The latches 620 permit the data processor 112 to sample the intermediary binary digital output word represented by the latch outputs (SA, SB, SC, SD, SE, SV) 622 at a programmed rate which may be 10-times each second. This rate is sufficiently high to avoid inconvenience to an operator who should not depress a subsequent momentary switch until the output from a previously depressed momentary switch has been sampled by the data processor 112; where sampling by the data processor resets latches 620 with reset signal 606 upon completion of the sampling operation.

A system of lockouts and lockout overrides is used to minimize errors while still permitting the interactive control system 780 to accomplish all necessary operations. An Inhibit signal 673 is produced by logic gates 674 and 676 whenever any of the latches 620 are set which by logically ORing the the output signals SA-SE of latches 620. One of the latches 620 is set by the VS verify signal, but does not contribute to the Inhibit signal 673. The Inhibit signal 673 is connected to a NAND gate 678 which provides a trigger signal 604 to the delayed one-shot 762 as an output. The gate 678 is also connected to binary signals $\overline{S}_0-\overline{S}_4$ and produces a trigger signal 604 only when a signal is produced on at least one of the binary outputs $\overline{S}_0-\overline{S}_4$ subsequent to a condition in which there is no Inhibit signal and no signal on any of the binary outputs $\overline{S}_0-\overline{S}_4$. In other words, the output of a subsequent momentary switch cannot be gated by signal 612 and latched until the latches 620 have been reset with reset signal 606 and all previously depressed momentary switches have been released.

The delayed one shot 762 produces a 3μS pulse following a 10 ms delay. The 10 ms delay permits transient switching conditions such as switch bounce, inherent in all momentary switches, to subside before the binary outputs $S_0-S_4$ and VS are gated to the latches 620. Thus, the lockout arrangement not only prevents errors created by the depression of more than one momentary switch but also prevents errors due to transient switching conditions.

A special signal is provided by NAND gate 679 which produces a signal on output $\overline{S}_J$ 623 whenever the condition $S_4 \cdot S_3 \cdot \overline{S}_2$ exists. This $S_J$ signal is related to the jog direction switches 252 as will be obvious from the codes shown in Table IV. The signal $\overline{S}_J$ indicated depression of one of the Jog Direction switches 252, Left, Right, In or Out. This permits the data processor to identify if a jog direction switch is maintained in the depressed state for the jog continuous condition.

The inhibit signal 673 is inverted by a NAND gate 684 to provide a data hold signal 616. This data hold signal controls a Data Hold lamp display 220 which becomes illuminated to indicate a set condition of at least one of the latches 620. As long as the Data Hold lamp display is illuminated, the operator knows he should not depress another momentary switch.

The binary codes for the momentary switches are presented in Table IV.

TABLE IV

| Vs | $S_4$ | $S_3$ | $S_2$ | $S_1$ | $S_0$ | |
|---|---|---|---|---|---|---|
| 0 | 0 | 0 | 0 | 0 | 0 | Spare-0 |
| 0 | 0 | 0 | 0 | 0 | 1 | Keyboard 0 |
| 0 | 0 | 0 | 0 | 1 | 0 | Keyboard 1 |
| 0 | 0 | 0 | 0 | 1 | 1 | Keyboard 2 |
| 0 | 0 | 0 | 1 | 0 | 0 | Keyboard 3 |
| 0 | 0 | 0 | 1 | 0 | 1 | Keyboard 4 |
| 0 | 0 | 0 | 1 | 1 | 0 | Keyboard 5 |
| 0 | 0 | 0 | 1 | 1 | 1 | Keyboard 6 |
| 0 | 0 | 1 | 0 | 0 | 0 | Keyboard 7 |
| 0 | 0 | 1 | 0 | 0 | 1 | Keyboard 8 |
| 0 | 0 | 1 | 0 | 1 | 0 | Keyboard 9 |
| 0 | 0 | 1 | 0 | 1 | 1 | Keyboard Clear |
| 0 | 0 | 1 | 1 | 0 | 0 | Keyboard Enter |
| 0 | 0 | 1 | 1 | 0 | 1 | Spare-13 |
| 0 | 0 | 1 | 1 | 1 | 0 | Spare-14 |
| 0 | 0 | 1 | 1 | 1 | 1 | X |
| 0 | 1 | 0 | 0 | 0 | 0 | Y |
| 0 | 1 | 0 | 0 | 0 | 1 | Spare-17 |
| 0 | 1 | 0 | 0 | 1 | 0 | Spare-18 |
| 0 | 1 | 0 | 0 | 1 | 1 | Cycle Start |
| 0 | 1 | 0 | 1 | 0 | 0 | Cycle Stop |
| 1 | 1 | 0 | 1 | 0 | 1 | Rapid Stop |
| 1 | 1 | 0 | 1 | 1 | 0 | Emergency Stop |
| 0 | 1 | 0 | 1 | 1 | 1 | Spare-23 |
| 0 | 1 | 1 | 0 | 0 | 0 | In |
| 0 | 1 | 1 | 0 | 0 | 1 | Out |
| 0 | 1 | 1 | 0 | 1 | 0 | Left |
| 0 | 1 | 1 | 0 | 1 | 1 | Right |
| 0 | 1 | 1 | 1 | 0 | 0 | Spare-28 |
| 0 | 1 | 1 | 1 | 0 | 1 | Spare-29 |
| 0 | 1 | 1 | 1 | 1 | 0 | Spare-30 |
| 0 | 1 | 1 | 1 | 1 | 1 | Spare-31 |

Referring now to FIG. 7A, the binary coded outputs 553-555 from the three selector switches 240, 241, 242 are combined to form a single intermediary binary digital input word IW-0 (FIG. 5B) which is shifted into the A-Register 788 of the data processor 112 through Scanout and I/O Channel-0 562 under control of an input instruction. Similarly, the outputs from the momentary switches 734 are used to form an intermediately binary digital output word IW-1 (FIG. 6) which is shifted into the A-Register 788 through Scanout and I/O Channel-1 672 under control of an input instruction. Computer instructions are described in detail in the parent applications.

Once an intermediary input word is within the A-Register 788, it is manipulated and interpreted by an arithmetic and control unit 794 operating under control of program instructions stored in a memory 130. After an input word has been interpreted, the data processor 112 generates appropriate system responses.

The data processor 112 also generates preprocessed intermediary output words having selected formats and transfers them from the A-Register 788 to a numeric display register 798 and a lamp display register 700 through I/O Channel-5 702 and I/O Channel-6 704, respectively. These channels provide bidirectional communication of intermediary output words with the A-Register, permitting previously output words to be returned to the A-Register 788 to check for errors occurring during transmission. The interpretation and processing of intermediary words takes place within the data processor 112.

The displays include both lamp displays 233 and numeric displays 238. As shown in FIGS. 2A and 2B, both the lamp displays 233 and the numeric displays 238 are mounted on the display subpanel board 231 which is in turn mounted on the panel mother board 232. The lamp displays 233 may be conventional bayonet type lamps and the display subpanel board 118 contains a batch fabricated block of lamp sockets which receive the lamps. These lamp sockets provide the multiple functions of mounting, electrical connection and heat sink. Each lamp may be selectively connected to ground either directly or through a flasher bus. The lamp displays 233 are enhanced with a special filter to suppress glare and provide an easy to read, aesthetically pleasing presentation. Displays and legends that are not illuminated are obscured behind the filter, simplifying rapid appraisal of system conditions and eliminating the need to mentally separate illuminated displays from non-illuminated but visible displays.

The numeric display elements 238 are conventional 9 segment displays capable of displaying all numerical characters and some alphabetic characters. The eight numeric display elements 238 of this embodiment are mounted horizontally on the display subpanel board 231.

Coupled to the lamp displays 233 are lamp drivers 710 which are coupled to the lamp display register 700. With the exception of a few lamp drivers 710 which are hardwired to respond to special functions such as Over Temperature, P/S Error, Power On and Data Hold; each lamp driver 710 responds to a selected bit of an intermediary binary digital output word stored in the lamp display register 700.

Figure 7B:
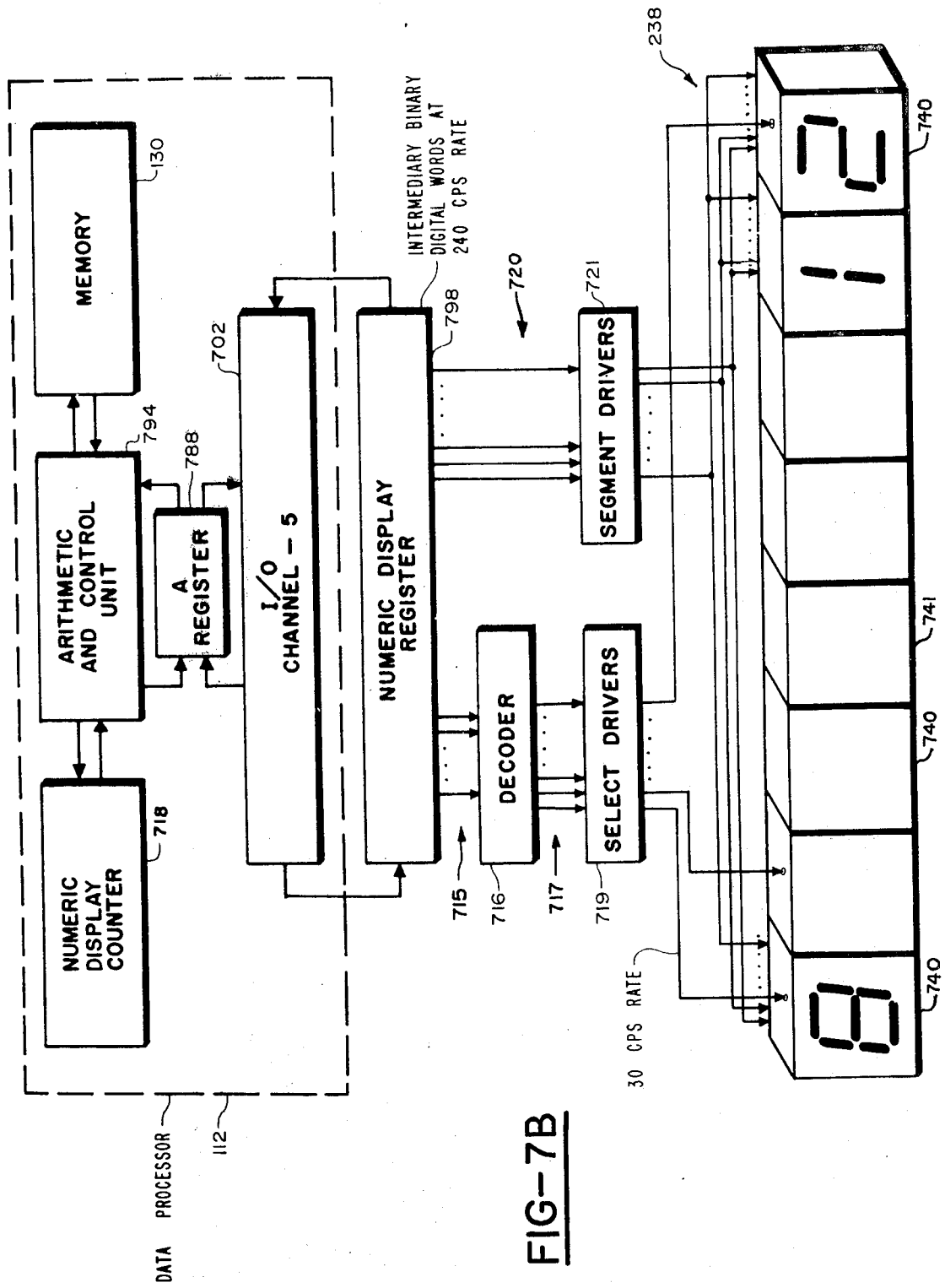
FIG. 7 is a schematic and block diagram representation of the operator panel comprising FIG. 7A showing logic for communication between the data processor and the operator panel and FIG. 7B showing logic for a numeric display.

As shown in greater detail in FIG. 7B, the implementation of the 8 numeric display elements 238 is considerably more complex than that used for the lamp displays 233. Because each numeric display element 740 requires multi-bit control signals, a cyclic technique is used to drive all eight numeric display elements from a single numeric display register 798, thereby greatly reducing the amount of circuitry required. To accomplish this, the eight numeric display elements are sequentially excited at a flicker-free 30 cps rate. In order to excite each numeric display element 740 at a rate of 30 cps the contents of the numeric display register must change at a cyclic rate of 240 cps.

The numeric display operations are performed in the data processor 112 under program control and may utilize the numeric display counter 718, the update control, the refresh control, and the data registers. These operations need not be physically identifiable, but may be implemented under program control of the data processor. The display parameter is converted from a binary to a BCD code, then modified for the special segment code requirements of the numeric display tube. The tube identification code is packed or assembled into the word, which is output to the numeric display register 798 in the interactive control system 780.

In order to excite one of the numeric display elements 740 the data processor 112 utilizes the count of the numeric display counter 718 implemented under program control. For example, a binary count of three would indicate that the fourth numeric display element 741 is to be excited. The data processor accesses a location in the memory 130 storing display information to excite the fourth numeric display with the proper character. It should be noted that the binary numbers of 0 through 7 represent the first through the eighth numeric display elements, with binary number three representing the fourth numeric display element. This information is transferred from the memory 130 to a least significant portion of the A-Register 788 where it is joined by the binary count (three) from the numeric display counter parameter which is packed in the most significant portion of the word to form a packed intermediaty digital output word. This output word is transferred from the A-Register 788 through I/O Channel-5 702 to the numeric display register 798 with a data processor output instruction. After the word is output, the numeric display counter is incremented by the data processor under program control so that the fifth numeric display element will be excited next. In addition to providing intermediary output words to the numeric display register at a rate of 240 cps, the data processor also updates the locations in the memory 130 which store the information determining the numeric character to be displayed. This updating may occur at a cyclic rate of 16 cps. This is about as fast as the operator can follow changes in the characters displayed by the numeric display elements 740.

The contents of the three numeric display select bits in the most significant portion of the numeric display register 798 are communicated by three pairs of lines 715, each pair of lines representing the Q and $\overline{Q}$ outputs from a register flip-flop to decoder 716. Decoder 716 activates one of eight select drivers 719, the fourth select driver being activated in this example. Simultaneously, nine segment drivers 721 are selectively excited with signals 720 according to the numeric display character information stored in the least significant portion of the word in the numeric display register 798, each driver being responsive to a different register bit signal.

The segment drivers 721 present drive signals forming the stored character to the appropriate segments of all eight numeric display elements 740. However, only the fourth numeric display element 741, which receives a select signal from the select drivers 719, displays the selected character in response to the select signal.

The elemental nature of system subsystems and the related data processor coaction under program control may be utilized to simplify system setup procedures, thereby minimizing setup time as well as errors. For this purpose, an operator's manual may be used in conjunction with the numeric displays 238 on the control panel and a special program in the data processor 112. The operator's manual is divided into several sections, each pertaining to a particular mode of machine operation. The Parameter switch 242 would be set to a specified position defining an interactive system initialization condition. This condition would cause the data processor to sense system conditions and respond under selected program control by causing the numeric displays to display a code number identifying a section in the operator's manual. The operator would look up the number in the operator's manual to identify the machine condition or status and the next step of the procedure to place the system into its desired mode. As each procedural step is taken, a new code number appears showing whether the last step was properly performed until the system can be started. This permits a totally inexperienced operator to sequentially perform the entire system set up or initialization.

Numerical Control Operations

The operation of the CNC system will now be described. Operation is determined by modes, conditions, and commands such as defined by the control panel 114, display panel 118, source of parts programs such as the tape reader 116, and other devices.

Preparatory (g) and miscellaneous (m) commands are parts program auxiliary commands used to set internal control conditions and external machine conditions, respectively. The g and m commands are defined in Table V and described hereafter. The data processor 112 receives these auxiliary commands from a source of parts program commands such as the tape reader 116, parts program memory 130, control panel 114, auxiliary I/O channels 128, or other sources. The data processor 112 sets operating conditions such as packing discrete bits into a digital word or other well known techniques to set the system conditions, providing available system condition information for executing these commands when required. Nomenclature used in Table V is defined, hereafter. The "COMMAND" column defines the command symbol. The "RELATED" column defines the relation between these commands and implies whether they are mutually-exclusive, resulting in the reset of the command. The "EXECUTE" column defines whether this particular command is executed immediately or at the end of a block. If executed immediately the motion commands in that block will be executed in conjunction with this new auxiliary command. If executed at the end of that block, the motion commands in the block will be executed as if this new auxiliary command had not been programmed. This new command will then be executed at the completion of the other commands in that block. The "MODAL" column defines whether the command is modal or not modal. If the command is only used in that block, it is automatically reset after the execution of the block and must be reprogrammed in subsequent blocks when required. If the command is modal, it is stored until changed; where it will operate on every subsequent block of commands until it is changed. The "INITIALIZE" column identifies the condition of this command when the system is turned-on, identified with the INITIALIZE light. The "NOTES" column briefly describes the operations of these commands. The commands defined in Table V are described in the referenced EIA Standards. Many of these commands are defined in greater detail hereafter to illustrate the operation of this CNC system.

The machine home position is a fixed absolute position on the machine that may be used as an absolute position reference. The ability of the data processor 112 to sense the absolute position of the machine axes such as described in the previously referenced applications Ser. No. 101,881 and Ser. No. 134,958 permits the data processor 112 to keep track of the precise positions of the machine axes. The data processor senses the machine axes conditions from servos 120, 121, and 122 with signals 123 or directly with signals 126, then controls the machine 124 to perform the commanded operations. In one embodiment, the machine home position is an absolute position point, the general location of the home position is defined by a switch on each axis and the precise location of which is defined by the pickoff null. The data processor will drive the selected axes with command signals 123 until the switch closure is detected with signals 123 or 126, then the data processor will creep the selected axes into the pickoff null positions. The machine home position is commanded with m codes. Various parameters are selectable with the data processor stored program, such as axes (with associated m codes), direction of slew for each axis, slew velocity, and home position coordinates. The data processor 112 executes the slew routine to drive the selected axes with signals 123 in the specified direction at the specified velocity, with continued testing of the home position switch signals 126 to define the stopping point. A drive resolution of 0.004 inches or better is required to insure repeatable detection of the home position switch closure condition. Acceleration and deceleration are often not required, where the specified velocity is usually low enough to permit velocity step functions without loss of synchronization. The slew feedrate is conveniently modifiable under stored program control to accomodate different machine characteristics. When the home position switch is detected, zero synchronization is initiated to position the axis to the precise resolver null. Because the applicability of this feature is a function of the type of machine, it is programmed as a subroutine for ease of incorporation or deletion. Program execution speed is of little consequence so memory utilization is a primary consideration. An automatic fixed cycle is provided to selectively return each machine axis to the home position. The home position fixed cycle is initiated with m commands m21 through m25 (defined in Table V), where each m command will cause the associated axis to translate to the home position for that axis. Caution should be exercised by an operator to prevent interference between the tool, workpiece, and machine during this positioning operation.

TABLE V

| COMMAND | RELATED | EXECUTE IMMED. | AT END OF BLOCK | MODAL | INITIALIZE | NOTES |
| --- | --- | --- | --- | --- | --- | --- |
| g01 | A | Yes | — | Yes | 1 | Linear Interpolation |
| g02 | A | Yes | — | Yes | 0 | Circular Interpolation CW |
| g03 | A | Yes | — | Yes | 0 | Circular Interpolation CCW |
| g04 | — | Yes | — | No |   | Dwell From Tape |
| g07 | — | Yes | — | No | 0 | Rapid Traverse |
| g08 | B | Yes | — | No | 0 | Acceleration |
| g09 | B | — | Yes | No | 0 | Deceleration |
| g12 |   | Yes | — | No |   | Full Circle In One Block |
| g17 | D | Yes | — | Yes | 1 | Circular Interpolation, xy Plane |
| g18 | D | Yes | — | Yes | 0 | Circular Interpolation, zx Plane |
| g19 | D | Yes | — | Yes | 0 | Circular Interpolation, yz Plane |
| g27 | — | Yes | — | No |   | Floating Zero Definition |
| g28 | R | Yes | — | Yes | 0 | Axis Rotation On |

TABLE V-continued

| COMMAND | RELATED | EXECUTE IMMED. | EXECUTE AT END OF BLOCK | MODAL | INITIALIZE | NOTES |
|---|---|---|---|---|---|---|
| g29 | R | Yes | — | Yes | 1 | Axis Rotation Off |
| g33 | J | Yes | — | No | 0 | Threading |
| g40 | C | Yes | — | Yes | 1 | Cutter Compensation Cancel |
| g41 | C | Yes | — | Yes | 0 | Cutter Compensation Left |
| g42 | C | Yes | — | Yes | 0 | Cutter Compensation Right |
| g50 | V | Yes | — | Yes | 1 | Absolute-All axes |
| g51 | V | Yes | — | Yes | 0 | Incremental-All Axes |
| g52 | V | Yes | — | Yes | 0 | Incremental-x axis |
| g53 | V | Yes | — | Yes | 0 | Incremental-y axis |
| g54 | V | Yes | — | Yes | 0 | Incremental-z axis |
| g55 | V | Yes | — | Yes | 0 | Incremental-b axis |
| g80 | W | Yes | — | Yes | 1 | Canned Cycle Cancel |
| g81–89 | W | Yes | — | Yes | 0 | Canned Cycle Select |
| g90 | H, | Yes | — | Yes | 1 | IPM Feedrate |
| g91 | H,J | Yes | — | Yes | 0 | IPR Feedrate |
| g92 | H,J | Yes | — | Yes | 0 | RPI Feedrate |
| m00 | g | — | Yes | No | 0 | Program Stop |
| m01 | g | — | Yes | No | 0 | Optional Stop |
| m02 | g | — | Yes | No | 0 | End of Program |
| m03 | e | Yes | — | Yes | 0 | Spindle CW |
| m04 | e | Yes | — | Yes | 0 | Spindle CCW |
| m05 | e,g | — | Yes | Yes | 1 | Spindle Off |
| m07 | f | Yes | — | Yes | 0 | Coolant 2 On |
| m08 | f | Yes | — | Yes | 0 | Coolant 1 On |
| m09 | f | Yes | — | Yes | 1 | Coolant Off |
| m21 | k | Yes | — | No | 0 | x Axis Home Position |
| m22 | k | Yes | — | No | 0 | y Axis Home Position |
| m23 | k | Yes | — | No | 0 | z Axis Home Position |
| m24 | k | Yes | — | No | 0 | 4th Axis Home Position |
| m25 | k | Yes | — | No | 0 | 5th Axis Home Position |
| m30 | g | — | Yes | No | 0 | End of Tape |
| x | — | Yes | — | Yes | +00.00000 | x Absolute Position |
| y | — | Yes | — | Yes | +00.00000 | y Absolute Position |
| z | — | Yes | — | Yes | +00.00000 | z Absolute Position |
| b | — | Yes | — | Yes | +00.00000 | b Absolute Position |
| t | — | Yes | — | Yes | 00 | Tool Change |
| s | — | Yes | — | Yes | 0000 | Spindle Speed |
| f | — | Yes | — | Yes | 30.00 | Feedrate |
| FRO | — | Yes | — | Yes | 100% | Feedrate Override |
| a | — | Yes | — | Yes | 5 | Acceleration Ramp |
| d | — | Yes | — | Yes | 5 | Deceleration Ramp |
| | — | — | Yes | — | Selected | Cycle Off |
| | — | Yes | — | — | Not Selected | Cycle On |
| | — | — | — | — | Selected | Initialize |
| | — | — | — | Yes | Not Selected | Mirror Image |
| | — | — | — | Yes | Not Selected | DNC |
| | — | — | — | Yes | Not Selected | Block Delete |
| | — | — | — | Yes | Not Selected | Optional Stop |
| | — | — | — | — | — | Spindle Interlock |
| | — | — | — | — | — | Drive Interlock |
| | — | Yes | — | — | ASCII | Tape Code |

Zero synchronization is used to automatically drive the selected axis to a commanded position of the pick-off. This may be a fixed position as with the home position or may be a position defined by the operator. Feedback from the axes servos 120, 121, and 122 is provided thru signals 123 and 126. Because of the multiple uses for this zero synchronization routine, it is programmed as a subroutine that accepts a modifiable predefined position. Program execution speed is of little consequence so memory utilization is a primary consideration.

Continuous parts program execution can be discontinued with programmed stop (m00), optional stop (m01), end of program (m02), and end of tape (m30) commands. A programmed stop command (m00) will cause the data processor to enter a programmed stop condition. An optional stop command (m01) will cause the data processor to conditionally enter a programmed stop condition. The conditional aspect is based on whether the operator has selected the optional stop condition on the control panel 114. If this condition is met and after the completion of all commands in that block, the spindle and coolant will be turned off and the system will enter the cycle stop condition. The optional stop switch 283 is used to command the data processor 112 to alternately enable and disable the optional stop command (m01) in a parts program. Alternate depressions of the optional stop switch 283 will command the data processor 112 to alternately toggle the optional stop lamp 200 on and off. When the optional stop lamp 200 is illuminated, the optional stop parts program command (m01) will be executed as a programmed stop command. When the optional stop lamp 200 is extinguished, the optional stop parts program command (m01) will be ignored. An end of program command (m02) will cause the data processor 112 to enter a programmed stop condition. An end of tape command (m30) will cause the data processor 112 to enter a programmed stop condition.

Spindle commands are typical of various motion commands. Spindle commands consist of spindle speed, spindle direction, and spindle off commands. These commands are modal, where they need not be reprogrammed until a new condition is required. Spindle speed is programmed directly in rpm (Table V). All spindle speeds are accepted by the data processor regardless of the value. When a spindle speed can't be achieved due to speed range or discrete speed steps of the spindle control, the programmed speed is rounded-off by the data processor 112 to the speed that can be achieved immediately below the programmed speed.

Spindle clockwise (CW) and counterclockwise (CCW) directions are commanded with an m03 and an m04, respectively, to start the spindle rotating in the commanded direction at the beginning of the block to which they are programmed, therefore permitting the spindle direction change to be programmed in the same block with the motion commands that require this new spindle direction. Spindle off is commanded with an m05 to stop the spindle from rotating at the completion of the block in which it is programmed so this spindle off command can be programmed in a block containing the last motion commands that require spindle motion.

Rapid traverse is the maximum normal velocity that the data processor 112 will command. This velocity is a programmable parameter that is optimized for the machine characteristics, which is 200 IPM for typical machines. All machine motions can be commanded at rapid traverse velocity, including complex contours. Rapid traverse is commanded with a g07 command, which applies only to the block in which it is programmed. Because rapid traverse can be a potentially dangerous condition if inadvertently commanded by a tape reader error or other such condition, the g07 command provides a unique, unambigious rapid traverse command that is interlocked to insure safe operation. The last programmed feedrate parameter will be preserved by the data processor 112 and automatically reused after the rapid traverse command has been executed. If that last feedrate command had been IPR (g91) or RPI (g92), the rapid traverse command will automatically set the IPM condition for execution of that set of commands, then resume IPR or RPI operation after the rapid traverse command had been executed. If a g07 command and an f command are programmed in the same block, the rapid traverse velocity would apply to that block while the f command would be preserved for subsequent blocks. The data processor 112 insures that full synchronization will be preserved, independent of the velocities programmed and axis servo characteristics. Acceleration and deceleration are automatically performed by the data processor 112 for rapid traverse conditions to achieve maximum velocities without loss of synchronization. Because of the requirements for acceleration and deceleration, rapid traverse (g07) will not be commanded for distances less than one inch.

A program dwell can be commanded with a g04 command, which applies only to the block in which it is commanded and must be repeated in every block that requires a dwell. A dwell command must not be programmed in a block that contains motion commands, although that block can contain all commands but motion commands. Dwell is programmed directly in seconds and decimal parts of a second. The dwell magnitude has a range of 00.001 seconds thru 99.999 seconds. The magnitude is programmed with an X address, where X+05.01000 g04 commands a 5.01 second dwell and X+00.001 g04 commands a one millisecond dwell. The data processor 112 will accept this g04 dwell command, verify that it is a legitimate command, then perform the required time delay.

CNC operations may use the operator panel controls such as the selector switches and momentary switches. The control panel 114 permits convenient addition of switches. The lamp and numeric displays inform the operator of the system conditions. Position of the mode selector switch 240 in conjunction with the CNC condition lamp displays 218 define the response of the data processor 112 to operator commands. Panel operations will now be described.

Many switches on the panel 114 are interlocked to protect the system from erroneous or inadvertent operator commands, where the data processor 112 will obey those switch commands only when the cycle off lamp 271 is illuminated and the mode selector switch 240 is in the keyboard position 284. The jog switches 252 are interlocked, where the data processor 112 will obey those commands only when the cycle off lamp 271 is illuminated and the mode selector switch 240 is in the jog position. The cycle start switch 246 is interlocked, where the data processor 112 will obey that command only when the cycle off lamp 271 is illuminated. Several switches are not interlocked, where the system will obey those commands under all conditions of operation.

When the cycle start switch 246 is depressed, the following operations are performed by the data processor 112: the cycle off lamp 271 is tested as an interlock; the cycle off lamp 271 is extinguished; the cycle on lamp 213 is illuminated; the acceleration condition is set; the deceleration condition is set if not in the continuous mode; the initialize lamp 215 is extinguished, and the slide hold lamp 212 is extinguished if in the continuous or block modes.

When the cycle stop switch 256 is depressed, the following operations are performed by the data processor 112: the cycle on lamp 213 is tested as an interlock; the deceleration condition is set; the cycle stop lamp is illuminated; the slide hold lamp 212 is extinguished and the slide hold storage is cleared if in the continuous or block modes.

Mirror image switches 262 and 263 permit the operator to command the data processor 112 to selectively reverse the direction of all axes commands in the parts program. Jog commands are not reversed by the mirror image switches. The position readout displays reversed positions. In the index mode, the machine motion will be such as to drive to the actual floating zero point. In systems where offsets are provided, the offset directions will not be reversed. The mirror image switches 262 and 263 are interlocked, where the mirror image condition can only be changed with the mode selector switch 240 in the keyboard position 284, with the parameter selector switch 242 in an axis position 224, 225, 226 or 227 and with the cycle off lamp 271 illuminated. Under these conditions, the mirror image (axis reversal) condition can be changed by selecting the appropriate axis with the parameter selector switch 242, then toggling the axis reversal lamps 204, 205, 206, and 207 on or off with the mirror image switches 262 and 263. The mirror images switches 262, 263 alternately enable and disable the mirror image operation for each axis, selectively. Alternate depressions of the mirror image switch will alternately toggle the reversal lamp 204, 205, 206, or 207 corresponding to the selected axis on and off. When the reversal lamp 204, 205, 206, or 207 for an axis is extinguished, the parts program departure commands for that axis will be executed in the programmed direction. When the reversal lamp 204, 205, 206, or 207 for an axis is illuminated, the parts program departure commands for that axis will be executed in the reverse direction.

The EIA/ASCII tape code switch 287 is used to command the data processor to alternately select the format codes used for the input parts program. Alternate depressions of the EIA/ASCII switch 287 will alternately select the EIA lamp 208 and the ASCII lamp 209. When the EIA lamp 208 is illuminated, an EIA parts program code can be used. When the ASCII lamp 209 is illuminated, an ASCII parts program code can be used.

The emergency stop switch 258 is used to discontinue system operation under emergency conditions, overriding the data processor 112 and resetting the complete system to circumvent a system malfunction that might disable the normal system override controls. Following an emergency stop condition, the interrupted operation cannot be resumed. The initialize light 215 will be illuminated, identifying that the system must be initialized and operating conditions must be reestablished by the operator.

The initialize lamp 215 is used to alert the operator to the requirement to initialize the system. The initialize lamp 215 will be illuminated by the data processor 112 when any of several conditions occur, which include: power turn-on, line power drop-out, or emergency stop switch actuation. When the initialize lamp 215 is first illuminated, the system conditions are reset to the initial conditions by the data processor 112. The operator must extinguish the initialize lamp 215 prior to entering system commands so that he may be alerted if the commands are reset to the initial conditions by another initialize condition. The initialize lamp can be extinguished by placing the parameter selector switch 242 in any of the axis positions 224, 225, 226, or 227 with the mode selector switch 240 in the index position, then depressing the cycle start switch 246. If a line power drop-out or an emergency stop had caused the initialize lamp 215 to be illuminated, the interrupted operation cannot be resumed because the operating conditions are replaced with initial conditions. Therefore, it is necessary to re-initialize and again set-up for system operation.

The initial conditions discussed for system initialization are programmable parameters defined by the data processor. Many of these initial conditions are constants or fixed parameters as illustrated in Table V. In some cases, these initial conditions may be set to the last condition commanded during operation; stored by the data processor 112 to define the new value of this initial condition. Various fixed constants can be changed in the stored program when programming the data processor to customize the initial conditions for an application.

Block delete provides for the conditional deletion of a group of characters in a parts program. A block delete character (/) in conjunction with an operator selected block delete condition will cause the data processor 112 to disregard all of the characters inbetween the block delete character and end-of-block character. If the operator does not select the block delete condition, the data processor 112 will ignore the block delete character. Tape validity checks, including the parity check, are disabled for the deleted characters. Block delete codes can be provided at the beginning of a block of commands to delete all commands in that block or within a block of commands to selectively delete only those commands or portions of commands following the block delete character. When illegal characters are punched on a tape leader, the affects of these characters can be disabled by providing a block delete code at the beginning of the tape and selecting the block delete condition thru the control panel 114 before initiating automatic operation.

The block delete switch 285 is used to command the data processor 112 to alternately enable and disable the block delete command in a parts program. Alternate depressions of the block delete switch 285 will alternately toggle the block delete lamp 201 on and off. When the block delete lamp 201 is illuminated, the block delete parts program command will be executed. When the block delete lamp 201 is extinguished, the block delete parts program command will be ignored.

The slide hold (rapid stop) switch 260 permits the operator to command the data processor 112 to bring the machine axes to a rapid but controlled stop during a contour. The slide hold lamp 212 is illuminated to define this slide hold condition. Slide hold is disabled for threading contours because of the danger of tool breakage. The interrupted contour can be resumed by depressing the cycle start switch 246. The contour will continue and the slide hold lamp 212 will be extinguished. The slide hold condition can be exited by depressing the cycle stop switch 256, which will cause the slide hold lamp 212 to be extinguished. This will permit operation to be resumed, but the interrupted contour will not be completed.

When the slide hold switch 260 is depressed, the data processor 112 will illuminate the slide hold lamp 212, decelerate the machine to a stop, calculate the distance-to-go (DTG) parameters for all axes and for a circle, calculate the arc center parameters, then store the above mentioned parameters in the slide hold buffer storage. This sequence is interlocked with the data processor 112 so it can be commanded only under proper conditions. Also, the slide hold condition is interlocked to prevent slide hold operations when threading, as defined by the g33 command. If the contour is near completion and deceleration is in process when the slide hold switch 260 is depressed, the data processor 112 will set the cycle stop condition, where the slide hold condition will not be entered in favor of the cycle stop condition. When in the continuous mode and the contour is near completion but past the point at which deceleration can be commanded, the slide hold condition is temporarily disregarded but preserved until the next contour is started, at which time the slide hold command can be executed to cause proper deceleration. The slide hold buffer storage contains incremental (DTG) commands to permit restart from wherever the operator repositioned the machine when in the slide hold condition. Auxiliary commands such as $f$, $s$, $t$, $g$, and $m$ are preserved in active memory to permit these parameters to be changed by the operator thru the keyboard. The keyboard, jog, index, and search modes will operate independent of whether the slide hold lamp 212 is illuminated. The slide hold lamp 212 can't be extinguished and the slide hold buffer memory can't be modified in these modes. All command parameters can be modified in these modes including absolute position, with the exception of the commands in the slide hold buffer storage. When the slide hold lamp 212 is illuminated, the operator can exit the slide hold condition by depressing the cycle stop switch 256. This will extinguish the slide hold lamp 212, clear the slide hold buffer storage, and remain in the cycle stop condition. Continuation of the interrupted contour with a slide hold restart routine is initiated with the following conditions: the slide hold lamp 212 is illuminated, the mode selector switch 240 is in the block position 286 or continuous position 288, and the cycle start switch 246 is depressed by the operator. The data processor 112 will fetch the incremental DTG parameters (and, for a circle, the arc center parameters) from the slide hold buffer storage, clear the slide hold buffer storage, then post process these incremental parameters as if they were a new block of parts program commands. This insures that any keyboard changes such as feedrate will be executed for the continued contour. Depression of the cycle start switch 246 will command the data processor 112 to extinguish the slide hold lamp 212 and cycle off lamp 271 when in the continuous or block modes, illuminate the cycle on lamp 213, and set the acceleration command condition. Also, the cycle stop and deceleration conditions are set so the data processor 112 will decelerate to a stop.

Feedrate override permits the operator to command the data processor 112 to modify the programmed inch-per-minute (IPM) feedrate parameters in a parts program. It does not affect machine velocity of jog, rapid traverse, IPR feedrate, and RPI feedrate programming. Feedrate override is programmed directly in percent of programmed feedrate and will range from as low as 1% thru 150% or more, depending on the value selected for the particular machine, in 1% resolution steps. A feedrate override of 027 represents 27% of the programmed feedrate and 112 represents 112% of the programmed feedrate. The feedrate override parameter can never be greater than the maximum value for the particular machine (typically 150%). Feedrate override commands entered outside of this range will automatically be rounded off by the data processor 112 to the closest command within this range. The feedrate override is entered by the operator with the keyboard 244 through the panel 114 using the parameter switch 242 in the feedrate override position 239.

Feedrate programming will now be discussed, where direct feedrate programming provides significant advantages including simplified parts programming, simplified program checkout, and reduced tape length. Direct inch-per-minute (IPM) feedrate programming, inch-per-revolution (IPR), and pitch or direct revolutions-per-inch (RPI) programming are provided for turning equipment, with switchable IPM, IPR and RPI programming for applications such as machining centers. Direct feedrate programming provides precise control of machine velocity without tedious programmer calculations. It simplifies parts programming, provides better machine performance, and reduces parts program length. Feedrate commands are modal, where the feedrate command applies to the block in which it is programmed and to all subsequent blocks until a new feedrate parameter is commanded. Therefore, a feedrate command should be programmed in or before the first block that contains a contour command, but need not be programmed again until a different feedrate command is required. This results in elimination of redundent calculations and a significant reduction in tape length.

Prior art non-computerized systems provide feedrate number (FRN) or V/D feedrate programming. This method requires that feedrate be modified from the machine-oriented IPM units to the hard-wired control oriented 1/seconds set of units. This conversion involves a complex computation to compensate for the difficulty that prior art non-computerized systems have in computing velocities. The computation requires division of the direct feedrate parameter by a vector distance, which is defined by:

$$\sqrt{(x^2 + y^2 + z^2 + \ldots)}.$$

In systems that use the feedrate number method, the direct feedrate parameter must be modified by the contour dimensions, where the resultant FRN parameter is different for each block of parts program commands even though the velocity remains constant. Therefore, parts programmers must perform the calculation for each block of commands. Parts program length is significantly increased by the redundant $f$ commands in each block.

Computational capability of the CNC system of this invention provides relief for parts programmer by eliminating tedious operations, while enhancing overall system operation. Feedrate parameters are commanded directly in IPM, RPL, or IPR; which are units directly associated with cutting operations. These units are modal and independent of the contour dimensions, permitting the required velocity to be programmed once, where it need never be reprogrammed until a change in velocity is required. In addition, rapid traverse and acceleration/deceleration preserves the programmed velocity parameters to minimize redundant programming. Simplification in parts programming is enhanced by the simplification in program checkout. Repeated FRN parameters that are always changing are a common source of program problems. Elimination of these problems results in rapid and economical changeover for new production runs with new parts programs. Also, reduction in program size results in a proportional decrease in punched tape length. This simplifies tape handling considerations, reduces tape reader maintenance, and decreases the possibility of a tape reader error. Short blocks of tape commands also reduce the requirements for buffer memory and enhance the internal parts program storage CNC feature.

Coordinate resolution will now be discussed, where resolution of parts program commands is performed to adjust contour commands for special purposes; including scaling, axis alignment, inch/metric conversion and others. In order to preclude the accumulation of errors such as due to digital computation roundoff errors, a special resolution algorithm is used. This algorithm resolves absolute position parameters and stores both the unresolved and the resolved absolute position parameters for the required computations. The data processor 112 loads parts program contour commands from the tape reader 116 or other sources and processes these commands, as defined by the mode of operation commanded. The data processor converts incremental commands to absolute commands by adding the incremental parameter to the appropriate prior absolute position parameter, then processes these absolute coordinate commands as required. These absolute commands may be resolved such as for axis alignment and scaling, converted such as for English or metric unit conversion, or otherwise processed. After resolving parameters in absolute coordinates, the resolved incremental coordinates may be obtained for the contour computations by substracting the new resolved absolute coordinates from the corresponding old resolved absolute coordinates.

Figure 3B:
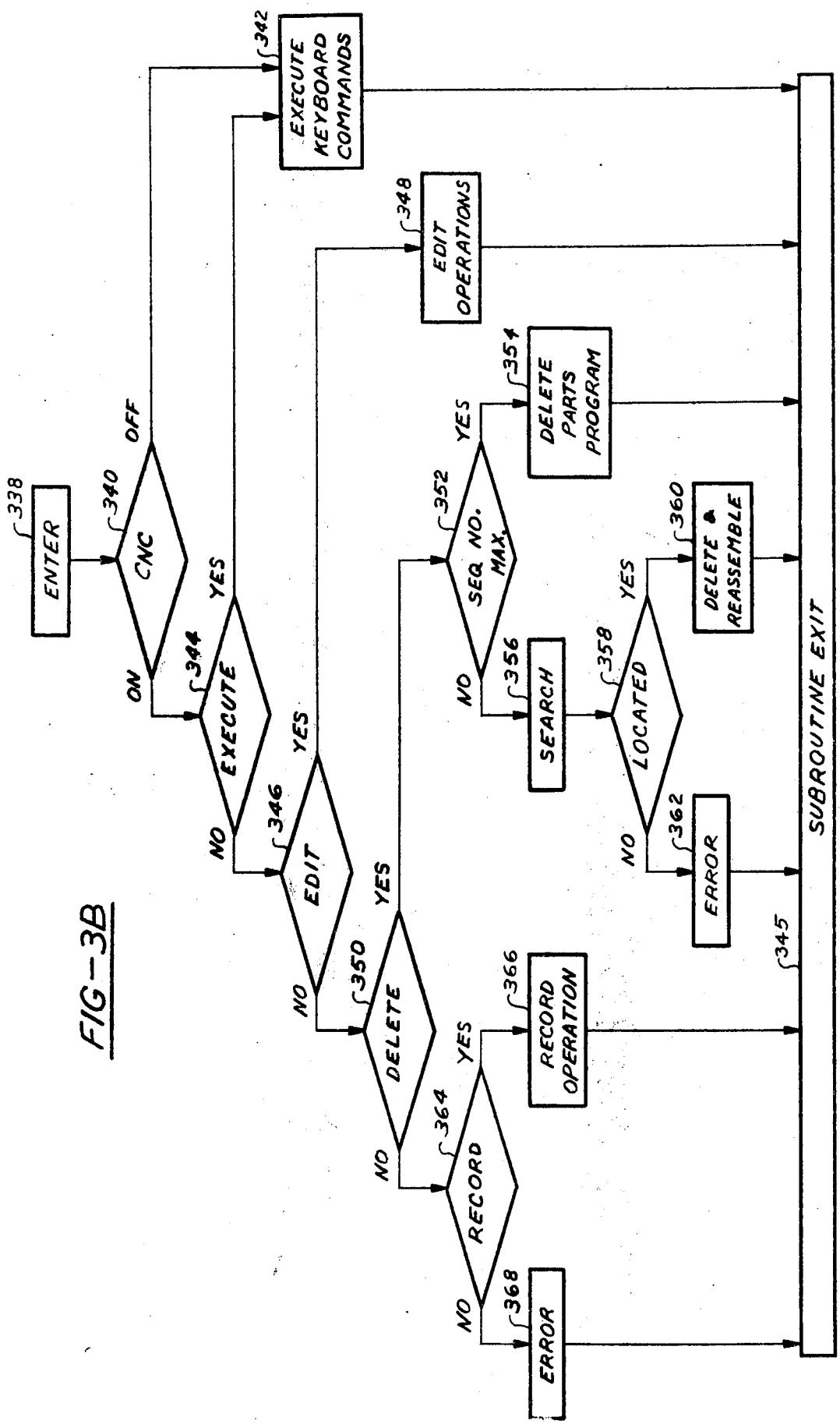
FIG. 3 is a flow diagram representation of system operations comprising FIGS. 3A-3G showing flow diagrams of various system operations.
Figure 3G:
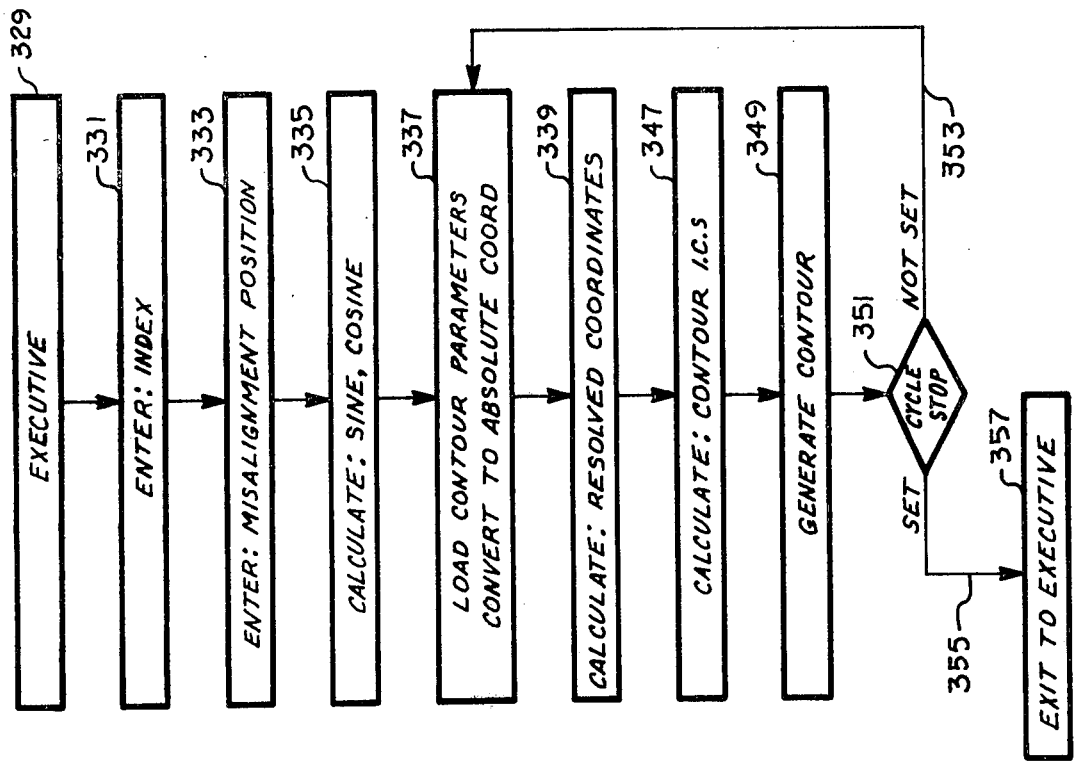
Figure 3F:
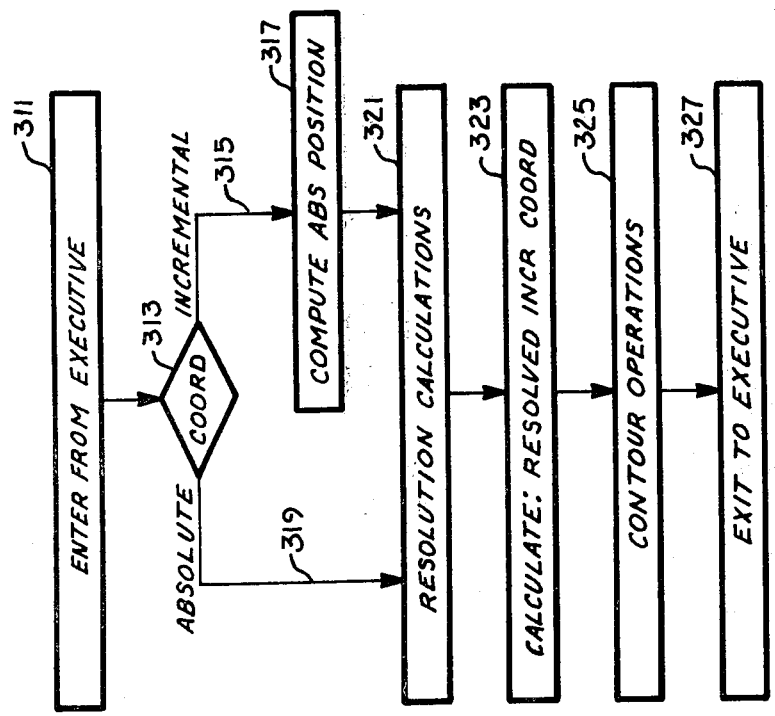

A program flow diagram for the resolution algorithm is illustrated in FIG. 3F, where the data processor enters the subroutine from the executive routine 311 and checks the dimensional commands in operation 313. If an incremental parameter is detected, the data processor branches along path 315 to operation 317, where the equivalent absolute position parameter is derived. If an absolute parameter is detected, the data processor branches along path 319 bypassing operation 317. The data processor next performs the resolution calculations in operation 321 to obtain the resolved absolute parameters and, if required, calculates the resolved incremental parameters in operation 323. The data processor performs the required contour operations in operation 325, then exits to the executive routine in operation 327.

The resolution operation is implemented by multiplying all translational departure and feedrate commands by the various resolution parameters. The resolution or absolute coordinate transform calculation is used for translational departure commands, but not necessarily for IPM feedrate commands which do not contribute to error accumulation. Other dimensional conversions such as axis alignment and cutter compensation are included in a composite absolute coordinate transform. The various resolution parameters are multiplied together to form a composite scale factor, which need not be recalculated until one of those resolution parameters are changed. The numerical scale factor is preserved for display purposes. Only translational departure commands and feedrate commands are resolved. Rotary departure commands (rotary axes) are not resolved. Feedrate commands are resolved to insure that IPR and RPI programming provides pitch units commensurate with the departure units. The IPM programming is resolved for compatibility.

Conversion between English units and metric units is simplified with the metric unit conversion feature, where inputs and outputs can be in either unit system or a mixture of both unit systems. Parts programs are accepted in either system of units, thereby permitting the programmer to code directly from a blueprint, independent of the dimension units. English or metric units are defined with the g25 or g26 commands to permit programming flexibility. In addition, the control panel English/metric switch 289 and the English units and metric units lamps 210 and 211 permit manual control of units. This capability simplifies parts programming by eliminating the need to redimension drawings for different unit systems. Numeric readouts and manual data inputs are provided in either set of units by switch selection, independent of the units used by the parts programmer. This capability simplifies system operation, where the operator can work in units convenient for the particular job. Machine conversion for metric units is not necessary, where the lead screw pitch can be in metric or English units without restricting the parts programmer or operator.

Scaling can be used to proportionately increase or decrease the dimensions of contours such as to change the size of parts, adaptively adjust for thermal dimensional variations, provide mating oversized and undersized parts, roughing a part with a finish cut parts program, model scaling such as with digitizing or tracing an oversized model, and other such applications. Scale factors can be obtained with operator inputs through the panel keyboard 244, as generally described in the referenced application Ser. No. 101,881; from external inputs such as temperature sensors; from parts program commands; and from other sources that will become obvious to those knowledgeable in the art. In one embodiment, the scale factors apply to all translational departures and all feedrate commands. Rotary displacements are not affected by scale factors. Verification of the numerical scale factor can be accomplished by positioning the parameter selector switch 242 to the scale factor position 221 and observing the numeric displays. Modification of the numerical scale factor is accomplished by positioning the mode selector switch 240 to the keyboard position 284 and positioning the parameter selector switch 242 to the scale factor position 221 as an interlock against inadvertent modification. Modification of the numerical scale factor is accomplished thru the keyboard 244 as described for other keyboard entry parameters. Selection of the metric/English scale factor is accomplished by depressing the metric/English switch 289 to toggle the metric lamp 211 and English lamp 210 to change the commanded condition. The numerical scale factor and the metric/English scale factor can be changed together or independently. It is recommended that the floating zero point be redefined with the g27 command when a scale factor change is made to insure that the floating zero reference point is defined in the proper system of units. Application of the scale factor to the feedrate parameters insures consistancy in units, particularly with inches-per-revolution (IPR) and revolutions-per-inch (RPI) programming. IPR and RPI define the pitch of the cut, which is automatically converted to the system of units selected. Scale factors may be stored in the data processor core memory to be preserved for conditions such as power drop-out.

For a typical numerical control application, the workpiece is mounted on the machine bed where the bed is driven with the servos 120, 121, and 122 to move the workpiece. Parts program commands are used to drive the bed under the assumption that the workpiece is aligned with the bed. If the workpiece is misaligned, incorrect motion will result. The misalignment angle may be very small but still significant; where a one degree angular misalignment can introduce a cut error of approximately two tenths inches over a one foot workpiece. Therefore, a very small angular misalignment can introduce very large errors when compared to the 0.0001 inch resolution of the numerical control system. Workpiece setup is often a laborous operation, requiring precise positioning of the workpiece by a skilled operator. Optical and mechanical techniques are used to aid the operator, while expensive set up jigs and fixtures are frequently used. In addition, pre-calibrating of the workpiece is often required for reference surfaces. Axis alignment virtually eliminates laborous setup, expensive jigs and fixtures, precalibrating, and reduces the operator skill requirement. The data processor 112 computationally aligns the workpiece by resolving the parts program commands, which are in bed coordinates, into workpiece coordinates. The workpiece setup sequence permits the operator to place the workpiece on the bed in an arbitrary orientation, then "shoot in" the reference points for the usual floating zero definition. The data processor 112 derives the misalignment angle from this standard operation and computationally aligns the workpiece as parts program commands are executed. The program flow diagram is shown in FIG. 3G. For the misalignment definition, the operator defines the floating zero point (0,0) with the index control in operation 331, then repositions the machine to a second co-ordinate point and depresses the enter misalignment switch 295, which enters these coordinates $X_R$, $X_R$ in operation 333. These coordinates are used to calculate the sine and cosine of the misalignment angle in operation 335. These sine and cosine terms are then used to resolve the misaligned contour through the misalignment angle to obtain the computationally aligned contour. The data processor next loads a set of contour parameters in operation 337, converts them to absolute coordinates if necessary, then resolves these contours with well known mathematical coordinate rotation techniques such as:

$$X_R = X\cos\theta + Y\sin\theta$$

$$Y_R = X\sin\theta - Y\cos\theta$$

in operation 339. The data processor derives the contour initial conditions in operation 347 and generates the contour in operation 349. The cycle stop condition is tested in operation 351. If the cycle stop condition is not set, the data processor loops back along path 353 to obtain the next set of parts program commands. If the cycle stop condition is set, the data processor exits to the executive routine 357 along path 355.

An improvement for parts program dimensioning will now be described. Dimensioning of drawings typically follows classical drafting procedures, based upon drafting convenience and manual machining requirements, bearing little resemblance to techniques required for prior art numerical control systems. The system of this invention permits tailoring to the classical drafting procedures, so the parts programmer can dimension the program as the drawing or part description was dimensioned.

Drawings are often dimensioned from several reference points for drafting convenience. Parts programmers usually recalculate dimensions to convert between the various dimensioning techniques. With the system of this invention, the operator can program with any dimensioning scheme, incremental or absolute coordinates, and from any reference point merely be selecting the coordinates with a g command. He can redefine the floating zero point from the parts program to permit programming in absolute coordinates that are referenced to different points. The offset feature permits floating zero redefinition without requiring the programmer to physically reposition the machine to the new point, permitting zero points be defined that are physically inaccessible due to workpiece interferences or that are located off the workpiece or off the machine, such as on a skin mill or flame cutter where the datum point may be located at a remote reference point on the aircraft or ship. The ability to program both absolute and incremental dimensions on the same system gives the parts programmer another degree of freedom. In addition, the ability is provided to mix absolute and incremental dimensions in the same block of tape commands and to select the dimensioning scheme for each axis with g commands so the parts programmer can code directly from a drawing, selectively changing between incremental and absolute dimensions for each axis according to the dimensioning on the drawing.

The floating zero point represents the zero absolute position coordinate for all absolute position commands and for display parameters. When the system is initialized, the absolute position parameters for all axes are set to zero, thereby defining this initial machine position as the floating zero point. The floating zero point can be redefined by the parts programmer at any time in the parts program. The machine absolute position can be defined as the floating zero point or as an offset from the floating zero point. Programming of a g27 will cause the absolute zero point to be defined by the departures contained in that block relative to the machine absolute position. Axis departures that are not programmed in that block cause the floating zero point to remain unchanged relative to that axis position. If a zero axis departure is programmed, that axis position is defined to be offset from the floating zero coordinate by the magnitude of the programmed departure. A parts program block of commands such as g27xyzb defines that the present machine position is the floating zero point for all axes. A parts program block of commands such as g27x-02 defines that the present machine position is offset from the floating zero coordinate by −2 inches in the x axis, but the relation to the floating zero coordinates for the other axes remain unchanged.

Departures for linear contours can be programmed in absolute coordinates, incremental coordinates, or a combination of absolute and incremental coordinates at the same time. Auxiliary (g) commands are used to command the data processor to select the coordinate system, selectable on an individual axis basis. The auxiliary command assignments are: all axes absolute, g50; all axes incremental, g51; x axis incremental, g52; y axis incremental, g53; z axis incremental, g54; and b axis incremental, g55. These coordinate commands are modal, where the coordinate selection is applicable to the block in which it is programmed and to all subsequent blocks until changed. Circular contours, defined by g02 and g03 commands, are automatically programmed in incremental coordinates commensurate with the previously referenced EIA Standards. If a circular contour is programmed for an axis operating in absolute coordinates, the circular contour parameters are automatically treated as incremental coordinates. Absolute coordinate selection for the linear contours will be preserved and do not have to be redefined as absolute coordinates following the circular contour. Selection of all axes to be programmed in absolute coordinates is commanded with a g50. Absolute coordinate linear contours are programmed with the contour end point coordinates relative to the floating zero point. Selection of all axes to be programmed in incremental coordinates is commanded with a g51. Incremental coordinate linear contours are programmed with the contour end point coordinates relative to the initial position of the machine at the beginning of the contour. Selection of an axis to be programmed in incremental coordinates when it has previously been programmed in absolute coordinates requires the corresponding axis incremental g command, such as a g52 for the x axis. Selection of an axis to be programmed in absolute coordinates when it has previously been programmed in incremental coordinates requires a g50 command to set that axis (together with all other axes) to absolute coordinate programming. It is then necessary to selectively reset the axes that have been programmed and are to remain in incremental coordinates with the corresponding axis incremental g commands, such as a g52 for the x axis.

Ability to program many g commands in a single block is provided to simplify coordinate selection, where various combinations of incremental and absolute coordinate programming can be selected with a single block, independent of the quantity of g commands required. Absolute and incremental coordinates can be changed throughout the parts program without loss of position because the data processor 112 keeps track of the command absolute position of all axes including those selected for incremental coordinates. Therefore, selecting absolute coordinates for a previously incremental coordinate axis in the middle of the program is acceptable, where the command absolute coordinate positions for all axes are continuously updated.

A variable block format is used for parts program inputs, where an axis that is not programmed in a block will hold position independent of the coordinate system selected. A fixed block format is used for the keyboard input, requiring all commands to be programmed. For the keyboard input, if an axis is in absolute coordinates and is to hold position, the displayed absolute position does not have to be changed. For the keyboard input, if an axis is in incremental coordinates and is to hold position, a zero position incremental command must be input and displayed.

It is often desirable to access various parameters automatically, such as from the parts program. A parameter table is contained in memory and accessed by the data processor 112 as commanded. The parameters in the table may be offsets, compensation parameters, or other parameters.

A table of parameters can be loaded through the tape reader 116 using a parameter tape containing a g command, such as G70, to identify a parameter tape. A series of parameters are contained on the tape with the format:

g70
$PA_1A_2A_3A_4, B_1B_2B_3B_4B_5B_6$
$PA_1A_2A_3A_4, B_1B_2B_3B_4B_5B_6$
EOB where the P character defines a new parameter, the A characters define the particular parameter address in the table of parameters to be modified, the comma separates the address characters from the parameter characters, and the B characters define the parameter to be loaded into the selected table address. A parameter table can also be loaded with the control panel 114, as will be described hereafter for offsets, or with other sources that will become obvious to those skilled in the art.

Individual parameters are stored in a "table" in memory such as the main memory 130 of the data processor 112. This memory in one embodiment is an electrically alterable and non-volatile core memory, so the parameters can be easily modified and are preserved even under conditions such as power turn-off or power dropout. Parameters may include offsets, history, tool life, and can include radius and other such position oriented parameters. These parameters can be verified with the numeric displays and modified with the keyboard. Offsets are usually provided for turning and photo machines that have a turret. Radii such as for cutter compensation are usually provided for milling machines, grinding machines, and flame cutting machines. Other selectable parameters can be provided as will become obvious to those skilled in the art.

Operation will be discussed with reference to tool offsets for a lathe machine but this capability is intended to include all means and methods for processing multiple parameters for control of a machine as generally described herein. Tool history and tool life provide a degree of management reporting capability to aid in efficient system utilization. Tool offsets are accessed automatically with a t parts program command, where the machine is driven an amount equal to the algebraic difference between the old and the new tool offsets. The command absolute position is not updated for this motion, effectively offsetting the floating zero point to normalize the difference in tool positions. The tool history parameter for a specific tool is incremented each time the turret position for that tool is commanded, maintaining a historical record of the number of operations each tool has experienced. This capability is particularly useful for preventative maintenance, where it identifies the tool useage which can then be related to tool wear for tool replacement. During workpiece setup, tool history parameters are checked to insure that the number of cycles on each tool is below the replacement number. The tool life parameter for each tool is automatically compared with the tool history parameter. Whenever the tool history parameter is equal-to or greater-than the tool life parameter, the tool replacement lamp 219 is illuminated and continuously flashed. When the tool replacement lamp 219 is flashing, the operator waits for a convenient time to change tools, such as the completion of the workpiece, then identifies and replaces the worn tool or tools. Identification is accomplished by displaying the tool history and tool life parameters for all tools and replacing the tools where the tool life parameter is equal-to or less-than the tool history parameter.

Tool parameters are verified and modified by positioning the parameter selector switch 242 to the tool position 222, positioning the mode selector switch 240 to the keyboard position 284, then sequencing thru the tool parameter table with the enter or op switch 254. Each time the op switch 254 is depressed, the next tool parameter in sequence is displayed. If a tool parameter is to be modified; that tool parameter should be accessed as described above, then cleared with the clear switch 250 and entered with the keyboard 244 switches to define the new tool parameter. Whenever a tool is changed, the tool offset parameters for that tool are redefined and that the tool history parameter is either zero set for a new tool or preset to a utilization quantity for a used tool. The tool parameter displayed is identified with the tool number in the most-significant-digit (left hand digit) and the parameter identification in the second-most-significant-digit. The tool number will range from 0 thru 9 for up to ten sets of tool parameters. The tool parameter will range from the axes offsets (x, y, z and b) thru the tool history and the tool life (h and l) parameters. The tool parameters are accessed in a sequence such as 0x, 0y, 0z, 0b, 0h, 0l, 1x, 1y, 1z, 1b, 1h, 1l, 2x, . . .9x, 9y, 9z, 9b, 9h, 9l, 0x, 0y . . . for a four axes system with tool history and tool life parameters. Various types of parameters can be added or deleted as required by the application. Tool quantity can be increased from 10 to 100 merely by adding another tool identification character for the range of 00 through 99 tools. Also, selections other than for tools can be accomodated using the means and methods described above.

In one embodiment, ten turret position selection codes may be provided in conjunction with ten x-z offset pair selection codes. Any one of ten offset pairs may be selected for any turret position; where a t command first executes the turret position command, then automatically executes the offset commands. The machine may not have ten turret positions, where only the actual turret positions provided with the machine are commanded with the parts program; but ten offsets pairs may be used for each turret position independent of the number of turret positions available. Timing and sequencing associated with turret repositioning is performed automatically with the data processor 112. The t command initiates a data processor canned cycle to reposition the turret, with time delays and interlocks that insure proper operation. Therefore, a *t* command can be programmed without the need for a dwell or other such command. The *t* command has a *t*2 format, where the least significant character defines the offset pair and the most significant character defines the turret position. For example, a *t*25 command selects offset pair 5 to be used in conjunction with turret position 2. A *t* command may be programmed in a block with other commands, including *s* commands and machine motion commands. The *t* command will be executed after the execution of the *s* command but prior to the execution of all motion commands.

Incorporation of a form of post processor in the data processor program permits a degree of tape interchangeability previously not available. This capability permits the system to emulate (operate in a manner similar to) a prior art non-computerized system for full tape interchangeability. Shop logistic considerations are enhanced with the ability to accept the tape input formats of other controls. This feature permits use of common tape preparation programs, post processor programs, and use of the store of old tapes. The user can benefit from the special capabilities available with this system without obsoleting old punched tape programs and eliminating the need to retrain parts programmers, but still permitting use of the proven tape preparation computer programs.

The automatic generation of standard shapes using a simple programming language is performed to reduce the parts programming requirements placed on the user. Standard shapes are selected with *g* commands from the punched tape for automatic operation and from the keyboard for semiautomatic operation. Approximately 20 standard shapes are implemented in the basic system and stored in the core memory. Addition of another memory such as a parts program memory permits hundreds of shapes to be incorporated, to be used as an extensive library of shapes for programming use.

Additional capability permits the parts programmer to program fixed cycle subroutines such as identified with sequence numbers and loaded into a memory, which may be a parts program memory, using a stored parts program arrangement as described herein. These programmable fixed cycle subroutines can be accessed by the parts program with various commands. The data processor 112 will execute a parts program containing programmable fixed cycle commands, transfer control to the fixed cycle subroutine memory when a fixed cycle command is executed, execute the fixed cycle subroutine, then return to the parts program for the next block of commands. Higher levels of parts program subroutining can also be provided. Unconditional Transfer commands can be defined such as N050g48N752, where the g48 command contained in block 50(N050) will transfer parts program operations to the block 752 subroutine and will save the return address, which is block 51. Indirect Transfer commands can be defined such as N758g49, where the g49 command contained in block 758 (the last block in the previously described subroutine) will transfer parts program operations to the block 51, previously stored as the return address. Multilevel parts program subroutine capability can be provided such as with a push down list or other techniques well known in the computer art.

Control of machine acceleration and deceleration will now be discussed. Acceleration and deceleration operations for machine motion are provided in response to parts program commands, and are also provided automatically and adaptively when conditions warrant acceleration or deceleration operations. The data processor 112 modifies the contour calculations to change the real time interpolation commands 123 to the servos 120, 121, and 122 to provide acceleration and deceleration control signals to the machine 124. The machine 124 responds to these acceleration and deceleration control signals 120, 121, and 122 to gradually accelerate or decelerate the machine 124 to the required velocity as commanded by the data processor command signals.

Programmable acceleration and deceleration capability is provided for Continuous mode operation where continuity of the contour is required at the parts programmers option. Acceleration can be commanded with a g08 command and deceleration can be commanded with a g09 command. These commands apply only to the block in which they are programmed. A block of commands can contain either a g08, a g09, both or neither of these commands.

Automatic acceleration and deceleration is provided for all conditions that continuity of the contour is not required such as when the axes motions are initially at rest, come to a stop, or for rapid traverse conditions which are not used for cutting metal. Acceleration and deceleration will be commanded automatically for motion in the keyboard, jog, block, and index modes and for rapid traverse (g07), in the continuous mode. In addition, automatic acceleration will be commanded for all axes motions initiated with the cycle start switch 246 and automatic deceleration will be commanded for all axes motions terminated with the cycle stop switch 256, slide hold switch 260, and programmed stop conditions such as m00, m01, m02, and m30. Automatic acceleration and deceleration capability eliminates problems such as operation in the block mode with a parts program written for the continuous mode. An example is at the transition from one high speed contour to a second high speed contour in approximately the same direction, where acceleration and deceleration are not required for the continuous mode because the change in the velocity from the first contour to the second contour is slight, but are required for the block mode because the change in the velocity from the first contour to a stop condition is significant. Operations are determined by the data processor 112 to identify the conditions where machine motion will start from rest or will end at rest. The acceleration and deceleration commands are automatically executed by the data processor 112 under these conditions to insure that smooth transitions are provided.

Adaptive acceleration and deceleration is provided, where the data processor 112 provides a "look ahead" capability to calculate the velocity of each axis for sequential blocks of commands. The data processor 112 then defines the acceleration or deceleration operations required to make a smooth motion transition from one block of commanded motion to the next block of commanded motion. The data processor 112 adaptively provides the required real time interpolation commands 123 to the servos 120, 121, and 122 to provide smooth transitions from one machine motion to the next machine motion.

Programmable acceleration and deceleration ramps are provided to permit the parts programmer to control the ramp slope to optimize machine operations. For example, acceleration into a workpiece might be more gradual than deceleration out of a workpiece. Also, rapid ramps would be commanded for rough cuts and gradual ramps would be commanded for finish cuts. The parts program address a is used to set the acceleration ramp and the address d is used to set the deceleration ramp. The numeric characters following these addresses are used to define the ramp slope. The data processor 112 accesses the a and d parameters when required and adapts the contour calculations to control the change in machine velocity.

Programming for rotary axes will now be described. Rotary axes have the same scaling and operating characteristics as a linear axes. Standard resolver gearing for rotary axes is 10 degrees of table rotation for one resolver rotation or a 36:1 gear ratio. Therefore, the servo resolution for rotary axes is 0.005 degrees corresponding to 0.000050 inches for linear axes. This scaling has no special program scaling requirement for linear and rotary axes, except that the decimal point on the numeric display is different. The parts programmer can command a departure as high as 9999.995 degrees yet not require special contour considerations beyond that of a linear contour with a 99.99995 inch departure. The stored program does not have to discriminate between linear and rotary axes. Feedrate calculations consider only linear axes departures to define velocity, then synchronize the rotary axes to the linear axes for slope commands. As an example, a part program block with $x$, $y$, and $b$ departures has a vector feedrate based upon: $\sqrt{x^2 + y^2}$ but a slope based upon $x$, $y$, and $b$. Feedrate values for the rotary and linear axes correspond, where a part program block containing: $x$ + 00.70700 inches, $y$ + 00.70700 inches, $b$ + 0100.000 degrees, and $f$ 01.0IPM will provide 0.707 IPM $x$ axis velocity, 0.707 IPM $y$ axis velocity, 1 IPM, $x$-$y$ axes vector velocity, and 100° per minute $b$ axis velocity. This relates to 100° per minute/inch per minute for rotary axis feedrate scaling. Incremental and absolute coordinate programming is equally applicable to linear and rotary axes without special considerations. Mirror image axis reversal is equally applicable to linear and rotary axis without special considerations. Absolute position data for rotary axes must be modulo 360° for display and storage, although ±9999.995 degree departures are permissable, accomplished with the data processor by subtracting (or, for a negative absolute position, adding) 360° (binary) from the new absolute position successively until the absolute position is less than 360° absolute magnitude.

Many terms well known in the numerical control art are used in this description and claims. These terms are generally defined in the prior art literature and in the numerical control industry standards. The meaning of numerical control terms is intended to be as used in this specification and, if not fully defined in this specification, then as further defined in those referenced EIA Standards and, if not fully defined in those EIA Standards, then as commonly used in the numerical control field.

The versatility of the control panel 114 and display panel 118 are presented in the previously referenced applications; Data Processing System and Interactive Control System. This versatility permits the lamp displays 218, the momentary switches, and the selector switches to be assigned various functions, as described below.

The momentary switches may be assigned various operations such as Optional Stop 283, Block Delete 285, EIA and ASCII Codes 287, English and Metric Units 289, CNC Source Select 280, CNC Mode 282, Mirror Image 262, Mirror Image 263, Jog 252, Emergency Stop 258, Rapid Stop or Slide Hold 260, Cycle Start 246, Cycle Stop 256, Enter 254, Clear 250, and various spares 291 and 295. These switch assignments can be changed and the execution can be defined under data processor program control.

The lamp displays may be assigned various functions such as Power On 234, Error 236, CNC 270, Execute 272, Edit 274, Delete 276, Record 278, Optional Stop 200, Block Delete 201, Spindle CW 202, Spindle CCW 203, X Reverse 204, Y Reverse 205, Z Reverse 206, B Reverse 207, EIA Code 208, ASCII Code 209, English Units 210, Metric Units 211, Slide Hold 212, Cycle On 213, Cycle Off 271, and various spares 215, 216, 217, and 219. These lamp display assignments can be changed and the execution can be defined under data processor program control.

The selector switch such as the Parameter selector switch 242, can be assigned various functions. For a Milling machine the assignments can be X Axis 227, Y Axis 226, Z Axis 225, B Axis 224, Sequence Number 223, Spindle Speed 222, I Arc Center 228, J Arc Center 229, K Arc Center 230, M Command 231, G Command 298, Feedrate 237, Feedrate Override 239, Cutter Compensation 243, and spare 221. For a lathe the assignments can be X Axis 227, Z Axis 226, Sequence Number 225, Spindle Speed 224, Turret Select 223, Tool Offsets 222, I Arc Center 228, K Arc Center 229, M Command 230, G Command 231, Feedrate 298, Feedrate Override 237, and spares 221, 239, and 243. These selector switch assignments can be changed and the execution can be defined under data processor program control.

The parts program formats for commanding numerical control systems have been standardized by the Electronic Industries Association. A typical standard is EIA Standard RS-274-B; Interchangeable Perforated Tape Variable Block Format for Contouring and Contouring/Positioning Numerically Controlled Machines; published by the Electronic Industries Association: where this standard and the references contained therein are incorporated by reference herein.

A parts program is intended to mean a program that describes a sequence of machine operations to generate a part; wherein the parts program comprises a sequential set of blocks of commands, where each block contains one or more commands for the numerical control system in a control oriented language. This language is usually comprised of a word address format as described in the previously referenced EIA Standard RS-274, but may be another such control oriented language. This control oriented language is intended to be contrasted to a compiler oriented language such as the APT language which requires a generalized input to a large scale computer but is not acceptable by a typical numerical control system.

A parts program is composed of a sequence of blocks of commands, where each block defines an operation such as a single contour and the associated commands required to implement that operation. Each block is composed of a group of words, while the words are composed of a group of characters. Each character is composed of a binary code. A parts program may be a complete program for cutting a part or may be a portion of a complete program for cutting a part. For example, a parts program stored in the parts program memory can be a portion of the operations required to generate the part, particularly if the total set of parts programs to generate the part will not fit into the storage provided. Therefore the term parts program is intended to mean a large number of blocks of commands, but not necessarily the complete set of blocks required to cut the part.

Although the preferred embodiment of this invention accepts parts programs in EIA Standard form with EIA tape codes, words, and blocks; it will become obvious to those skilled in the art that other forms of numerical control commands can be provided. Greater levels of freedom in defining these numerical control commands are available with the hierarchy of computer systems described herein. Therefore; although this invention is described relative to EIA Standard parts programs, it is intended that this invention include all languages directly acceptable by a numerical control system to control the associated machine.

The term computer as used herein is intended to mean a stored program digital data processor.

CNC Command Arrangement

The CNC system 110 will now be discussed using the tape reader 116 to provide CNC commands and to enter parts programs. It will become obvious that CNC commands can be provided from various other devices such as from a panel 114, a typewriter 156, a data link 128 or from other sources of CNC commands. CNC commands can be entered with the tape reader 116 using letters, numbers, and control characters punched on a tape with a tape punch 154 such as a Frieden Flexowriter or a Teletype Model ASR-33 which are well known in the art. The operator starts operations by locating the CNC command tape in the tape reader 116, positioning the Mode selector switch 240 to the Continuous position 288, and depressing the Cycle Start switch 246. The data processor 112 detects this switch condition and controls the tape reader 116 to read the CNC tape command. The first command on the CNC command tape should be an Enter CNC command defined with the characters D01, which will cause the data processor 112 to enter the CNC command. The last command on the CNC command tape should be an Exit CNC command defined with the characters D02, which will cause the data processor 112 to exit the CNC condition. Various CNC Modes can be commanded with CNC tape commands D03 through D89. For example, D03 will command CNC Edit, D04 will command CNC Record, D05 will command CNC Execute, D06 will command CNC Deletion of the selected block in the parts program memory, D07 will command CNC Deletion of the complete parts program stored in the parts program memory, and D09 through D89 will command various other CNC operations that will become obvious to those skilled in the art.

The operation of these CNC modes will be described in detail hereafter in conjunction with the control panel alternate source of CNC commands. The execution of these CNC commands may be substantially independent of the source of these CNC commands. The primary differences may be related to the operation of the CNC command means. For example, a CNC command from the tape reader 116 is in a different form than a CNC command from the panels 114 and 118; but the execution of this command by the data processor 112 may be substantially the same for both command means. The data processor 112 accepts commands in various forms and executes these commands as defined by the stored program.

Selection of the source of parts program commands is made with CNC tape commands D90 through D99; where D90 will select the tape reader 116, D91 will select the data link 150, D92 will select the typewriter 156, and D93 through D99 will select various other sources of parts programs. Following a parts program selection command, the operator will set up the system such as locating the parts program tape in the tape reader 116, then depress the Cycle Start switch 246 to initiate loading of the parts program.

From the description of the panel operation herein; it will become obvious that the CNC commands just described for a tape reader input can also be provided with the operator panel input command devices.

Additional CNC capability can be provided with the tape reader 116 or other device such as the Teletype model ASR-33, where the data processor 112 accepts these commands and executes these commands as described below.

A CNC command to record or output data can be defined by: R $F_1F_2F_3F_4$, $L_1L_2L_3L_4$ A where the letter R defines a record or output command, the four F characters define the sequence number of the first block to be output, the four L characters define the the sequence number of the last block to be output, and the A character defines an ASCII output code. If the A character were replaced by an E character, then an EIA output code would be used. If the A character were replaced by a B character, then a simple binary code would be used. The data processor 112 outputs the selected portion of the parts program in the format and code defined by this CNC command and to the channel selected. That channel could be connected to a tape punch 154, a typewriter 156, a CRT 158, a data link 150, or other output devices through the auxiliary I/O channels 128.

A CNC command to check data can be defined by: C $F_1F_2F_3F_4$, $L_1L_2L_3L_4$ A; where the letter C defines a check command, with the other command characters defined previously. The data processor 112 will compare parts program blocks from a source of parts program commands such as the tape reader 116 with the parts program stored in the parts program memory 130 and output the differences. The data processor 112 will load a block of commands from the selected external source of parts program commands, compare this block with the corresponding stored block, and output both blocks if they do not compare. Two columns of printouts will result. If the sequence numbers can be matched up but the commands don't compare, then the data processor 112 will output the stored block in one column and the input block in a second column. If the sequence numbers can't be matched up, either a block was added or a block was deleted, where that block will be output in the appropriate column. Check outputs as printouts such as to a typewriter 156 can constitute a listing of editing changes made to the parts program. Check outputs such as to a tape punch 154 can provide an edit record to be used to correct the original parts program. Check outputs to a data link 150 can provide edit parameters to a remote large scale computer system to be used in generating a parts program update in source language. This check operation can verify that the parts program had been properly loaded by performing this CNC check operation with the same parts program after loading the parts program into the parts program memory. This check operation can verify that the parts program had been properly output such as punched on a tape in the record operation by performing this CNC check operation, such as with the new tape after punching that tape. Other uses of the CNC check operation will become obvious to those skilled in the art.

A CNC command to edit or input data can be defined by: E $F_1F_2F_3F_4$, $L_1L_2L_3L_4$ A; where the letter E defines an edit or input command, with the other command characters defined previously. The data processor 112 will load the parts program from a source of parts program commands such as the tape reader 116 and store it in the appropriate order in the parts program memory 130. A single block will be loaded when the four F characters are the same as the four L characters, defining a start address that is the same as the stop address. In this manner a single block can be added or used to overlay or replace an existing block in the parts program memory 130.

A CNC command to delete data can be defined by: D $F_1F_2F_3F_4$, $L_1L_2L_3L_4$ A; where the letter D defines a delete command, with other command characters as defined previously. The data processor will delete the blocks of parts program commands in the parts program memory defined by the F thru L sequence numbers.

A CNC command to execute the parts program can be defined by: X $F_1F_2F_3F_4$, $L_1L_2L_3L_4$ A; where the letter X defines an execute command, with the other command characters defined previously. The data processor 112 will execute the blocks of commands defined by the F thru L sequence numbers to control the CNC system 110, and the machine 124.

Other CNC commands and command formats will now become obvious to those skilled in the art.

Various lamp displays may be used to display the CNC conditions and modes. These displays are optional and are used primarily for identification of the system conditions to the operator. The display panel 118 permits convenient addition or modification of lamp displays and operation, as described herein.

The use of several switch controls and lamp displays, as provided for in the panel design, will permit CNC operation to be controlled from the panel. One embodiment of CNC panel operations will be described with reference to FIG. 2. The switches that control the CNC operation are the CNC Source Select switch 280 and the CNC Mode switch 282. Lamp displays may be used to define the CNC modes. In one embodiment, these are the CNC lamp 270, the Execute lamp 272, the Edit lamp 274, the Delete lamp 276, and the Record lamp 278. Activation of the CNC Source switch 280 will alert the data processor to an operator command to change the source of parts program commands. The data processor 112 will alternately toggle the CNC lamp 270 to the on state, then to the off state, then to the on state and so forth in response to each activation of the CNC Source Select switch 280, alternately selecting the parts program memory and the tape reader as sources of parts program commands. When the CNC lamp 270 is illuminated, the system is in the CNC condition; where the data processor will operate on the parts program commands stored in the parts program memory. When the CNC lamp 270 is extinguished, the system is in the Tape condition; where the data processor will operate on the parts program entered through the tape reader 116. Additional sources of parts program commands can be selected with the CNC Source Select switch 280, which can be used to sequence the spare lamp displays 218 through a sequence of conditions similar to that discussed hereafter for the CNC Mode switch 282 and lamp displays 272, 274, 276, and 278.

In one embodiment of CNC operation, the lamp displays 218 are used to define system conditions. One of the CNC mode lamps 272, 274, 276 and 278 will be illuminated to define which of the four CNC modes has been selected. The CNC Mode switch 282 will permit the operator to sequence the system through the modes until the CNC mode that is displayed satisfies the operator. Each depression of the CNC Mode switch 282 by the operator will cause the CNC Mode lamp that is illuminated to be extinguished and will cause the next CNC Mode lamp in sequence that is extinguished to be illuminated. Each depression of the CNC Mode switch 282 will cause the next one and only that one CNC mode lamp to be illuminated in the sequence of first the Execute lamp 272, next the Edit lamp 274, next the Delete lamp 276, next the Record lamp 278, and then back to the Execute lamp 272.

The operation of the system will next be described for the embodiment where CNC commands are entered with the panel 114. Other CNC command means can also provide these commands such as previously described.

A new parts program can be loaded from a tape through the tape reader 116 into the parts program memory. This CNC operation is performed with the CNC lamp 270 illuminated, the Edit lamp 274 illuminated, the Mode Selector switch 240 in either the Continuous position 280 or the Block position 282, and the tape properly placed in the tape reader. When the operator depresses the Cycle Start switch 246, the data processor 112 will sense this CNC command, load a block of tape parts program commands, then place this block of tape commands in the parts program memory in the order of the sequence numbers. If the sequence number of a block of commands from the tape does not correspond to any sequence number in the stored parts program, the tape block will be inserted inbetween the closest adjacent sequence numbers of the stored parts program memory. If the sequence number of a tape block corresponds to the sequence number of a stored block, then the tape block will replace the stored block in the parts program memory. If the parts program memory had been cleared with the Delete mode, then the complete parts program from the tape will be loaded sequentially into the parts program memory. The term "load" is intended to include not only entering of data, but also the required preprocessing operations. In the Block mode 232, the data processor will load a single block for each depression of the Cycle Start switch 246. In the Continuous mode 280, the data processor will load a sequence of blocks for a single depression of the Cycle Start switch 246; stopping only for an end-of-program or end-of-tape command or when the parts program memory is full.

Execution of a stored parts program from the parts program memory is performed with the CNC lamp 270 illuminated, the Execute lamp 272 illuminated, and the Mode Selector switch 240 in either the Continuous position 280 or the Block position 282. In addition, the sequence number of the first block to be executed should be searched for and displayed on the sequence number display by performing the Search operation as described hereafter. When the operator depresses the Cycle Start switch 246, the data processor 112 accesses the displayed block of commands from the parts program memory and executes this block of commands. In the Block mode, data processor 112 will execute a single block of commands for each depression of the Cycle Start switch 246. In the Continuous mode, the data processor 112 will execute a sequence of blocks of commands for a single depression of the Cycle Start switch 246; stopping only for an operator commanded stop or parts program commanded stop.

Editing of a stored parts program from the parts program memory with the keyboard 244 is performed with the CNC lamp 270 illuminated, the Edit lamp 274 illuminated, and the Mode selector switch 240 in the Keyboard position 284. The new block to be entered is entered with the keyboard 244 and verified with the numeric display 238, as described herein. This displayed block is then loaded by depressing the Cycle Start switch 246. If the sequence number of the displayed block corresponds to the sequence number of a stored block, the data processor 112 will replace the stored block with the displayed block in the parts program memory. If the sequence number of the displayed block does not correspond to the sequence number of a stored block, the data processor 112 will place the displayed block in the proper sequence in the parts program memory. Next, the data processor 112 will assemble the stored parts program for more efficient storage; which may be performed automatically or upon special command.

Verification of a block of stored parts program commands is performed visually with the CNC lamp 270 illuminated, the Mode selector switch 240 in the search position 290, and the selected sequence number displayed with the numeric display 238. Depression of the Cycle Start switch 246 will command the data processor 112 to search for the selected block and display that block on the numeric display 238. If the selected block is not in the parts program memory, the system error lamp 236 will be illuminated.

Deletion of a block of commands is performed with the CNC lamp 270 illuminated, the Mode selector switch 240 in the Keyboard position 284, and the Delete lamp 276 illuminated. The sequence number of the block to be deleted is entered with the keyboard 244, then the Cycle Start switch 246 is depressed to command the data processor 112 to delete the selected block. The data processor 112 will assemble the parts program for more efficient storage, either automatically or upon special command. If the selected block was the largest number displayed, 9999 for this system; then the data processor 112 would delete the complete stored parts program in the parts program memory.

Punching a tape consisting of the parts program in the parts program memory is performed where first the operator will search for the first block to be punched then the operator will enter the sequence number of the last block to be punched through the keyboard 244. With the CNC lamp 270 illuminated, the Mode selector switch 240 in the Keyboard position 284, and the Record lamp 278 illuminated; depression of the Cycle Start switch 246 by the operator will command the data processor 112 to start punching a tape of the stored parts program through an auxiliary I/O channel 128 to a tape punch 154.

The data processor 112 executes the executive program to control all operations and provide for time sharing with program routines. The data processor detects inputs and conditions with the executive program, then transfers to the various program routines necessary to perform the computations and generate the outputs. Operations may be handled on a sequential, interrupt, or priority basis well known in the art. The data processor can execute programs on a time shared basis by branching out of subroutines as is well known in the art. For simplicity of description, relatively complex programs such as time shared operations are not shown in the flow diagrams in FIGS. 3A-3E, but will become obvious to those skilled in the art from the following description.

The data processor CNC stored program can be understood with reference to FIGS. 3A-3E, which are flow diagrams that illustrate the CNC operations. The mode select logic is shown in FIG. 3A, select logic subroutine from the executive routine 300 along the path 302 to check for a cycle on condition in operation 304. If a cycle on condition exists, the data processor is performing operations that supercede this mode selection subroutine, so the data processor loops along path 306 to exit 308 to continue the in-process operations. If a cycle off condition exists, the data processor follows path 305 and checks for a cycle start command from the operator with the Cycle Start switch 246 in operation 310. If this command is not generated, the data processor maintains the system in the cycle off condition and exits from the mode logic subroutine along path 312. If the cycle start command is generated, the data processor sets the cycle on condition in operation 314 and proceeds to decode the operations to be performed. It should be noted that the cycle on condition will cause the data processor to exit from this mode logic subroutine through exit 308 on subsequent iterations until the data processor completes the required cycle on operations and again enters the cycle off condition. The data processor checks the condition of the Mode selector switch 240 in operations 316 through 324 and branches to the appropriate subroutines 326 through 336. The Keyboard mode is tested in operation 316, where the data processor enters the Keyboard subroutine 326 if the Keyboard mode is commanded. If the Keyboard mode is not commanded, the data processor proceeds to test for the Block mode in operation 318, where the data processor enters the Block mode subroutine 328 if the Block mode is commanded. If the Block mode is not commanded, the data processor proceeds to test for the Continuous mode in operation 320, where the data processor enters the Continuous mode subroutine 330 if the Continuous mode is commanded. If the Continuous mode is not commanded, the data processor proceeds to test for the Index mode in operation 322, where the data processor enters the Index mode subroutine 332 if the Index mode is commanded. If the Index mode is not commanded, the data processor proceeds to test for the Search mode in operation 324, where the data processor enters the Search mode subroutine 334 if the Search mode is commanded. If the Search mode is not commanded, the data processor branches to an error subroutine 336 because all proper alternatives had been tested, leaving only erroneous alternatives. The data processor is not responsive to the Cycle Start switch when the system is in the Jog mode and, therefore, that operation is not presented in FIG. 3A.

The Keyboard subroutine 326 is shown in FIG. 3B where the data processor enters this subroutine through operation 338 and tests for the CNC condition in operation 340. If the CNC condition is off as defined by the CNC lamp 270 extinguished, the data processor executes the displayed keyboard commands in operation 342 and exits the subroutine in operation 345. If the CNC condition is on as defined by the CNC lamp 270 illuminated, the data processor tests for the Execute mode in operation 344 as defined by the state of the Execute lamp 272. If the Execute mode is selected, the data processor executes the displayed keyboard commands in operation 342 and exits the subroutine in operation 345. It should be noted that the execution of the displayed keyboard commands in operation 342 is the same independent of whether the CNC condition is on or off. If the Execute mode is not selected, the data processor tests for the Edit mode in operation 346 as defined by the state of the Edit lamp 274. If the Edit mode is selected, the data processor performs the edit operations 348 by first searching for the displayed sequence number in the parts program memory. If the stored sequence number is located in the parts program memory, the data processor replaces the stored block of commands with the displayed block of commands in the parts program memory. If the data processor does not locate the stored sequence number in the parts program memory, the data processor stores the displayed block of commands inbetween the two blocks of stored commands with the next highest and next lowest sequence numbers. After this edit operation, the data processor reassembles the stored parts program in the parts program memory for more efficient storage. The data processor then exits the Keyboard subroutine 326 through operation 345. If the Edit mode is not selected, the data processor tests for the Delete mode in operation 350, as defined by the state of the Delete lamp 276. If the Delete mode is selected, the data processor performs the delete operations 352 through 362. A test is first made of the sequence number in operation 352. If the sequence number is the maximum value (9999), then the data processor branches to operation 354 which deletes all stored parts program blocks in the parts program memory to clear that memory. If the sequence number is not the maximum value, then the data processor branches to operation 356 where the data processor searches for the selected block of commands in the parts program memory and tests to determine if the block is located in operation 358. If that block is located, then the data processor branches to operation 360 where that block is deleted and the stored parts program is reassembled in the parts program memory for more efficient storage. The data processor then exits the Keyboard subroutine through operation 345. If that block is not located, the data processor branches to the error subroutine 362 because the delete command can't be executed on a block that is not stored in parts program memory. If the Delete mode is not selected, the data processor tests for the Record mode in operation 364, defined by the state of the Record lamp 278. If the Record mode is selected, the data processor performs the record operation 366 by punching a tape of the parts program stored in the parts program memory. An auxiliary tape punch 154 would be used, where this tape punch 154 and the required data processor interface for the tape punch are well known in the art. If the Record mode is not selected, the data processor branches to an error subroutine 368 because all proper alternatives have been tested, leaving only erroneous alternatives.

The Block subroutine 328 and the CNC Continuous subroutine 330 will now be described with reference to FIG. 3C because of the similarity in executing a single block of commands, where the decision operation 376 defines whether a block or continuous operation will be executed as discussed hereinafter. The primary difference is that the data processor in the Block mode will automatically return the system to the cycle off condition after execution of that block of commands, while the data processor in the Continuous mode will not automatically return the system to the cycle off condition, but will continue to execute blocks of commands until commanded to enter the cycle off condition. The data processor enters the Block or Continuous subroutine through operation 370 and tests for the CNC condition in operation 371. If the CNC condition is off, the data processor accesses the next block of commands from the tape through the tape reader 116 in operation 372 and executes this block of commands in operation 375. If the CNC condition is on, the data processor tests the Execute mode in operation 373. If the Execute mode is selected, the data processor accesses the next block of commands from the parts program stored in the parts program memory in operation 374 and executes this block of commands in operation 375. After execution of a block of commands from either the tape or the parts program memory, the data processor tests for the Block mode in operation 376. If the Block mode is selected, the data processor branches to operation 377 and sets the cycle off condition. The data processor then exits to the executive routine 382. If the Continuous mode is selected, the data processor directly exits the subroutine through operation 382. If the Execute mode is not selected, the data processor will test for the Edit mode in operation 378, defined by the state of the edit lamp 274. If the Edit mode is selected, the data processor reads the tape from the tape reader and stores that parts program in the parts program memory in operation 379. A test is made for an end of program command in operation 380. If an end of program command is not detected, the data processor branches back to operation 379 to access additional tape commands. When an end of program command is detected on the tape in operation 380, the data processor stops loading the parts program from the tape, stops the tape reader, and branches out of the loading loop to the executive routine 382. If the Edit mode is not selected, the data processor enters the error subroutine 381 because all proper alternatives have been tested, leaving only erroneous alternatives.

The Index subroutine 332 is shown in FIG. 3D, where the data processor enters this subroutine through operation 387, directly executes the Index command in operation 383 by driving the machine to the index position, then exits the Index subroutine 332 to the Executive subroutine 384. The CNC condition is not tested because the same index operation is common to both, the CNC condition and the Tape condition.

The Search subroutine 334 is shown in FIG. 3E where the data processor enters this subroutine through operation 386 and tests for the CNC condition in operation 388. If the CNC condition is off, the data processor searches the tape with the tape reader for the displayed sequence number in operation 392. If the CNC condition is on, the data processor searches the parts program memory for the displayed sequence number in operation 390. When the selected block is located, the data processor branches to operation 396 which displays the selected block, then exits to the executive routine through operation 398.

When stored parts program commands are deleted, parts program memory locations previously used become available within the sequence of stored parts program commands. Assembly of the stored parts program by shifting the locations of the subsequent commands to fill the vacant storage locations provides a more efficient manner of storage. Similarly, when stored parts program commands are added, these new commands must be inserted between previously stored adjacent commands. Assembly of the stored parts program by shifting the locations of the subsequent commands to vacate an area of storage locations for the added commands provides a more efficient manner of storage.

A parts program usually incorporates three digit sequence numbers arranged in ascending order as defined in the EIA Standards. When a block is added, appropriate sequence numbers are therefore not available. In the CNC system of this invention, a fourth, fractional, sequence number digit is provided to permit new blocks to be added and numbered in ascending order. This fractional sequence number digit may then be used in operation or the data processor can be commanded to reassign three digit sequence numbers in ascending order to conform to the EIA Standards.

One embodiment of this invention uses CNC mode lamp displays to define the operating condition to the operator. The data processor assembles a group of discrete control bits into a lamp display control word which is then output to selectively illuminate the selected lamps as described herein. It should be noted that the data processor also stores this lamp display control word to define system conditions. Therefore, when the data processor tests the lamp displays, it actually accesses the stored lamp display control word and processes the appropriate lamp control condition. If lamp displays are not implemented, the data processor provides the control words, which may still be referred to as the lamp conditions.

Machine Interface

Machine automation has been widely used in the prior art such as with numerical controls for machine tools. These prior art controls are special purpose (non-computerized) devices with solid state electronics, relays, and other such devices; but without stored program digital computers. The special purpose devices do not fully utilize time sharing, therefore requiring special circuitry for each function implemented, resulting in a large number of expensive circuits each performing a special purpose function. For the numerical control of machine tools, these special purpose controls have been standardized for use with many different machines. The requirements of each type of machine are usually different, requiring a different interface to convert the standard control system signals into the special signals required by the machine. This interface is usually implemented with relays and mounted on the machine as an integral part of the machine, commonly known in the art as "the machine magnetics" or simply "the magnetics". The magnetics have been accepted in the numerical control field as a necessary part of the system, where the need for magnetics is not disputed in the prior art.

For numerical control systems that control machine tools, digital commands are input with a punched tape to describe the part to be cut on the machine such as a milling machine. These commands are accessed by the numerical control system and are executed to drive the machine to automatically cut the part.

Prior art numerical control systems have been designed around special purpose digital devices where operations such as logic, control, and computations are performed with special purpose logic. Because of the high cost and limited capability of these special purpose numerical control systems, the data is preprocessed with a remote, large scale computer using a parts program compiler such as APT. The remote computer preprocesses the information and generates a punched tape in a control oriented language (EIA) containing the initial conditions and commands required by the special purpose numerical control equipment. These parts program tapes describe the part to be generated and are used as the command inputs to the numerical control system to cut the part.

The present invention provides an improved control system for physical systems such as machines and processes incorporating a stored program digital computer to perform control operations in conjunction with the physical system. The computer performs operations that were assigned to special purpose circuitry in prior art control systems and the computer performs operations that were assigned to special purpose relay logic such as in the prior art machine systems. Special purpose interfaces that are used in the prior art are eliminated, where the computer performs most of those prior art interface operations under program control and communicates with the physical system through an elemental interface. These improvements provide low cost by eliminating special purpose circuitry, flexibility by implementing interface operations in a stored program computer under program control thereby permitting ease of modification and improved capability by utilizing the computational power of a general purpose digital computer to provide interface operations.

The present invention provides an improved and simplified electronic data processing system which performs the necessary data processing functions as least as well as prior art non-computerized systems but which, because of its simplicity and inexpensive cost, is suitable for use in applications for which, because of economic reasons, the benefits of electronic data processing systems were previously unavailable. In particular, this invention presents a simple, inexpensive system and method to provide computerized capability for numerical control applications. It should be understood that any reference to such a numerical control system is intended to include any system wherein digital data processing capability is provided for control of a physical system such as a machine or a process. The particular system discussed herein is one class of such devices.

The prior art controls and interfaces are relatively large devices that are often contained in a large cabinet that is set apart from the machine and machine interface. The machine interface is typically composed of magnetic relays which perform computational operations to process and execute the commands from the control system.

In a preferred embodiment of the present invention, the machine interface relays used for computational operations which can be performed in the data processor under program control are eliminated. Certain relays that are used as "amplifiers" to provide high power signals, such as for motor excitation, obviously can't be eliminated with computer processing, where such relays or their equivalents are still required in the system. To practice this invention it is required that machine control operations be performed with the data processor, but it is not necessary to perform all machine control operations with the data processor. Therefore, some or all of the computational type operations may be performed with the data processor.

The terms related to computational operations of computational processing used herein are intended to mean machine control operations or processing, timing, sequencing, and logical operations.

The terms "discrete" and "static" such as with discrete machine control operations and static machine control operations are used to define what may also be termed on-off type operations. These terms may be contrasted to contouring operations which can be termed "dynamic" operations.

In one embodiment, the interface electronics shown in FIGS. 5 and 6 can be physically mounted in the machine subsystem, apart from the control subsystem. In another embodiment, portions of the interface electronics shown in FIGS. 5 and 6, particularly the C-Register 560 and 670, can be physically mounted in the machine subsystem, apart from the control subsystem.

The machine interface shown in FIGS. 5 and 6 and described herein can be partitioned, where the machine interface electronics can be physically contained in a pendent or alternately in machine mounted modules.

The terms interface, interface assembly, and IFA relate to the computer I/O structure, machine interface and various auxiliary devices. This interface assembly is not an interface in the prior art terminology, but is an elemental interface. It may be considered to be a distributed collection of communications devices such as the computer I/O and interface registers. This elemental interface operates in an on-line manner, dependent on computer-action, operating with computer intrinsic signals, and performing its operations in response to the computer stored program operations.

The interface assembly (IFA-1, IFA-2, and IFA-3) is not an interface in the conventional sense but constitutes a distributed group of circuits that are normlly associated with the data processor and the various system entities. The interface assembly also performs the operation of signal distribution between the data processor and various system extremities.

The IFA-1 printed circuit board is shown in FIG. 5A and contains logic gates 550, 551, 552, and 553 providing input/output circuits. The IFA-1 board accepts input and output type instruction micro-operation signals as well as address signals to encode or decode the various inputs and outputs. The input and output words are exchanged with the A-Register in the data processor 112, discussed in the referenced application, Data Processing System. The input words (IW) are multiplexed by logic gates 553 into signal P108 which is input to the A-Register. Information is output from the A-Register to the various system extremities by connecting the extremities to the A-Register output signal $A_oQ$ and clocking a selected extremity with a gated clock P104 as determined by logic gates 552. Discrete inputs are multiplexed into discrete input signal P105 by logic gates 550. Discrete outputs are decoded and gated by logic gates 551 with micro-operation signal FAH providing the gating. The discrete input signals are accessed with skip on discrete decision instructions. A short negative going pulses is provided when selected with a discrete output instruction. The I-Register flip-flops $I_1$, $I_2$, $I_3$, and $I_4$ perform the operations of latches which are toggled or set with the discrete outputs DO-4 through DO-8. The $I_1$ flip-flop is used to directly provide a Scratch Pad Memory paging operation. Outputs from the flip flops $I_2$, $I_3$ and $I_4$ are fed back to the computer 112 as discrete inputs. The signals P50-P61 are decoded operand addressed from the data processor 112.

The C-Register 560 is loaded with the $A_oQ$ signal from the container A-Register when clocked with the OW-8 gated clock pulse to synchronize this data transfer. The C-Register output signals C15Q-C6Q are then used to control operations such as machine interface operations. The C-Register illustrates the "data pipe" concept discussed in detail hereafter, where the C-Register may be extended without limit such as shown in FIG. 6 as the C-Register extension (C31-C16) 670. The computer 112 packs together or assembles the discrete commands in the A-Register as described hereafter, then outputs this packed discrete word to the interface register (C) 560 and 670 to command system operations.

Figure 5C:
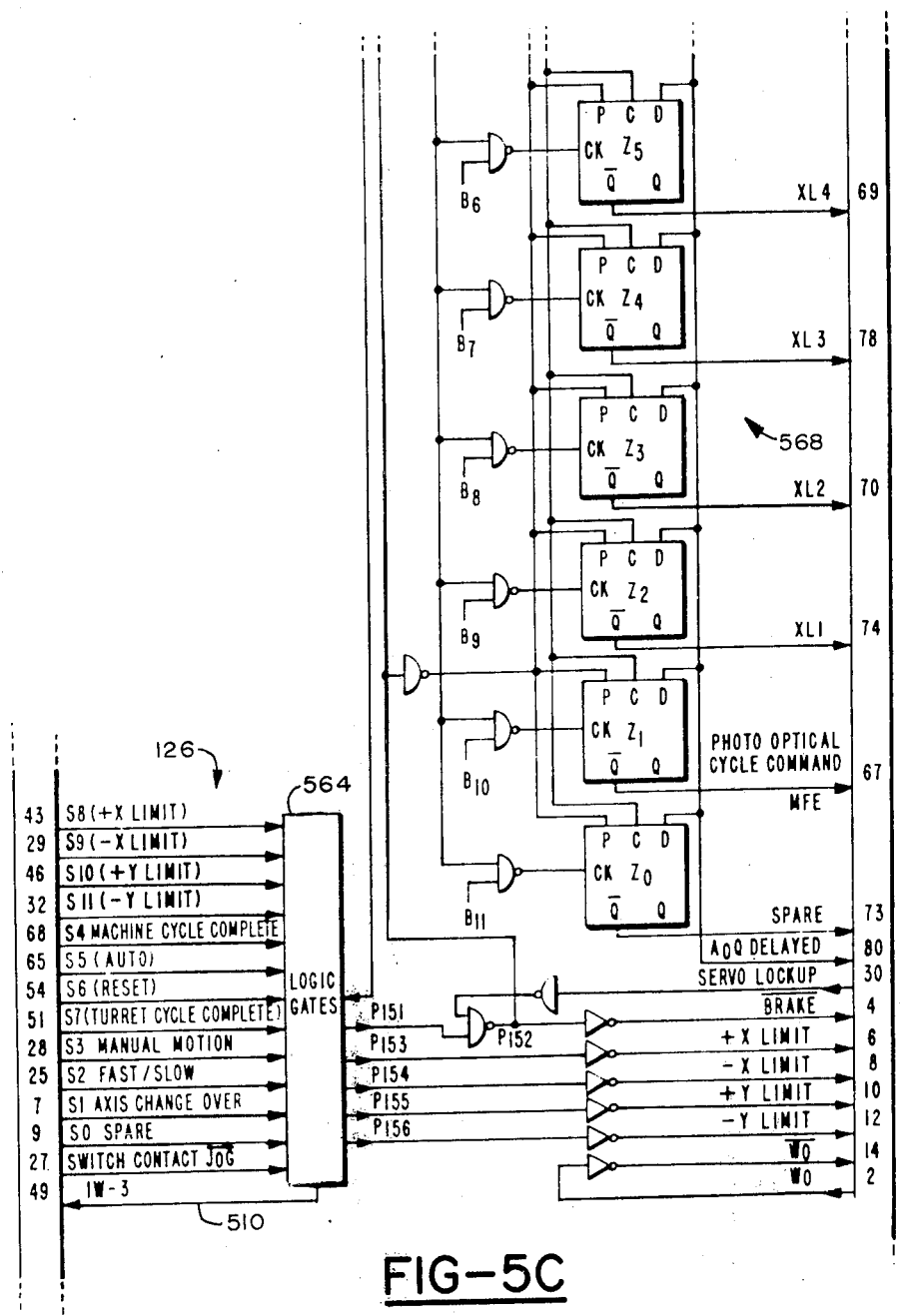

The IFA-2 printed circuit board is shown in FIGS. 5B and 5C and provides for the scan-in of input words "zero", "three", and "four" to convert the parallel input lines to a serial input that can be processed with the input word multiplexer 553 on the IFA-1 card. Logic 562 scans control panel selector switch signals into input word −0, logic 564 scans non-adapted machine condition signals into input word-3 and logic 566 scans rudimentary intrinsic tape reader input signals into input word −4. The Z-Register 568 includes flip-flops $Z_{11}$ through $Z_o$ and is a static register loaded with output word −7 for system discrete interface commands. It should be noted that this register does not have ambiguous outputs during the shift frame due to selective clocking of the flip-flops in this register.

The machine interface arrangement and logic, illustrated in FIG. 5C with logic gates 564, packs a plurality of machine feedback signals S0 through S11 into computer input word −3 (IW-3) 510. The computer 112 unpacks these signals under program control, as described hereafter. The manual machine controls S1, S2, and S3 provide the computer with operator commands from machine mounted switches which may be on a machine control panel 114 or a pendant control panel hanging from a machine overhead structure. These operator controls may be mounted on the machine to give the operator the capability to command operations while he is close to the machine such as for set-up operations.

The machine signals S4 through S7 relate to feedback from the machine. The cycle complete signal S7 can be used for a turret or a spindle condition for automatically controlling machine operations. The machine cycle complete signal S4 is a generalized machine cycle signal used to detect machine conditions such as the machine spindle stop condition described hereafter. The machine limit switches S8 through S11 are used by the computer to detect whether the machine has exceeded the physical translational dimensions, causing the computer to take the required action such as entering a slide hold condition to stop machine translation.

The scan-in logic 562, 564, and 566 provides serial data inputs to the computer A-Register. The scan-in logic acts as a multiplexer, which multiplexes parallel input conditions with the sequential bit time signals B0-B11 of the computer to provide a sequence of input conditions such as with IW-0, IW-3, and IW-4 from scan-in logic 562, 564, and 566, respectively. When an EX instruction is executed, the corresponding IW signal is selected with IW logic gates 553 for loading the input word into the A-Register with the input signal P-108. The system input conditions such as the machine signals S0-S11 from scan-in logic 564 constitute packed discrete conditions assembled into a word with the scan-in logic for loading into the A-Register.

The IFA-3 printed circuit board is shown in FIG. 6 and provides an extension of the C-Register ($C_{31}$ through $C_{16}$) to perform auxiliary operations such as to excite the turret decode logic for machine turret select 681. Logic gates 672 provide the input gating and logical functions associated with the momentary switch logic conditions from the control panel 114 and multiplex those conditions into input word −1. Special gating is also provided for computer interrupts. The servo lockup signal 690 is used to disable the machine drives when a detrimental condition is sensed.

Control of a machine turret such as for tool change will now be described with reference to FIGS. 5 and 6. When the computer 112 receives a turret change command such as from tape reader 116, the computer will test the system conditions as interlocks such as limit switch signals S8–S11 will scan-in logic 564 and will proceed with the turret change if the interlocks are properly set. The computer will then determine the required code for the commanded turret position, pack this code into the discrete command word in the A-Register, then output this command word to the C-Register 560 and 670. The turret command will be stored in the C31, C30, and C29 stages of the C-Register 670 to excite the turret select decode logic 680, to select the desired turret output line (TS-0 through TS-7) 681. The machine turret motor will drive until the appropriate machine position switch is actuated, thereby switching off the selected drive signal 681 and stopping the turret at the selected position. The computer 112 will monitor the turret cycle complete signal S7 with scan-in logic 564 such as for an interlock to disable other machine commands until the turret cycle is complete.

In a preferred embodiment, an interface register such as the C-Register 560 and 670 may be physically located in the machine subsystem. In one embodiment, the control subsystem is physically separate from the machine subsystem and connected to the machine subsystem by cables. The interface data is communicated between the control subsystem and the interface electronics in the machine subsystem in serial data form over the interconnecting cables, thereby reducing the cabling over that of a prior art control system that uses parallel data communicated through the cables. In this embodiment, the various operations are performed under program control in the control subsystem and multiplexed or packed serial data 126A, 126B is communicated to reduce interconnections to the machine subsystem 124. Multiplexing and demultiplexing may be the primary operations performed in the machine in the form of serial-to-parallel and parallel-to-serial conversions. Secondary operations that may be performed in the machine include well known power drives for output signals and line receivers for input signals. This physical partitioning with logic and computational operations performed in the control and with drive, receiving, and parallel/serial conversions operations performed in the machine has particular advantages over prior art systems, such as for reduced cabling and increased reliability.

The interface described herein is not limited to a machine interface, but can provide similar advantages when used with other arrangements such as the operator panel 114 and 118 described in detail in the parent applications.

Switch Control

Machine conditions are usually provided to the control subsystem with switch type devices as discrete inputs such as signals 126B as shown in FIGS. 1A and 5C. These switch type devices may be operator toggle switches, selector switches and momentary switches; machine limit switches; relay contacts and other well known switch devices. These switch devices are discussed herein as a group of switch devices and as a distributed switch subsystem which may include distributed groups of switches on the control panel 114, the machine 124, and on other subsystems.

The switch subsystem may be an elemental extremity for the preferred embodiment of this invention; wherein the switch subsystem does not provide for the usual interface operations such as elimination of switch bounce, which may be performed by the data processor 112 in response to the stored program contained in the main memory 130. This switch subsystem is processor dependent and requires data processor coaction for operation.

The data processor 112 provides processing and signal translating capability, yielding versatility and low cost. The switch subsystem is a processor dependent extremity that is elemental in form and communicates with the data processor 112 in signal formats intrinsic to the switch subsystem. Operative dispersion is used to fulfill system requirements including signal translation and communication; where the data processor 112 processes the data in a time format intrinsic to the elemental switch subsystem.

This elemental switch subsystem may be a part of a factored computer system 110, wherein the prime functions have been factored and separated from this switch subsystem. The factored prime functions of the switch subsystem may be redundant, where these prime functions can be performed by the data processor 112. The data processor 112 is considered to be in a non-redundant, irreducible form. Factored prime functions of the switch subsystem that are redundant are eliminated in the switch subsystem and performed with the data processor 112, thereby reducing the hardware associated with the switch means and providing a minimal structured or elemental switch subsystem, dependent on this operational dispersion of the data processor 112 in the performance of the switch control operations. This system 110 may also be considered an integrated computer system wherein the factored prime functions that are merged into the data processor causes an overlapping of switch subsystem functions as if the data processor and switch subsystems were integrated together. For example, the elimination of switch bounce is associated with the switch subsystem, but is performed by the data processor 112. Switch control operations have been assumed by or integrated into the data processor 112, where these switch subtasks are performed by the data processor 112 with the resultant elimination of switch circuitry.

The elemental switch subsystem has a passive nature, where switch control operation is dependent on data processor coaction to actively provide switch functions. This passivity results from the factoring and reduction of redundant prime functions. As an example of this passivity, the activation of a switch such as the mode selector switch 240 will have no effect on the system except through the data processor under program control.

The data processor 112 communicates with the elemental switch subsystem in a signal form intrinsic to the elemental switch subsystem and acceptable to the data processor 112. These intrinsic signal forms are rudimentary signals comprising ambiguous portions such as switch bounce in addition to the data portions such as the switch condition.

The general purpose nature of the data processor is thus extended to the elemental switch extremity. A change can often be made in the operation of this elemental switch device with merely a change in the stored program of the data processor, eliminating the requirement for a major redesign in the switch subsystem. The conditions sensed by the switches can be redefined merely by changing the data processor stored program, such as described for the parameter selector switch 242 in the numerical control system for both a milling machine and a lathe. For a milling machine, the assignments can be X Axis 227, Y Axis 226, Z Axis 225, B Axis 224, Sequence Number 223, Spindle Speed 222, I Arc Center 228, J Arc Center 229, K Arc Center 230, M Command 231, G Command 298, Feedrate 237, Feedrate Override 239, Cutter Compensation 243, and spare 221. For a lathe the assignments can be X Axis 227, Z Axis 226. Sequence Number 225, Spindle Speed 224, Turret Select 223, Tool Offsets 222, I Arc Center 228, K Arc Center 229, M Command 230, G Command 231, Feedrate 298, Feedrate Override 237, and spares 221, 239, and 243. These selector switch assignments can be changed and the execution can be defined under data processor program control. It will become obvious that this flexibility in defining switch identification and control functions under program control extends to the other switches such as the machine condition switches, as will be described with the following example for the numerical control CNC commands hereafter.

The use of several switch controls and lamp displays, as provided for in the panel design, will permit CNC operation to be controlled from the panel. Use of the control panel 114 to process the internally stored parts program blocks of commands is presented in the previously referenced application, Factored Data Processing System for Dedicated Applications; particularly page 21 lines 12 through 16 and other descriptions therein.

The operation of one embodiment of the panel CNC operations, shown in FIG. 2, will next be described. The switches that control the CNC operation are the CNC Source Select switch 280 and the CNC Mode switch 282. Lamp displays may be used to define the CNC modes. In one embodiment, these are the CNC lamp 270, the Execute lamp 272, the Edit lamp 274, the Delete lamp 276, and the Record lamp 278. Activation of the CNC Source switch 280 will alert the data processor to an operator command to change the source of parts program commands. The data processor 112 will alternately toggle the CNC lamp 270 to the on state, then to the off state, then to the on state and so forth in response to each activation of the CNC Source Select switch 280, alternately selecting the parts program memory and the tape reader as sources of parts program commands. When the CNC lamp 270 is illuminated, the system is in the CNC condition; where the data processor will operate on the parts program command stored in the parts program memory. When the CNC lamp 270 is extinguished, the system is in the Tape condition where the data processor will operate on the parts program entered through the tape reader 116.

The flexibility in defining the operation of the control panel switches and the display panel lamps with the data processor under program control is described in the parent application, Factored Data Processing System For Dedicated Application; particularly page 4 lines 29 through 30, page 5 lines 1 through 6, page 29 lines 1 through 17, page 19 lines 24 through 28 and other descriptions therein.

In one embodiment of CNC operation, the lamp displays 118 are used to define system conditions. One of the CNC mode lamps 272, 274, 276, and 278 will be illuminated to define which of the four CNC modes has been selected. The CNC Mode switch 282 will permit the operator to sequence the system through the modes until the CNC mode that is displayed satisfies the operator. Each depression of the CNC Mode switch 282 by the operator will cause the CNC Mode lamp that is illuminated to be extinguished and will cause the next CNC Mode lamp in sequence that is extinguished to be illuminated. Each depression of the CNC Mode switch 282 will cause the next one and only that one CNC mode lamp to be illuminated in the sequence of first the Execute lamp 272, next the Edit lamp 274, next the Delete lamp 276, next the Record lamp 278, and then back to the Execute lamp 272.

The control panel has three selector switches and a plurality of momentary switches as shown in FIG. 2. The three selector switches; a Mode switch 240, a Jog switch 241, and a Parameter switch 242; are multiple position rotary selector switches. The remaining switches are momentary switches which maintain contact only so long as they are held down. Because hardwiring of switch controls is avoided by having intermediary output words communicated to and interpreted by the data processor 112, the number of selector switches as well as the number of contacts on each selector switch can be easily varied to meet the requirements of a specific application.

Several alternate embodiments of the switch subsystem are presented for illustration. Machine switch signals 126B are shown as directly interrogated by the data processor in FIG. 5C, where switch signals S0 through S11 126B are accessed with an EX-3 instruction through scan-in logic 564 on signal line IW-3, pin 49. These switch signals are rudimentary signals containing the switch bounce characteristics and are not logically preprocessed. Selector switches 240, 241, and 242 on the control panel 114 provide input signals which are shown in FIG. 5B as signals P0 through P3 555 representing inputs from the parameter switch 242, M0 through M2 553 representing inputs from the mode switch 240, and J0 through J2 554 representing inputs from the jog switch 241; accessed by the data processor 112 with an EX-0 instruction through scan-in logic 562 on signal line IW-0, pin 45. These selector switch signals are rudimentary signals containing the switch bounce characteristic but are encoded to reduce interconnections. Momentary switches such as with the cycle start switch 246 on the control panel 114 are shown as interrogated by the data processor in FIG. 6, where switch input signals SA through SE 622 are accessed with an EX-1 instruction through scan-in logic 672 on signal line. IW-1, pin 56. These momentary switch signals may have logical preprocessing to remove switch bounce, provide encoding, and provide buffering. In the preferred embodiment, the direct interrogation of the rudimentary switch signals such as described previously for the machine switch signals S0 through S11 126B is used.

All switch signals will herein be considered to be unprocessed rudimentary switch signals as with that preferred embodiment.

Switches are will known input devices and can take many forms such as momentary switches, rotary switches, relays, and others. Also, other input devices provide input conditions that can be processed as described herein for switches such as with a typewriter and an electromechanical punched taped reader.

The data processor under program control loads a digital word 126B comprising rudimentary switch signals and processes those switch signals to obtain appropriate switch information. Various transitionary conditions such as electrical noise, switch bounce, and other such effects can cause erroneous switch information. Therefore, an embodiment is shown which requires that the transient nature of the switch condition stabilize before the switch command is executed. This is achieved by providing for multiple samples by the data processor 112 with a prescribed period between samples. The occurrance of a number of sequential samples where the samples compare is required prior to executing the operation commanded by that switch.

The description of panel operations performed with a computer including switch sampling, switch processing and lamp commands using discrete input samples and discrete output commands provides an arrangement similar to that used with the machine interface discrete conditions. It will now be obvious to those skilled in the art that this description of panel operations is similar to machine operations with discrete condition processing and is intended to illustrate machine interface operations.

Figure 8C:
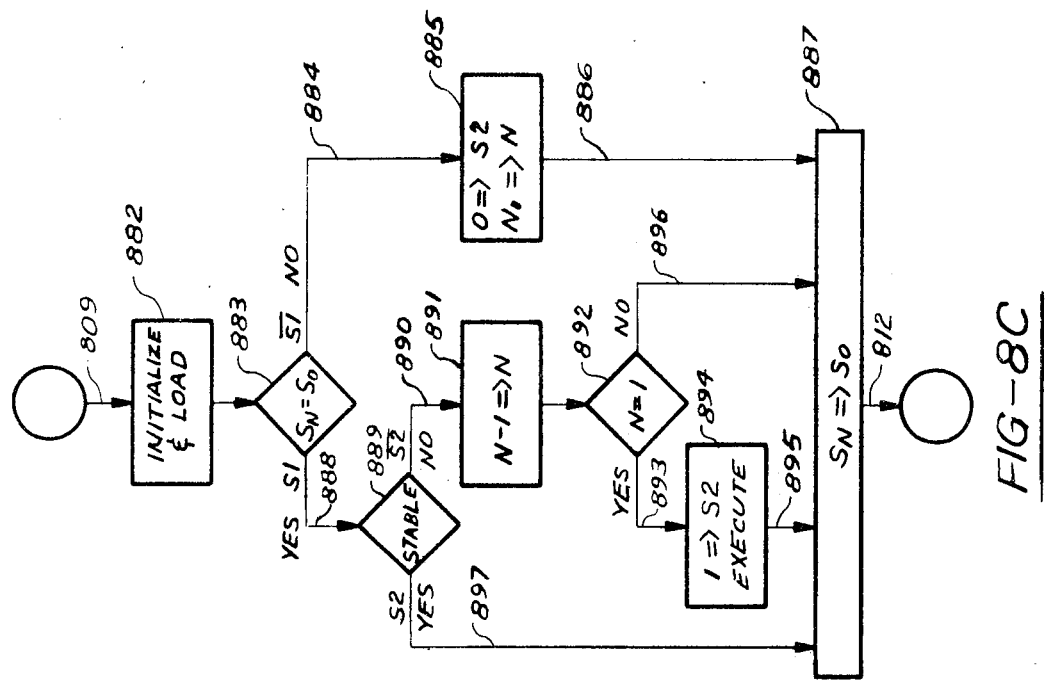
FIG. 8 is a flow diagram representation of further system operations comprising FIGS. 8A-8C showing flow diagrams of various system operations.
Figure 8A:
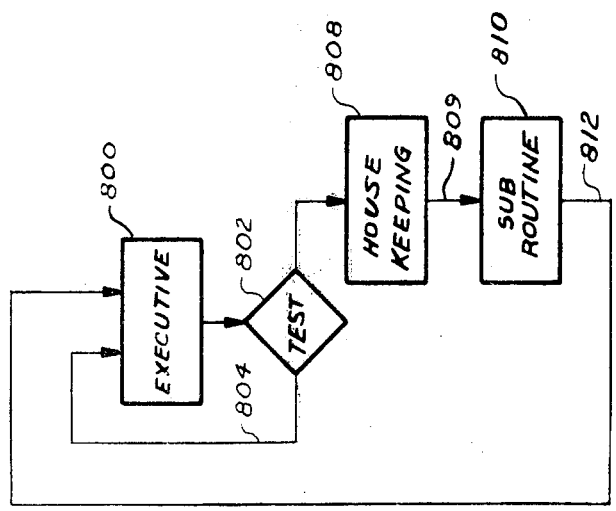

One embodiment of the data processor stored program operations that can be used to process rudimentary switch inputs is described hereafter in conjunction with FIG. 8C.

Machine Interface Operations

The data processor 112 executes an executive routine to control program operations and provide for time sharing with program subroutines. The data processor detects inputs and conditions with the executive routine, then transfers to the various program subroutines necessary to perform the computations and generate the outputs. The data processor can execute programs on a time shared basis by branching out of subroutines such as on a sequential, interrupt, or priority basis in a manner well known in the art. For simplicity of description, relatively complex program operations such as time sharing operations are not shown in the flow diagrams in FIG. 8; but will become obvious to those skilled in the art.

The data processor stored program operation will be described hereafter. The data processor 112 in responsive to a stored program contained in main memory 130 to provide this processing capability. Operation of the data processor 112 is controlled by the executive routine 800 to access subroutines to be executed, set the priority of these subroutines, define the timing, and other such well-known operations. The executive routine 800 controls the data processor to periodically test the real time parameter in operation 802 to determine if it is time to enter one of the real time subroutines; where the real time parameter may be derived from a real time clock, a program timer in the executive routine 800, or other well known means and methods for deriving this parameter. In one embodiment, this timer may be implicit in the stored program, where a transfer to the appropriate subroutine is provided after a certain number of instructions have been executed, thereby implying the required real time period. If the required periods have not expired, the data processor will return to the executive routine along path 804. If one of the required periods has expired to within the required tolerance, the data processor will preserve the return address and other parameters for reentry to the executive routine 800 and perform other required housekeeping functions in operation 808, then the data processor will enter the subroutine 810 along path 809 to perform the required program operations. The data processor will exit the subroutine by fetching the return address preserved in operation 808, then transferring back to the executive routine 800 along path 812.

The data processor may process the subroutines in an iterative manner, where the data processor repetitively enters the subroutine to perform a part of the programmed operations, then exits the subroutine. The data processor may successively enter, then process, then exit the subroutine providing the iterative characteristic.

Figure 8B:
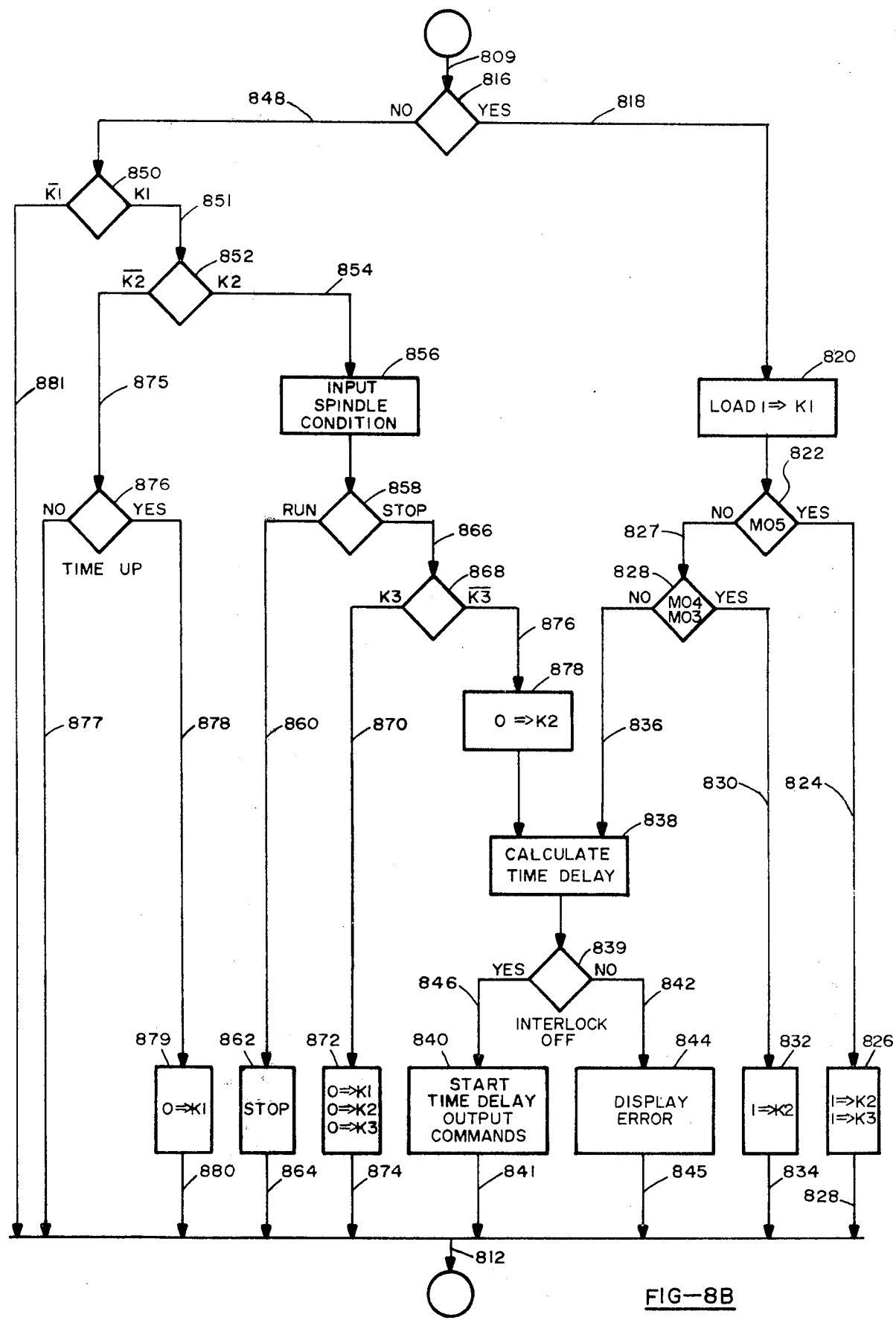

FIG. 8B shows a program flow diagram to illustrate one embodiment of machine control program operations. This illustrated operation controls the spindle and is typical of the other discrete control operations.

The data processor responds to the real time executive routine to provide entry to the machine control routine along path 809 as previously described and iteratively executes this routine to perform the required machine control operations. The data processor tests for a new spindle command in operation 816 such as from a parts program input or operator command input. If there is a new spindle command, the data processor will follow path 818 to operation 820, where the data processor will load the new commands and set the K1 condition to identify a spindle processing operation for subsequent iterations. The data processor will next test the input command to determine if it is a spindle stop command (MO5) in operation 822. If it is a spindle stop command, the data processor will branch along path 824 to operation 826 and will set the K2 and K3 conditions to identify a spindle stop command condition for subsequent iterations. The data processor will next exit the routine along paths 828 and 812, as previously described.

If a spindle stop command (MO5) is not detected in operation 822, the data processor will branch along path 827 to operation 828 to test for a spindle direction command (MO3 or MO4), indicative of a change in spindle direction; which would require bringing the spindle to a stop, then accelerating the spindle in the other direction. If a new spindle direction is commanded, the data processor will branch along the path 830 to operation 832 and set the K2 condition, which will command the spindle to first come to a complete stop before accelerating up to speed in the other direction. The data processor will then exit the routine along paths 834 and 812, as previously described.

If a spindle direction command is not detected in operation 828, the data processor will branch along path 836 to operation 838 to calculate the required time delay for the spindle to accelerate from the prior speed to the new speed. It should be noted that the K2 condition is not set because it is not necessary to bring the spindle to a complete halt to change between spindle speeds in the same spindle direction. The data processor will next exit operation 838 to test for the various interlocks in operation 839 prior to changing the spindle speed. If any of the interlocks are set, the data processor will branch along path 842 to operation 844 to perform the required operations associated with interlocks such as disabling system operations. These operations can include setting the slide hold condition to preclude machine motion, setting a lamp indicator to alert the operator to this interlock condition, and other such conditions. The data processor will then exit the subroutine along path 845 and 812 as previously discussed. If no interlocks are detected in operation 839, the data processor will branch along path 846 to operation 840 to start a time delay to permit the spindle to change speeds, then will output the interface commands to the interface register to command the spindle and then will exit the routine along paths 841 and 812 as previously described.

On subsequent iterations, the presence of additional spindle commands will be tested in operation 816. If there are no new spindle commands, the data processor will branch along path 848 to operation 850 to test for the spindle processing condition (K1) to determine if a spindle command is in the process of being executed. If the K1 condition is set indicating that a spindle command is being processed, the data processor will branch along path 851 to operation 852 to test for the requirement to bring the spindle to a stop. As previously described, the K2 condition is set to bring the spindle to a stop by either a spindle stop command (MO5) as detected in operation 822 or a spindle direction change (MO3 or MO4) as detected in operation 828, each of which will set the K2 condition. If the K2 condition is set, the data processor will branch along path 854 to operation 856 to input the machine interface conditions as a packed discrete word, then to unpack the spindle stop condition bit such as the S4 or S7 condition bits shown in FIG. 5C, then to determine whether the spindle is stopped. The spindle stopped condition is tested in operation 858, where operation will branch along path 860 to operation 862 if the spindle is still running. In operation 862, the data processor will command the spindle to stop by fetching the interface command word from memory and packing a spindle stop condition bit into the appropriate bit position, then outputting this command word to the interface register as previously described. The data processor will then branch along paths 864 and 812 to exit the subroutine as previously described. The data processor will continue to iterate through this path under control of the real time executive routine until the spindle has stopped, as detected in operation 858, causing the data processor to branch along path 866 to operation 868 to test for the K3 condition. The K3 condition was set in operation 826 for a spindle stop command (MO5), where the detection of a spindle stop condition in operation 868 will cause the data processor to branch along path 870 to operation 872 to reset the K1, K2, and K3 conditions that set the program logic for stopping the spindle, indicative of the completion of this spindle stop command. Operation will then branch along paths 874 and 812 to exit the subroutine.

If the K3 condition was not set in operation 868, the data processor will branch along path 876 to operation 878 to reset the K2 condition, indicative of the spindle having come to a stop. Because the K3 condition was not set, the spindle was stopped only to permit reversal of the spindle direction. The spindle must now be accelerated up to speed in the commanded direction. The data processor will branch to operation 838 to calculate the time delay, then branch to operation 839 to test for the interlocks, and then branch to operations 844 or 840 to either interlock operation or command the spindle to the new speed, respectively, as previously discussed.

On subsequent iterations, the requirement to accelerate the spindle to the new speed is detected in operation 852 with the $\overline{K2}$ condition, causing the data processor to branch along path 875 to operation 876 to test the time delay condition to determine if the time delay has expired for the spindle to accelerate to speed. If the time delay has not expired, the data processor will branch along path 877 and 812 to exit the routine. On subsequent iterations, the data processor will continue to test for the time delay in operation 876 until the time delay has expired, then will branch along path 878 to operation 879, where the K1 condition will be reset, indicative of the completion of the execution of the spindle commands. The data processor will then branch along paths 880 and 812 to exit the subroutine.

On subsequent iterations, the completion of the execution of spindle commands will be detected in operations 850 with the $\overline{K1}$ condition, which will cause the data processor to branch along paths 881 and 812 to exit the routine. This path will be followed on subsequent iterations until new spindle commands are input, as detected in operation 816.

Many important inventive features are embodied in the flow diagram of FIG. 8B. One important feature is the closed loop operation of the data processor 112 and the machine 124, illustrated herein with the sensing of the spindle stop condition bit as described in operation 856 and the continued iterations through the program until the computer detects the spindle stop condition. It is inconsequential as to the duration of time required for the spindle to stop because the data processor will continue to iterate through the program waiting until the spindle stop condition from the machine is detected.

Another feature illustrated herein is the open loop command of the spindle to accelerate up to speed with a data processor generated time delay, the expiration of which is indicative of the spindle achieving the speed. The time delay is set in operation 840 and continually tested in operation 876 as the data processor iterates through this routine. When the time delay has expired, the data processor will assume that the spindle has achieved the commanded speed and exit the time delay subroutine path 877 as described.

Still another feature illustrated is the optimization of time delays associated with spindle operations to minimize the time required to execute spindle commands. This optimization of time delays is accomplished with special logic that eliminates excessive or redundant time delays and with special computations that minimizes time delays. As an alternate embodiment, the spindle could be brought to a complete stop for each spindle command and then accelerated up to speed, providing a simpler program than that shown in FIG. 8B, but requiring excessive spindle time delays such as for conditions where a speed change is commanded without a direction change. The minimization of time delays is also achieved by the data processor calculating the optimum time delay in operation 838 rather than using a fixed, worse-case time delay as is used in the prior art magnetics interface devices. It will now become apparent that the time for the spindle to accelerate from one speed to a second speed is related to the change in spindle velocity and the portion of the operational envelope that the spindle is on. The data processor can calculate the precise time delay required for the commanded spindle speed change as contrasted to the simplified alternatives of commanding a worst-worst case time delay for each spindle change.

The packing and unpacking program operations will now be discussed.

A packed discrete work may be considered to be a word with a plurality of condition bits representing command conditions or status conditions. For example, the data processor can output a discrete packed word with command conditions to an interface register to command various discrete machine functions and the computer can input a packed discrete work with status conditions from an interface register to define various discrete machine status conditions. The packing and unpacking of condition bits is performed under program control and provides interface hardware efficiency. It should be noted that a discrete condition may be a single binary bit either in the one or zero state located in a particular bit position of a digital word or may be a plurality of bits set in an array of one or zero states to define a more complex condition. As an example, a single bit may be sufficient to control the spindle on or off condition but a plurality of spindle speed bits may be required to define the various spindle speeds that can be commanded.

Status bits can be unpacked from an input word by logical ANDing or masking the input word with a control word, where the control word contains zeros in all of the non-related bit positions and ones in the related bit positions. The resultant masked word contains only the related conditions. Next, various program shifting operations are used to arrange the bit positions in the word, then various testing and processing operations detect the states of these condition bits for further processing.

Command bits can be packed into an output word by logical ANDing that word with a first control word; containing zeros in the bit positions to be modified to zero set the related bits in the command word, then logically ORing that command word with a second control word to pack command bits into the appropriate positions of the command word. The new command word is output to the interface register to generate machine commands and also stored in the computer as a record of the current machine command conditions.

In this manner, condition bits can be packed into or unpacked from digital words for the interface arrangement described herein. Other interface arrangements and programming methods will become obvious to those skilled in the art.

Processing of the rudimentary status condition signals to eliminate erroneous signal portions such as switch bounce will now be described.

A program flow diagram is shown in FIG. 8C to illustrate one embodiment of the switch processor operation. The real time executive routine provides entry to this switch control subroutine along path 809. Machine response time is in the order of a few tenth seconds so execution of this subroutine approximately every one tenth second will insure detection of a proper command. Other real time periods would be provided for switch occurances faster or slower than machine switches, such as for relays that operate faster than a machine.

The data processor 112 will enter the switch input subroutine through operation 882, which initializes the algorithm parameters and loads the new switch input condition. This condition may be an encoded condition, a discrete non-encoded condition, or other such input. The data processor compares this new condition (SN) with the old condition (S0) in operation 883, where the old condition (S0) was the last prior sample. If the old and the new switch conditions don't compare, then the switch condition has changed due to an operator action, electrical noise or other such cause. Data processor operation then branches along the non-compare ($\overline{S1}$) path 884 to program operation 885, where the data processor resets the stability condition bit (S2) to the unstable state ($\overline{S2}$) and preloads the stable sample program count parameter (N) to a predetermined count (No). This unstable state ($\overline{S2}$) identifies a change in switch condition. The count (No) in the stable sample counter defines the number of stable samples required to define a stable condition. The data processor will next follow path 886 to program operation 887 which stores the various program conditions and exits to the executive routine along path 812 as previously described.

If the old and new switch conditions do compare (S1) in operation 883, then the switch condition has not changed from the last prior sample. Data processor operation then branches along path 888 to program operation 889 where the data processor checks to determine if the switch condition is a stable condition. If the check in operation 889 shows that an unstable condition ($\overline{S2}$) exists, the data processor branches along path 890 to operation 891, where the data processor decrements the stable sample count parameter (N), indicative of the switch condition remaining stable for another sample period. The data processor then makes a check in operation 892 to determine if the stable sample count parameter (N) has been decremented down to one, indicating a sufficient number of stable samples to define a stable condition and to then execute the switch command. If the stable sample count parameter (N) is one, then the data processor branches along path 893 to operation 894, where the data processor sets the unstable condition ($\overline{S2}$) to the stable condition (S2) and executes the switch command. It should be noted that the data processor executes this operation 894 only once for each change in a switch input condition. The data processor then transfers to operation 887 along path 895 and exits the subroutine as previously discussed. If the stable sample count parameter (N) in operation 891 has not counted down to one, then the data processor branches along path 896 directly to operation 887 and exits the subroutine as previously discussed. This path 896 by passes the operation 894 and, therefore, preserves the unstable condition that exists for at least one more sample period.

If the check performed in operation 889 shows that a stable condition exists (S2), where the last prior switch command had been executed in operation 894, then the data processor branches along path 897 to operation 887 and exits the subroutine as previously described because there has been no new switch input to be processed.

The system of the present invention is generally applicable to the control of "physical systems" such as machines and processes as contrasted to computational systems, biological systems, and the like. The very broad applicability of this system will be further exemplified for control of an automobile hereinafter termed "auto".

In reference to FIG. 1C, control 100 may be used to control an auto in place of a contact print machine, where control 100 may be mounted within an automobile which may be characterized by machine 124. The internal configuration of machine 124 may be that of a contact printer as shown in FIG. 1C or may be that of a well known automobile. Communication between control 100 and machine 124 may be performed with interconnecting cabeling 101.

FIG. 1A further illustrates the system 110 comprising control 100 and machine 124. The implementation of elements shown in FIG. 1A are described herein in an embodiment for control of a contact print machine and a milling machine. As discussed above, the various elements of the system 110 may be implemented under program control of the data processor 112 thereby minimizing interfaces and enhancing flexibility. Therefore, it can be seen that by reprogramming data processor 112, the operation of the elements shown in FIG. 1A may be changed from that discussed for a contact print machine or a milling machine to that discussed for an automobile.

For example operator panel 117 provides control and display capability for interaction with an operator for control of auto 124. Operator panel 117 may be implemented as a dashboard having the configuration of well known special purpose dashboard arrangements or may be implemented in a more generalized form as will be discussed with reference to FIGS. 2A and 2B. It should be understood that operator panel 117 being implemented for a numerical control system as shown in FIGS. 2A and 2B is equally applicable to use with an auto where the shape, layout, legends, and other features may readily be adapted in accordance with the present invention.

Tape reader 116 may be a punched tape reader or, in an alternate embodiment, may be a magnetic tape reader such as a well known magnetic tape cassette.

Spare I/O channels 128 may provide further control operations but, in a preferred embodiment, these channels 150-162 which may be connected to system 110 through well known plug connections such as for checkout of system 110, calibration of system 110, or other such purposes.

Servos 120-122 may be used to control auto operations such as for control of steering, braking, and other well known auto operations. Discrete interface control may be provided with discrete signals 126A and 126B. Discrete commands 126A may control operations such as ignition, transmission, fan, and other well known auto devices. Discrete feedback signals 126B may be related to operations performed by the transmission, engine, and other well known auto devices.

Operator panel 117 is shown in detail in FIG. 2A. The operation and configuration of Panel 117 will now be discussed for an automotive embodiment of the present invention.

Numeric display 238 is used to communicate with an operator in numeric form and may further be provided with alpha-numeric capability using the teachings of the present invention for numeric displays in conjunction with well known alpha-numeric display elements. Display 238 may be a single numeric display as shown in FIG. 2A or may have a plurality of characters for displaying different parameters. For simplicity, the present invention is described for a single display 238 having a switchable characteristic with selector switch 242 as described for a numerical control system. Selector switch 242 may be used by an operator to select each of a plurality of parameters for display with numeric display 238. Selector switch 242 may select parameters for display such as velocity or speed, total mileage of the vehicle, mileage from a predetermined condition, time of day, oil pressure, oil temperature, engine temperature, fuel level, engine RPM, and other automotive related parameters. In addition, selector switch 242 may display auxiliary information such as an error code related to a malfunction or other condition.

Keyboard 244, clear switch 250, and enter switch 254 may be used for entering information as discussed for the numerical control system embodiment. An operator may provide a keyboard input by selecting a desired input parameter with selector switch 242 and monitoring the display 238. If the operator desires to change the display parameter, he would depress clear switch 250 to blank the display, sequentially input the desired numbers with keyboard 244, verify that the parameter entered is proper using display 238, then depress enter switch 254 to enter the displayed parameter into the computer.

The purpose of keyboard 244 and related controls may be better understood with a specific example. If an operator wishes to command computer 112 to control the auto 124 to travel at a specific velocity, the operator would insert the desired velocity by positioning parameter switch 242 to a velocity set position then monitor the previous parameter stored in the system. If the operator desires to change the last velocity set parameter, he would depress the clear switch and verify the blanking of display 238, then he would depress the appropriate keys on keyboard 244 to insert the desired velocity set parameter such as depressing keys 6 and 0 for a velocity of 60 miles per hour, then the operator would verify the parameter 60 on display 238 and, if correct, the operator would then depress enter switch 254 to command the computer to enter the new parameter. If the operator made an error in entering the parameter, he would again depress clear switch 250 and again attempt to enter a proper parameter. When the operator desires to use the speed parameter, he would command the computer to operate in a speed set mode such as by depressing momentary switch 283. As described herein, the computer 112 would illuminate a speed set lamp 234 in response to the operator command with switch 283 for feedback to the operator that the speed set mode had been entered. When the operator again depresses speed set switch 283, the computer 112 would exit the speed set mode and would extinguish speed set lamp 234. Further, the computer would be responsive to other system conditions such as discrete feedback conditions 116B which may also be used to exit the speed set mode and extinguish lamp 234. For example, if the computer detects a feedback signal related to a brake command, the computer would exit the speed set mode and would extinguish speed set lamp 234.

Slowing or stopping of the auto may be provided by actuating brake command signals included in discrete output signals 126A in response to brake command signals. A brake command may be provided with machine interface signals 126A such as from a switch on a machine brake pedal or may be provided with a switch that may be considered to be on control panel 114. For example, stop switch 256 may be physically mounted in conjunction with a brake pedal so that switch 256 is actuated when the brake pedal is depressed. Therefore, an operator input to stop switch 256 would be a foot control and would provide a brake command. The computer 112 would interrogate the operator commands and would interpret the operator commands for execution. Execution of the brake command such as from stop switch 256 would result in the computer 112 generating output brake signals such as with brake signals 126A. In still another embodiment, a multiposition switch such as switch 241 may be connected to a brake pedal so that the position of the switch is related to the distance that the brake pedal is depressed. The computer 112 would interrogate and interpret the position of switch 241 to determine the position of the brake pedal as being indicative of which of a plurality of braking conditions was commanded. This plurality of braking conditions might include a non-brake position and a plurality of different magnitude braking conditions from slow deceleration to rapid deceleration. Still further, a brake pedal might be connectable to an analog pickoff such as a potentiometer or resolver which could provide feedback to the computer either directly as discussed in the parent patent applications or with a well known analog-to-digital converter. The computer receives the input brake signal related to the analog pickoff condition and commands a deceleration operation in response thereto.

Direction control is usually provided with a steering wheel providing a directional input to a steering mechanism. The system of the present invention provides for directional control such as in conjunction with a servo 120 operating in response to commands from computer 112 to control machine direction. In the numerical control embodiment of the present invention, directional control is provided by commanding relative velocities of a plurality of axes. In an automotive embodiment, computer processor 112 would receive a direction command signal from an operator or as an automatic input and would generate output commands that may be servo positioning commands to drive the steering mechanism of the auto. Input position commands may be provided with a keyboard for a digital input, with slew switches such as discussed for jog operations using switches 252, or with an analog pickoff connected to a steering column, or other steering input device. For a digital input, computer 112 receives the information directly as described for input signals from control panel 114 or machine feedback signals 126B. Further, an analog pickoff may provide feedback as discussed in the parent applications for resolver feedback to the data processor or using well known analog-to-digital converters. The data processor controls steering servo 120 in response to input steering signals. In addition, the computer may override the input steering signal as a function of other system conditions such as in response to an accelerometer input to provide radial acceleration limitations on turning rate such as a function of vehicle velocity or in response to an auto velocity parameter or other vehicle conditions.

Lamps 233 may provide operator feedback in response to various vehicle conditions such as performed with the well known automobile lamp indicators for low oil pressure, high temperature, generator discharge and further including operator feedback conditions. In prior art devices, a sensor for generating a signal relating to a displayed condition is directly wired to an indicator lamp. In the system of the present invention, the computer 112 interrogates a plurality of sensors to determine system conditions such as with machine inputs S0–S12 (FIG. 5C) and interprets the input signals under program control to generate the output display parameters in response thereto.

The system of the present invention has broad applicability to control of physical systems. In a preferred embodiment, control of a high registration contact print machine and a machine tool have been described in detail to exemplify the present invention. Still further, an automobile control embodiment has been described to illustrate another application of the present invention. The broad scope of the present invention will be further illustrated with an embodiment that may be used in a home or other building.

System 110 may be used by a businessman or home occupant to control machines commonly found in a business establishment or in a home. In a business establishment, machine 124 may be a dictating machine, a limited access control, an elevator control, or other well known machines contained in the business establishment. In a home embodiment, machine 124 may be a washing machine, a dryer, an oven, a refrigerator, a dishwasher, a television, an alarm such as a fire alarm or burglar alarm, or other well known machines common in homes. The system of the present invention may be used to control a single machine or a combination of machines to perform their respective operation. In a preferred embodiment, system 110 has been described for controlling a plurality of operations associated with a single machine. In other embodiments, system 110 may control a plurality of operations associated with more than one machine which may include different types of machines.

The system has been described for a particular group of extremities or peripherals such as devices 150–158, 114, and 118 for a machine control system embodiment. Other extremities or peripherals may be used with the system 110 to adapt this system to the particular requirements of the application. For example, CRT 158 may be a well known television set controlled to provide alpha-numeric messages or graphic displays under control of system 110. Further, the peripherals or extremities discussed in detail for system 110 above may be adapted to the requirements of the particular application. For example, operator panel 117 has been described in an embodiment for a machine control system and the versatility of this panel configuration has been described for general applications where the switches and displays are under control of a data processor operating under program control. Therefore, the operation of each element on panel 117 may be adapted to a particular application primarily by reprogramming the data processor. Further, the legends associated with each switch and display may be changed and the layout of the panel may be changed to meet the requirements of a particular application using techniques well known in the art. For example, legends may be provided with silk screen or photographic processes, switches may be relocated by changing the well known printed circuit board or wire bundle interconnections on the panel back plane in conjunction with providing mounting holes in different portions of the panel, and displays may be added or removed and may be located in different areas of the panel as required by the particular application, implemented by using the teachings of the present invention. Further, the panel 117 is exemplary of a generalized input and output arrangement, where the switches may be operator actuable with a hand such as for the embodiment shown in FIG. 2A, by a foot such as with an automobile brake pedal, or with other actuation arrangements. Further, the arrangement discussed for lamp displays 233 and numeric displays 238 can similarly be used to control other devices such as machine actuators, automobile headlights, and other well known devices.

The mode control logic discussed with reference to flow diagrams shown in FIGS. 3A-3E may control different modes of operation. For example; keyboard subroutine 326 may be used to permit an operator to manually enter commands for many different types of machines or other systems; block subroutine 328 may be used to permit an operator to control a machine or other system in a semi-automatic manner; continuous subroutine 330 may permit an operator to control a machine or other system in an automatic manner; and index subroutine 332 may be used to permit an operator to control a machine or other device to enter a predetermined condition, which may be an initial condition; search subroutine 334 may be used to permit an operator to control a machine or other system by searching for information and programs; and error subroutine 336 may be used as a generalized operator feedback indication on system performance, status, and other conditions. The flow diagram shown in FIG. 3B is exemplary of a subroutine for permitting an operator to manually control or change the operation of a machine or other device. Similarly, FIGS. 3C-3E are exemplary of subroutines that may be used to control many different types of machines or systems. Further, the subroutines shown in FIGS. 3F and 3G illustrate computational operations for simplifying operation of machines by resolving coordinates, converting between coordinate systems, eliminating misalignments and other such undesirable characteristics and exemplifying other computational capabilities. It will become obvious to those skilled in the art from the teachings of the present invention that the flow diagrams set forth in FIGS. 3A-3G; having been described for a numerical control embodiment to exemplify the features of the present invention; are adaptable to many different types of control operations.

In a control system embodiment having existing wiring, such wiring may be shared between the original signals carried by the wiring and by the control signals; thereby further enhancing system economy. In one example, AC power plugs and interconnections in a home embodiment are available in virtually every room and may be used for communicating control signals. Further, electrical machines are typically plugged into the power system. Therefore, the AC power distribution network may be shared with control signals to provide a communication system for machine control. For example, signals 126 such as command signals 126A can be communicated between the data processor 112 and the machine 124 by modulating a carrier and impressing this carrier on the AC power distribution line. Machine 124 may include a well known coupler and demodulator to receive the digital signals transmitted on the power network.

Communication through the power distribution system is well known in the intercom art for communicating voice information. Therefore, communication of digital information can be provided in the same manner. Digital information is easier to transmit than voice information, where digital information involves only two states and the voice information involves a continuous amplitude spectrum, as is common with analog signals. Therefore, well known prior art power line modulation arrangements may be used to provide the communication capability described herein.

Therefore, transmission device 127 may be a well known arrangement including devices for modulating a high frequency carrier (such as 10KHz to 100KHz) with digital signals and for coupling the modulated signals onto the power line such as with a coupling transformer at the transmission source and including devices for coupling the signals off of the power line at the destination such as with a coupling transformer and for demodulating signals at the destination to obtain the transmitted digital information. An embodiment is discussed herein for transmitting information on a single transmission line for a teletypewriter arrangement and for a machine communication arrangement, where the transmission and receiving of self-synchronizing signals are discussed in detail therewith for a preferred embodiment and is known in the art for prior art embodiments. Therefore, self-synchronizing data may be transmitted between system 100 and machine 124 using a single pair of power transmission lines without the need for clock signals. As an alternate embodiment, data and clock signals may each modulate different subcarrier frequencies, where both the data subcarrier and the clock subcarrier may be impressed upon the power line, received at the destination and demodulated to provide separate data and clock signals. A data transmission arrangement using a gated clock signal is discussed herein for the data pipe shift register embodiment and for the gated clock arrangement of the present invention.

The interface arrangement set forth in FIGS. 5A-5D, 9A, and 9B have been described for a machine tool embodiment to exemplify the present invention. It is herein intended that the machine tool embodiment be exemplary of the broad scope of the present invention for controlling physical systems and, in particular, various types of machines. For example, the tape reader control signals in the C-Register 560 can be used to control other machines such as a washing machine. The C15Q signal may be used to start and stop the wash cycle, the C14Q signal may be used to start and stop the spin cycle, and signals C14Q-C16Q may be used to control various other machine devices such as a pump, a hot water intake valve, a cold water intake valve, and various other devices exemplified by the machine. Further, as discussed for a machine tool embodiment, C-Register 560 may be physically mounted in the machine 124 and may be loaded from transmitted information which may be transmitted over the power lines as discussed above. Logic gates 552 are provided for gating other clock signals to other shift registers for shifting the AOQ signal into such other registers, as illustrated in FIG. 5A for the C-Register 560. Similarly, input information is obtained by shifting data from such other registers with the gated clock signals obtained from logic gates 552 through logic selection gates 553 into an input register such as the A-Register in the data processor. Still further, discrete outputs to machine 124 and as DO signals from logic gates 551 and discrete input signals such as DI signals into logic gates 550 provide control and machine communication. Yet further, parallel input logic 562, 564 and 566 and parallel output register 568 may be used to control other types of machines. Although the machine input signals 126 to logic gates 564 have been described for a machine tool embodiment, it is herein intended that these signals be usable for other types of machines such as the washing machine described herein. Still further, select decode 680 has been described for a turret select but may also be used for a mode select such as for a washing machine to control the solenoids and actuators for controlling devices generating operations such as wash modes, spin modes, drying modes, and other such operations.

Figure 9A:
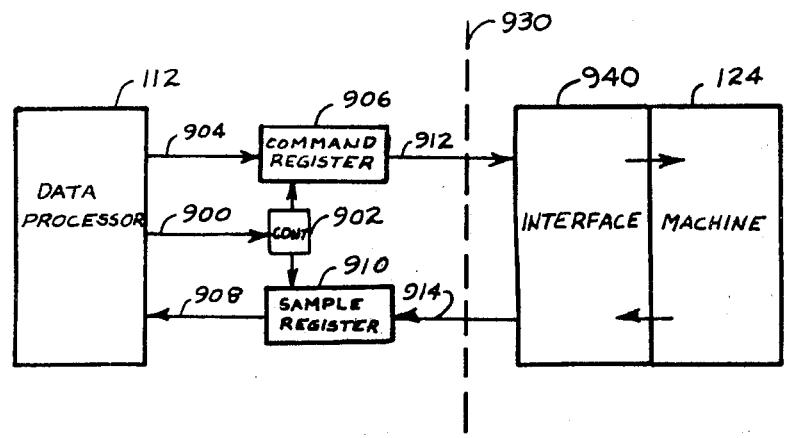
FIG. 9 is a schematic and block diagram representation of an arrangement for communication between a data processor and a machine comprising FIGS. 9A and 9B showing different embodiments of the communication arrangement.
Figure 9B:
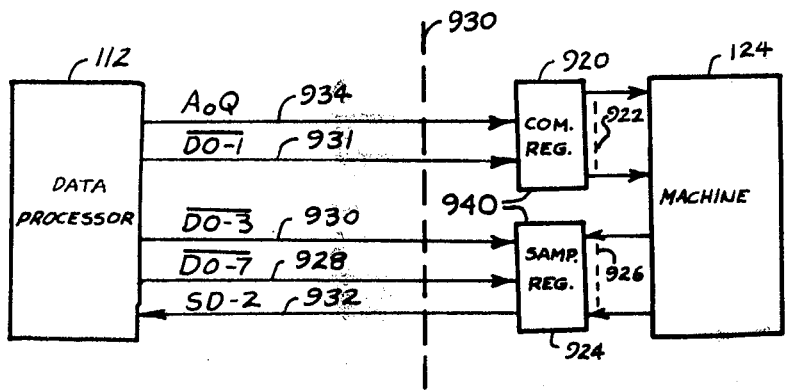

The interface arrangement shown in FIGS. 9A and 9B may be used with a machine such as a washing machine wherein interface 940 may include the power line transmission arrangement discussed above. Command registers 906 and 920 and sample registers 910 and 924 may be configured in various arrangements to implement an interface with other types of machines such as a washing machine. Yet further, the generation of a sequential stream of control signals has been described above with reference to FIGS. 9A and 9B exemplary of a self-synchronizing data stream such as might be usable on a single transmission line arrangement like an AC power line.

The flow diagrams of system operations set forth in FIGS. 3A–3G and 8A–8C are applicable to a general machine arrangement such as a washing machine arrangement. Although the flow diagram set forth in FIG. 3B has been described with reference to a spindle of a lathe, it is applicable for control of another machine operation such as for control of the rotating element in a washing machine, for control of the shaft of an automobile, and, consistent with the broad scope of the present invention, for control of operation of a generalized machine element with various sequencing and control operations.

The elements and cooperation between elements described for the embodiments of the present invention are discussed herein for a preferred ambodiment to exemplify the inventive features, where these inventive features are intended to be generally applicable based upon the broad scope of the present invention. Further, many of the features have been described independently for simplicity. It is herein intended that the various features discussed shall be usable in combination to provide a system with various combinations of these features. For example, a control panel has been described for one embodiment, a machine interface has been described for a second embodiment, and transmission line communication with a washing machine has been described for a third embodiment. It is herein intended that the control panel, interface communication, transmission line arrangement, and washing machine be combinable in an embodiment using combinations of the features described herein. Similarly, any features described with respect to one preferred embodiment are intended to be equally usable in various combinations therebetween and in other embodiments, wherein the structure and operation for other combinations and with other embodiments will become obvious to those skilled in the art from the teachings of the present invention.

Machine And Control Unit Communication

Transmission of data through cabling and across an interface may cause problems for high speed digital data. Therefore, an arrangement is discussed that provides low frequency data and clock signals between a computer 112 and an interface register. These low frequency data channels can be provided with various arrangements such as (1) auxiliary registers and (2) discrete input and discrete output computer instructions.

In prior art computers, data transfers are performed in parallel to enhance computer speed. Also, in prior art machine control systems, the machine condition signals 126B are communicated between the machine 124 and the control 100 in parallel data form. Parallel data transfers require an excessive number of lines and associated electronics such as line receivers and line drivers. Therefore, a preferred embodiment of this invention uses serial data transfers between electronic subsystems and also provides a serial data transfer arrangement between the control subsystem and the machine. Serial data transfers are intended to mean sequential data transfers of a plurality of bytes, where the preferred embodiment discussed herein provides serial data transfers of sixteen single-bit-bytes per word.

The auxiliary register embodiment, illustrated in FIG. 9A, provides buffer registers 906 and 910 that are loaded at a first data rate and unloaded at a second data rate. For example, computer output command words 904 are loaded into the auxiliary register 906 at the high computer clock rates and are unloaded at low interface clock rates while computer input sample words 908 are loaded into the auxiliary register 910 at the low interface clock rates and are unloaded at the high computer clock rates. The data processor 112 provides command signals 900 to an auxiliary register control 902 to control the transfer of high data rate output command words from the computer 112 along line 904 to the command register 906 and to control the transfer of high data rate input sample words from the sample register 910 along lines 908 to the computer 112. Also, the auxiliary register control 902 controls the transfer of low data rate output command words from the command register 906 to the machine interface 302 along lines 912 for machine control and also the transfer of low data rate input sample words from the interface 302 to the sample register 910 along lines 914 to define machine conditions.

This auxiliary register interface embodiment can be the same as described for the servo commands in the parent applications, where the computer loads servo commands into the auxiliary $\Delta$ register and/or unloads servo data from the auxiliary $\Delta$ register, then generates a discrete output instruction such as a DC-13 instruction to initiate the off-line operations at the servo clock rates.

For parallel computer input/output structures, the operation of parallel-to-serial and serial-to-parallel conversions can also be provided with the auxiliary registers 906 and 910 in addition to the data rate conversion for the communication function.

Discrete output and discrete input instructions can be used to communicate with an interface register in much the same manner as discussed for the 110 baud auxiliary channel for communication with a typewriter described in the parent applications.

For this interface embodiment, the computer 112 will clock the selected interface register with a discrete output, which can be used in place of the previously discussed OW-8 clock signal, to load each command bit into that interface register, which may be the $A_oQ$ bit as described for the typewriter embodiment, and/or to make a new bit available at the output of that interface register which can be sampled with a discrete input instruction.

This embodiment is illustrated in FIG. 9B. The interface command register 920 is used to provide command conditions 922 to the machine 124 and the interface sample register 924 is used to sample machine conditions 926 and provide these conditions to the computer 112.

The computer 112 initiates an input sample operation with a discrete output instruction which generates a DO-7 command pulse 928 to command the loading of the machine conditions 926 into the interface sample register 924; then the computer 112 clocks the sample register 924 with discrete output instructions which generate DO-3 command pulses 930. The computer samples the output 932 of the sample register 924 with a skip-on-discrete-2 (DI-2) instruction after each discrete output clock instruction and packs the new machine sample condition 932 into a machine sample word under program control. The computer 112 samples all of the machine conditions in register 924 in sequence in this manner.

The computer 112 initiates an output command operation by packing the discrete command conditions into a discrete command word, then loading this packed discrete command word into the interface command register 920. This loading operation is performed by placing the command word in the A-Register so that the least significant bit of the A-Register ($A_oQ$) 934 is presented as the input to the command register 920, then executing a discrete output −1 instruction which generates a DO-1 command pulse 931 to clock the register 920 to shift-in the $A_oQ$ 934 command bit. The computer then executes a shift right instruction to place the next command bit in the $A_oQ$ position and then sequentially executes combinations of discrete output −1 instructions and shift right instructions until the command word in the A-Register has been clocked into the command register 920.

In another embodiment, the discrete output −3 (DC-3) pulse 930 can simultaneously clock both, the command register 920 and the sample register 924 to simultaneously input a sample bit and output a command bit. The computer 112 interleaves the input sample operations and the output command operations as will be obvious to those skilled in the art.

It can be seen with reference to FIGS. 9A and 9B that a low data rate interface 930 and serial multiplexed communication exists for each embodiment discussed, thereby providing the advantages of few interconnections and low data rate signals between the computer subsystem 112 and the machine subsystem 124.

The "data pipe" arrangement will now be discussed. A data pipe concept is illustrated in FIGS. 5A and 6 with the C-Register 585 and C-Register extension 670. The computer A-Register is a 16 bit register; described in the parent applications; yet the interface registers, such as the C-Register that communicate with the A-Register may be of greater length. The combination of the A-Register and the C-Register comprises a data pipe, where the C-Register may be sequentially loaded from the A-Register with parameters output with sequential EX instructions to load these sequential parameters into the interface register and/or to sequentially unload the interface register into the A-Register. The length of the interface register is virtually unlimited, where a sequence of many 16 bit words can be clocked into or clocked out of the interface register. This data pipe concept is further illustrated with the servo registers where the three servos channels, the common board and the A-Register are serially connected as a "data pipe", as illustrated in the parent applications. Data passes from the A-Register and is input to a register of the X axis servo through I/O channel −2. Data then passes from the X axis servo to I/O channel −2 of the Y axis servo. Similarly, data passes out of the Y axis servo into the Z axis servo and out of the Z axis servo to the common board and back to the A-Register. Thus, communication is provided between the data processor, the three servos and the common board.

The interface registers are shown as shift registers, where the output states go through loading transitions as the register is asynchronously preloaded or synchronously shifted such as with the C-Register 560. Typically, the transient nature of these transitions are fast enough so that they will not effect electro-mechanical devices such as relays. If high response equipment senses these register outputs, such as solid state electronic circuits, it may be necessary to eliminate this transient condition. This can be accomplished with logic shown in conjunction with the Z-Register 568, where the bit time signals B0 through B11 gate the clocks to each flip-flop $Z_{11}$ through $Z_o$ so that the flip-flops will be clocked when the corresponding data bit $A_oQ$ is shifted out of the A-Register of the computer 112. Therefore, the Z-Register output lines YL1–YL5, XL1–XL5, and MFE will change only between the last commanded state and the new commanded state without going through transient preload or shift states.

Servo Description

A description of the interaction of the data processor with a preferred embodiment of the servo arrangement for the system of this invention will now be provided. A detailed description of the servo arrangement is provided in the parent applications, which have been incorporated by reference.

An apparatus and method is presented wherein a digital device precisely controls a path of an analog device. By providing integral path defining commands with an independent variable resolution finer than the resolution of the analog device with respect to that variable, the digital device is able to drive the analog device along a smooth but precisely controlled path substantially without discontinuities associated with the digital commands.

In a servo control system in accordance with the invention, a general purpose stored program computer generates integral commands to control a multi-axis servo system. The computer can operate open loop to command the execution of predefined commands as in a numerical control system or can operate closed loop to provode a response to parameters of controlled analog devices. The analog device itself may operate open loop or may have a closed servo loop using analog or time domain feedback signals.

The use of integral commands and time domain signals intrinsic to both the digital and analog domains permits the elimination of expensive analog to digital converters, digital to analog converters and digital differential analyzers. When a time domain integral command signal is compared with a time domain feedback signal, a very precise time domain error signal is attained from which an analog control signal may be generated simply and inexpensively.

The use of integral commands provides substantial advantages when applied to a servo control system. Because each integral command can substanially resolve the relative slopes of the controlled axes, the commands can be presented in real time at a rate commensurate with the response rate of the controlled mechanism and substantially independent of the slopes being resolved. In contrast, presently known systems require a data rate commensurate with the resolution of the system, as for instance one part in 10,000, which is substantially greater than the rate required for integral commands.

A stored program digital computer in accordance with the invention provides integral commands between set points to define a precisely controlled path. These integral commands may be provided directly as a time domain signal in the form of a phase referenced square wave. Alternatively, the computer may provide digital integral commands from which the time referenced square wave command signal is readily generated. The phase referenced square wave command signal is compared with similar feedback signals to produce a very precise time domain error signal which may take the form of an asymmetrical square wave. By providing the integral commands at a rate which exceeds the time resolution or response rate of the servos, a smoothing or filtering effect is attained wherein the servos follow the discontinuous integral commands with a smooth path closely following the intermediate commanded points.

A system is presented wherein a digital device controls an analog device to cause system variables to define precisely controlled paths substantially free of the discontinuities associated with the digital commands. This freedom from discontinuities will exist when the resolution of the independent variables is finer than the resolution of the system with respect to those variables. The dependent variables are system conditions which are being controlled and the independent variables are controlling system conditions. A dependent variable might be a system condition such as pressure or temperature or it might be the status of a mechanism with respect to an axis, such as position, velocity, or acceleration. An independent variable might be time, a system condition or the status of a mechanism.

In accordance with the invention, a data processor operates under program control to generate integral commands precisely controlling the position of a multi-axis servo with respect to time. Each integral command completely defines the relationship of each axis with respect to the other axes and with respect to time. By generating path defining commands with a time resolution equal to or finer than the time resolution of the analog device, the discontinuous integral commands are smoothed by the integrating or filtering effect of the physical inertia and electronics of the analog device. As long as the rate at which an analog system can respond to a command is substantially equaled or exceeded by the rate at which integral commands are generated, and if the magnitude of the commands does not exceed the response capability of the system, the actual path will closely follow the integral commands.

Communications between digital and analog devices is provided with time domain signals intrinsic to both the digital and analog domains. These time domain signals contain a very precise information content and can be manipulated with relatively simple equipment without loss of precision. They may also be used to easily generate signals in the analog or digital domains. As disclosed herein, integral time domain command signals may be generated directly by a computer or by a command structure in response to digital integral number commands generated by the computer. Time domain position feedback signals are generated directly by a properly excited analog resolver.

Although many different arrangements will become obvious to those skilled in the art, in the preferred embodiment of this invention a phase referenced square wave signal is generated directly by a digital computer under program control. The phase referenced square wave signal is a time domain signal and provides integral path defining commands to a closed loop square wave servo.

As an alternative arrangement shown in FIG. 1B, the data processor 112 receives a square wave position signal, a position error signal, and a velocity signal 123 to form a closed digital loop. The computer is responsive to discrete inputs with the Skip-On-Discrete instructions to precisely measure the duration or phase of these feedback signals and process them as digital integral numbers. Because the data processor 112 is now in a closed loop it can utilize the feedback signals to modify the integral commands and control the servos 120–122 as an adaptive controller. Use of adaptive control permits precise control over the instantaneous position error of each axis such as by varying the gain of a power amplifier.

Independent of the advantages attained by placing the data processor 112 in a closed loop, direct communication between the data processor and the servo in the time domain permits most components and operations of the command structure to be eliminated. By using the data processor 112 to perform additional real time operations, the command structure may be reduced to a reference square wave generator and a flip-flop, which serves a function similar to the flip-flop $N_{30}$ shown in FIG. 6 of parent application, APPARATUS AND METHOD FOR PRODUCING HIGH REGISTRATION PHOTO-MASKS. All square waves including the reference and command square waves may be derived in this manner.

The data processor 112 is responsive to the reference square wave as well as the feedback signals as discrete inputs and clocks a toggling flip-flop such as flip-flop $I_2$ with discrete outputs. These discrete outputs are synchronized with a reference squarewave and have a selected phase relationship indicating a commanded position.

Additionally, the data processor 112 may be programmed to provide time domain error signals by toggling a flip-flop $I_3$ using a technique similar to that used to generate the position command signal in conjunction with flip-flop $I_2$. The pulse width square wave signal is communicated to a digital to amplitude converter which generates the servo control signal. This time domain error signal may be provided either as an override of the normal time domain error signal under appropriate circumstances or in lieu thereof with the comparator circuits being completely eliminated.

Additional circuits may be used to reduce the task of the computer in generating command signals and sensing feedback signals. For instance, a counter may be used to measure or control the time beteen square wave transitions for phase or pulse width signals.

General Considerations

From the above description it will be apparent that there is thus provided a device of the character described possessing the particular features of advantage before enumerated as desireable, but which obviously is susceptible to modification in it's form, method, mechanization, operation, detailed construction and arrangement of parts without departing from the principles involved or sacrificing any of its advantages.

While in order to comply with the statute, the invention has been described in language more or less specific as to structural features, it is to be understood that the invention is not limited to the specific features shown, but that the means, method, and construction herein disclosed comprise the preferred form of several modes of putting the invention into effect, and the invention is, therefore, claimed in any of its forms or modifications within the legitimate and valid scope of the appended claims.

What I claim is:

1. A contact exposure system for providing duplicate exposures of high registration images, said contact exposure system comprising:
   master image means for providing high registration images to be duplicated, said master image means including a plurality of images having high registration therebetween;
   an illumination sensitive medium for providing illumination exposures in response to an illuminated master image means;
   contact exposure means for providing contact between said master image means and said illumination sensitive medium; and
   illumination means for illuminating said master image means to provide an exposure of said master image means on said illumination sensitive medium when in said contact therebetween.

2. A contact exposure system comprising:
   control means for generating control signals, said control means including means for generating high registration control signals and means for generating duplication control signals; and
   a machine for generating high registration exposures in response to the high registration control signals and for generating a duplication exposure in response to the duplication control signals.

3. The machine as set forth in claim 2 above comprising:
   (a) master means for containing a master image;
   (b) medium means for containing an illumination sensitive medium;
   (c) motion means for generating translation motion between said master means and said illumination sensitive medium;
   (d) means for generating contact between said master image and said illumination sensitive medium; and
   (e) means for generating a contact exposure of said master image on said illumination sensitive medium.

4. The machine as set forth in claim 2 above comprising:
   means for providing translation motion to each of a plurality of positions in response to the high registration control signals;
   means for generating a contact exposure at each of the plurality of positions in response to the high registration control signals to provide a plurality of high registration exposures; and
   means for generating the contact exposure at a single position to provide a single duplication exposure.

5. A mask duplicating machine comprising:
   master image means for generating high registration masks, said master image means including a plurality of images having high registration therebetween;
   an illumination sensitive medium for providing exposures in response to exposure illumination;
   control means for generating control signals; and
   a contact exposure machine for generating contact exposures of said master image means on said illumination sensitive medium in response to the control signals, said contact exposure machine including
   (a) means for providing contact between said master image means and said illumination sensitive medium and
   (b) means for providing exposure illumination to expose said illumination sensitive medium with said master image means.

6. An illumination control system for generating high registration exposures, said illumination control system comprising:
   an illumination sensitive medium for providing illumination exposures and
   high registration means for contact exposing said illumination sensitive medium with a plurality of image clusters, each of the image clusters having high registration with at least one other image cluster, said high registration means including master image means for providing a plurality of images wherein each image of said master image means is related to an exposed image cluster.

7. The system as set forth in claim 6 above further comprising duplicating means for exposing said illumination sensitive medium with a master image to provide a duplicate of said master image.

8. A machine control system comprising:
   input means for generating an input command signal;
   a read only memory for storing instructions;
   receiving means for receiving the input command signal in response to the stored instructions;
   processing means for processing machine command information in response to the input command signal received with said receiving means under control of the stored instructions; and
   output means for generating at least one machine command signal in response to the processing of machine command information.

9. The system as set forth in claim 8 above, further comprising a machine for exposing an illumination sensitive medium in response to the machine command signal from said output means.

10. The machine as set forth in claim 9 above, including:
    illumination means for generating illumination;
    exposing means for exposing an illumination medium in response to the generated illumination; and
    positioning means for providing relative positioning between said illumination means and said exposing means in response to the machine command signal from said output means.

11. The system as set forth in claim 8 above, further comprising:
    positioning means for providing positioning of a machine in response to the machine command signal from said output means and
    contact exposing means for generating a contact exposure of an illumination sensitive medium under control of the machine command signal from said output means.

12. The memory as set forth in claim 8 above, including an integrated circuit read only memory for storing the instructions and alterable memory means for storing the processed machine command information under control of the stored instructions from said read only memory means.

13. A machine control system comprising:
read only memory means for storing data processing instructions:
alterable memory means for storing processed information in response to the stored data processing instructions from said read only memory means;
data processing means for processing the information stored in said alterable memory means in response to the stored data processing instructions from said read only memory means;
output means for generating at least one output command signal in response to the processing of information with said processing means under control of stored data processing instructions from said read only memory means; and
a positioning machine for providing a machine operation at each of a plurality of different positions, in response to the output command signal said machine means including
 a. positioning means for positioning said machine to each of a plurality of machine positions and
 b. operation means for performing the machine operation at each of the plurality of different machine positions.

14. The system as set forth in claim 13 above, wherein said system is a contact exposure system for providing contact exposure of an illumination sensitive medium, said positioning machine further including
illuminating means for generating illumination and
exposing means for exposing an illumination sensitive medium in response to the illumination from said illumination means, wherein said exposing means includes contact means for providing a contact exposure of an illumination sensitive medium in response to the generated illumination from said illumination means.

15. An integrated circuit mask generating system for simultaneously generating a plurality of different integrated circuit masks, wherein each of the plurality of masks is related to a different integrated circuit process operation for manufacture of integrated circuits, said system comprising:
illumination means for providing exposure illumination and
contact exposure means for exposing an illumination sensitive medium in response to contact exposures to photographically generate the masks.

16. A machine control system comprising: command means for generating machine command signals, said command means including
 a. memory means for storing a program,
 b. processing means for generating machine command signals under control of the program stored in said memory means, and
 c. output means for outputting the machine command signals generated with said processing means under control of the program stored in said memory means; and machine means for modifying a machine responsive medium in response to the machine command signals ouput from said output means, said machine means including
 d. modifying means for modifying a machine modifiable medium mounted on a mounting means,
 e. mounting means for mounting a medium to be modified,
 f. means for providing relative motion between said modifying means and said mounting means, and
 g. means for providing contact between said modifying means and a modifiable medium mounted with said mounting means.

17. The memory means as set forth in claim 16 above, including read only memory means for storing the program and alternate memory means for storing information processed with said processing means, wherein said alterable memory means provides for the storing of the processed information under control of the program stored in said read only memory.

18. The system as set forth in claim 16 above, wherein said system is a high registration system for generating photographic masks.

19. A machine control system comprising:
command means for generating machine command signals, said command means including
 a. memory means for storing a program,
 b. processing means for generating machine command signals under control of the program stored in said memory means, and
 c. output means for outputting the machine command signals generated with said processing means under control of the program stored in said memory means; and
machine means for modifying a machine responsive medium in response to the machine command signals output from said output means, said machine means including
 d. modifying means for modifying a machine modifiable medium, wherein said modifying means includes a cutting tool for cutting a machine modifiable medium,
 e. mounting means for mounting a medium to be modified, wherein said mounting means includes means for mounting a metal workpiece to be modified with said cutting tool,
 f. means for providing relative motion between said modifying means and said mounting means, and
 g. means for providing contact between said modifying means and a modifiable medium mounted with said mounting means.

20. The machine means as set forth in clam 16 above, further comprising means for generating illumination and means for providing a contact exposure of an illumination sensitive medium.

21. The system as set forth in claim 16 above, wherein said system is a high registration mask producing system and wherein said contact providing means includes contact exposure means for exposing an illumination sensitive medium.

22. A control system comprising:
input means for generating input command signals;
a stored program computer for generating machine command signals in response to the input command signals, said stored program computer including read only memory means for storing a computer program, alterable memory means for storing operands, in response to the input command signals processing means for processing the operands stored in said alterable memory means in response to the computer program stored in said read only memory means, and computer output means for outputting the machine command signals in response to the processing of the operands with said processing means; and
machine means for generating a machine operation in response to the machine command signals output from said computer output means.

23. The system as set forth in claim 22 above, wherein said machine means includes illumination means for generating illumination and contact exposure means for providing contact exposure of an illumination sensitive medium in response to the illumination.

24. The system as set forth in claim 22 above, further comprising means for providing relative motion between said illumination means and said contact exposure means in response to the machine command signals output from said computer output means.

25. A control system comprising:
input means for generating input command signals;
a stored program computer for generating machine command signals in response to the input command signals, said stored program computer including a read only memory for storing a computer program, an alterable memory for storing operands, processing means for processing the operands stored in said alterable memory in response to the command input signals under control of the computer program stored in said read only memory, and computer output means for outputting the machine command signals in response to the processing of the operands with said processing means; and
a machine for generating a machine operation in response to the machine command signals output from said computer output means, wherein said machine is a machine tool, wherein said machine tool includes cutting means for cutting a metal part and mounting means for mounting a metal part to be cut.

26. In a system for generating photographic masks to be used in a photochemical process, a method comprising the steps of:
first, simultaneously exposing an illumination sensitive medium with each of a plurality of images having a fixed relationship between the position of each image of the plurality of images;
second, changing relative position between the plurality of images and the illumination sensitive medium and preserving the positional relationship between each of the plurality of images; and
third, repeating said first and second steps for a plurality of different times to provide the exposure at a plurality of different relative positions between the images and the illumination sensitive medium.

27. The method as set forth in claim 26 above, wherein the simultaneous exposing step includes the step of providing a contact exposure.

28. The system as set forth in claim 19 above, wherein said memory means includes an integrated circuit read only memory for storing the program in read only form, said system further comprising an integrated circuit alterable memory for storing information processed with said processing means under control of the program stored in said integrated circuit read only memory.

29. The system as set forth in claim 19 above, further comprising display means for displaying machine related information to an operator in reponse to display signals, wherein said command means further includes means for generating the display signal in response to the program stored in said memory means.

30. The system as set forth in claim 25 above, further comprising:
operator input means for generating an operator input signal in response to operator action;
display means for providing an operator display in response to a display signal, wherein said computer further includes
a. means for generating the display signal in response to the operator input signal under control of the computer program stored in said read only memory and
b. means for generating the machine command signals output with said computer output means in response to the operator input signal under control of the computer program stored in said read only memory.

31. The system as set forth in claim 25 above, wherein said computer output means includes pulse modulation means for outputting the machine command signals as pulse modulated command signals in response to the computer program stored in said read only memory.

32. The system as set forth in claim 25 above, further comprising feedback means for generating a feedback signal in response to condition of said machine, wherein said computer further includes means for processing the operands in response to the feedback signal under control of the computer program stored in said read only memory.

33. The system as set forth in claim 25 above, wherein said system is a path control system, said system further comprising contouring means for controlling said machine along a path in response to the machine command signals.

34. The system as set forth in claim 25 above, wherein said machine further includes relay control means for controlling a relay in response to the machine command signals.

35. The system as set forth in claim 25 above, wherein said machine further includes a machine turret for positioning a machine element under control of the machine command signals.

36. The system as set forth in claim 25 above, wherein said machine further includes a magnetic control element for providing a mechanical control operation under control of the machine command signals.

* * * * *